United States Patent
Panfil et al.

[11] Patent Number: 6,147,578
[45] Date of Patent: Nov. 14, 2000

[54] METHOD FOR DESIGNING OPEN MAGNETS AND OPEN MAGNETIC APPARATUS FOR USE IN MRI/MRT PROBES

[75] Inventors: Shimon Panfil, Haifa; Ehud Katznelson, Ramat Yishai, both of Israel

[73] Assignee: Odin Technologies Ltd., Yokneam Elite, Israel

[21] Appl. No.: 09/295,814

[22] Filed: Apr. 20, 1999

Related U.S. Application Data

[60] Provisional application No. 60/074,077, Feb. 9, 1998.

[51] Int. Cl.[7] ................ G01R 33/20; H01F 7/02
[52] U.S. Cl. .............. 335/296; 335/298; 335/306; 324/319; 324/320
[58] Field of Search ............. 335/216, 296–306; 324/318–320

[56] References Cited

U.S. PATENT DOCUMENTS

| | | |
|---|---|---|
| H1615 | 12/1996 | Leupold ................. 335/210 |
| 4,341,220 | 7/1982 | Perry . |
| 4,608,977 | 9/1986 | Brown . |
| 4,829,252 | 5/1989 | Kaufman . |
| 4,862,086 | 8/1989 | Maeda . |
| 4,875,485 | 10/1989 | Matsutani . |
| 5,134,374 | 7/1992 | Breneman et al. . |
| 5,304,933 | 4/1994 | Vavrek et al. . |
| 5,332,971 | 7/1994 | Aubert ................. 324/319 |
| 5,357,958 | 10/1994 | Kaufman . |
| 5,365,927 | 11/1994 | Roemer et al. . |
| 5,390,673 | 2/1995 | Kikinis ................. 128/653.2 |
| 5,410,287 | 4/1995 | Laskaris et al. . |
| 5,428,292 | 6/1995 | Dorri et al. . |
| 5,475,355 | 12/1995 | Abele et al. ............. 335/301 |
| 5,490,509 | 2/1996 | Carlson et al. . |
| 5,495,222 | 2/1996 | Abele et al. ............. 335/306 |
| 5,570,073 | 10/1996 | Muller . |
| 5,581,220 | 12/1996 | Rodenbush et al. . |
| 5,623,241 | 4/1997 | Minkoff . |
| 5,677,630 | 10/1997 | Laskaris et al. . |
| 5,696,449 | 12/1997 | Boskamp ................. 324/318 |
| 5,801,609 | 9/1998 | Laskaris et al. . |
| 5,812,043 | 9/1998 | Gore et al. . |
| 5,874,882 | 2/1999 | Laskaris et al. . |
| 5,900,793 | 5/1999 | Katznelson et al. ....... 335/296 |

*Primary Examiner*—Lincoln Donovan
*Assistant Examiner*—Raymond Barrera
*Attorney, Agent, or Firm*—Eitan, Pearl, Latzer & Cohen-Zedek

[57] ABSTRACT

An open yoked magnetic apparatus for producing a substantially homogenous magnetic field. The apparatus includes an open ferromagnetic yoke, and two complementary permanent magnetic assemblies attached to opposing sides of the yoke. Each magnet assembly includes a ferromagnetic pole-piece and a first magnetic structure disposed between the pole-piece and the yoke, at least one annular ferromagnetic collimator concentric with said pole-piece and radially separated therefrom by a gap, and at least a second magnetic structure radially separated from the first magnetic structure by a gap and disposed between the at least one collimator and the yoke. The magnetic structures may be solid structures made from magnetic material or may be segmented or may include a plurality of magnetic blocks. A method for designing such an open yoked magnetic apparatus with improved properties is also disclosed.

51 Claims, 21 Drawing Sheets

METHOD FOR DESIGNING OPEN MAGNETS AND OPEN MAGNETIC APPARATUS FOR USE IN MRI/MRT PROBES

REFERENCE TO RELATED APPLICATIONS

This application claims priority of and the benefit of U.S. provisional application Ser. No. 60/074,077, filed Feb. 9, 1998.

FIELD OF THE INVENTION

The present invention is generally related to the fields of magnetic resonance imaging (MRI) and magnetic resonance therapy (MRT) and is particularly related to yoked open magnets for use in MRI/MRT probes and to an improved method for optimizing the design of compact yoked magnets.

BACKGROUND OF THE INVENTION

Compact magnetic probes for use in magnetic resonance imaging (MRI) and magnetic resonance therapy (MRT) systems are known in the art.

U.S. Pat. No. 5,900,793 to Katznelson et al., filed Jul. 23, 1997, entitled "PERMANENT MAGNET ASSEMBLIES FOR USE IN MEDICAL APPLICATIONS" assigned to the common assignee of the present application, incorporated herein by reference, discloses compact yokeless magnet assemblies comprising coaxial annular permanent magnets.

U.S. patent application Ser. No. 09/161,336 to Zuk et al., filed Sep. 25, 1998, entitled "MAGNETIC APPARATUS FOR MRI" and assigned to the common assignee of the present application, incorporated herein by reference, discloses, inter alia, yokeless magnet assemblies comprising coaxial annular permanent magnets and having external gradient coils.

While such compact yokeless permanent magnet assemblies may have many advantages, it may be desirable for some MRI/MRT applications to increase the strength of the main magnetic field of the magnet assemblies. This may require the design of yoked annular permanent magnet assemblies.

Methods for designing yoked and non-yoked permanent magnets are known in the art.

Current yoked magnet design methods, which are also applied to the design of MRI/MRT yoked magnets, are typically based on the initial design of a yoked field generator which typically includes magnetic material and a pole-piece made of a ferromagnetic material such as soft iron or the like. This field generator is pre-designed in a first design stage to achieve a specified magnetic field strength within a specified imaging volume, also known in the art as the field of view (FOV) of the MRI/MRT device. Theoretically, if the surface of the designed field generator was of an infinite size, the magnetic field within the FOV would be highly homogeneous and no further design stages would be required. However, due to practical considerations such as, inter alia, magnet size constraints dictated by the specific application and the cost of constructing large magnets and mechanically supporting them, the size of the field generator must be finite. This practical size limitation of the field generator introduces inhomogeneity in the strength of the magnetic field within the FOV due to edge effects. Therefore, a second design stage is necessary for correcting the inhomogeneities introduced by the finite size of the field generator. This separate second design stage includes the design of additional magnetic and/or ferromagnetic structures for canceling high-order harmonics of the magnetic field generated by the field generator.

U.S. Pat. No. 5,495,222 to Abele et al. discloses a hybrid magnetic structure for generating a highly uniform magnetic field including a yoked primary magnetic system, a secondary magnetic structure comprising a number of prismatic permanent magnetic structures and pole-pieces and a field distortion compensating means such as primary and/or secondary filter structures for compensating magnetic field distortions in the magnetic field.

U.S. Pat. No. 5,475,355 to Abele et al. discloses a method and apparatus for compensation of field distortion in a magnetic structure using spatial filter. The method is based on designing an open magnetic structure having two spaced apart ferromagnetic elements defining a cavity including an imaging region, means for producing a magnetic field having undesirable harmonics in the imaging region and means for reducing undesirable harmonics in the region. The design method taught by Abele et al. involves designing the open magnetic structure and reducing the distortion within the imaging region by successively eliminating orders of harmonics by inserting a predetermined amount of magnetized material between the ferromagnetic elements and a first and second plurality of additional ferromagnetic elements spaced adjacent thereof.

The method of Abele et al. has the disadvantage that it must use sequential steps for sequentially eliminating orders of harmonics. Therefore, since each of these sequential steps is aimed only at eliminating a specific harmonic, this method does not provide optimization of the contribution of each of the sequential steps to the overall desired magnetic field. As a result, the final design of the magnetic structure while having eliminated specific harmonics may not be optimal with regard to the compactness of dimensions of the designed open magnetic structure.

Thus, a general disadvantage of the prior art design methods is that the optimization performed during the design of the additional "correcting" magnetic structures in the second design stage is directed mainly towards canceling the high order harmonics of the magnetic field of the field generator in order to achieve a specified homogeneity within the FOV. Therefore, the second design stage does not provide an optimization of the contribution of the additional magnetic structures to the main field strength within the FOV. Therefore, use of prior art design methods for designing yoked magnet assemblies for MRI/MRT or for other applications may result in magnets which while achieving magnetic field homogeneity within the specified value, are not necessarily optimally compact. This may have further disadvantages such as the need to use relatively large and costly additional magnetic structures for correcting high order harmonics without providing the ability to fully utilize their magnetic field for increasing the achievable strength of the main magnetic field of the designed magnet or MRI/MRT magnetic assembly.

An additional common problem encountered with permanent magnet assemblies is the presence of magnetic field inhomogeneities which are caused by local defects in the material from which the permanent magnets are manufactured. Such defects may result in "hot spots" which are regions of local increase in the magnetic field strength. These inhomogeneities degrade the MRI image quality. Thus, it is desirable to reduce such inhomogeneities.

SUMMARY OF THE INVENTION

There is therefore provided open magnetic apparatus for providing a volume of substantially homogenous magnetic field having an axis of symmetry passing therethrough. The apparatus includes an open ferromagnetic yoke having a first yoke surface and a second yoke surface opposed the first yoke surface, the second yoke surface is shaped like a mirror image of the first yoke surface with respect to a mid-plane equidistant from the first yoke surface and the second yoke surface, the symmetry axis is perpendicular to the mid-plane, a first magnetic assembly attached to the first yoke surface. The first magnetic assembly includes a first ferromagnetic pole-piece substantially parallel to the mid-plane and having an outer radius, the axis of symmetry passing through the center of the first pole-piece, the first pole-piece is radially symmetric along any axis perpendicular to the axis of symmetry and passing through the center of the first pole-piece, the first pole-piece having a first surface facing the volume and a second surface facing the first yoke surface. The first magnetic assembly further includes a first magnetic structure disposed between the second surface of the first pole-piece and a surface formed by a projection on the first yoke surface of the second surface of the first pole-piece in a direction parallel to the axis of symmetry, the first magnetic structure having a first magnetization vector directed substantially parallel to the axis of symmetry. The first magnetic assembly also includes at least a first substantially annular ferromagnetic collimator concentric with the first pole-piece and having an inner radius larger than the outer radius of the first pole-piece. The at least first collimator is radially separated from the first pole-piece by a first gap, the at least first collimator having a fourth surface facing the volume and a fifth surface facing the first yoke surface. The first magnetic assembly further includes at least a second magnetic structure disposed between the fifth surface of the at least first collimator and a surface formed by a projection on the first yoke surface of the fourth surface of the first collimator in a direction parallel to the axis of symmetry, the second magnetic structure having a second magnetization vector directed substantially parallel to the axis of symmetry. The apparatus also includes a second magnetic assembly opposed to the first magnetic assembly and attached to the second yoke surface. The volume is disposed in the open region defined between the first magnetic assembly and the second magnetic assembly. The second magnetic assembly includes a second ferromagnetic pole-piece substantially parallel to the mid-plane and having an outer radius substantially equal to the outer radius of the first polepiece. The axis of symmetry passes through the center of the second pole-piece. The second pole-piece is radially symmetric along any axis perpendicular to the axis of symmetry and passing through the center of the second pole-piece. The second pole-piece has a fifth surface facing the volume and a sixth surface facing the second yoke surface. The second magnetic assembly further includes a third magnetic structure disposed between the sixth surface of the second pole-piece and a surface formed by a projection on the second yoke surface of the sixth surface of the second pole-piece in a direction parallel to the axis of symmetry. The third magnetic structure has a third magnetization vector substantially equal to the first magnetization vector. The second magnetic assembly also includes at least a second substantially annular ferromagnetic collimator concentric with the second pole-piece and having an inner radius substantially equal to the inner radius of the at least first collimator and larger than the outer radius of the second pole-piece. The at least second collimator is radially separated from the first pole-piece by a second gap. The at least second collimator has a seventh surface facing the volume and an eighth surface facing the second yoke surface. The second magnetic assembly further includes at least a fourth magnetic structure disposed between the eighth surface of the at least second collimator and a surface formed by a projection on the second yoke surface of the eighth surface of the second collimator in a direction parallel to the axis of symmetry. The at least fourth magnetic structure has a fourth magnetization vector substantially equal to the second magnetization vector. The first pole-piece and the second pole-piece are selected from a cylindrical pole piece, an annular pole-piece, a regular polygonal pole-piece and a regular polygonal annular pole-piece. The at least first collimator and the at least second collimator are selected from an annular collimator and a regular polygonal annular collimator.

Furthermore, in accordance with another preferred embodiment of the present invention, the first magnetization vector is directed parallel to the second magnetization vector.

Furthermore, in accordance with another preferred embodiment of the present invention, the first magnetization vector is directed anti-parallel to the second magnetization vector.

Furthermore, in accordance with another preferred embodiment of the present invention, at least one of the yoke, the first pole-piece, the second pole-piece, the at least first collimator and the at least second collimator is made from a material having high magnetic permeability.

Furthermore, in accordance with another preferred embodiment of the present invention, at least one of the first magnetic structure, the second magnetic structure, the at least third magnetic structure and the at least fourth magnetic structure is constructed as a single solid member made of permanently magnetized material.

Furthermore, in accordance with another preferred embodiment of the present invention, at least one of the first magnetic structure, the second magnetic structure, the at least third magnetic structure and the at least fourth magnetic structure is constructed from a plurality of blocks made of permanently magnetized material.

Furthermore, in accordance with another preferred embodiment of the present invention, at least one magnetic block of the plurality of magnetic blocks is a prismatic magnetic block having two parallel surfaces perpendicular to the magnetization vector of the at least one block.

Furthermore, in accordance with another preferred embodiment of the present invention, at least some of the magnetic blocks of the plurality of magnetic blocks have voids therebetween.

Furthermore, in accordance with another preferred embodiment of the present invention, the voids are at least partially filled with a non-magnetic non-ferromagnetic material.

Furthermore, in accordance with another preferred embodiment of the present invention, at least one of the first magnetic structure, the second magnetic structure, the at least third magnetic structure and the at least fourth magnetic structure is constructed from a plurality of identical equiangular segments made of permanently magnetized material.

Furthermore, in accordance with another preferred embodiment of the present invention, at least one pair of complementary surfaces selected from the pairs of the first surface and the fifth surface, the second surface and the sixth surface, the third surface and the seventh surface, the fourth surface and the eighth surface is a pair of planar surfaces substantially parallel to the mid-plane.

Furthermore, in accordance with another preferred embodiment of the present invention, the first yoke surface and the second yoke surface are substantially flat surfaces parallel to the mid-plane.

Furthermore, in accordance with another preferred embodiment of the present invention, the first yoke surface includes a first plurality of substantially flat surfaces parallel to the mid-plane and concentrically arranged around the axis of symmetry, and the second yoke surface includes a second plurality of complementary substantially flat surfaces being a mirror-image of the first plurality of the surfaces with respect to the mid-plane.

Furthermore, in accordance with another preferred embodiment of the present invention, at least one of the first plurality of surfaces is separated from at least one of the remaining surfaces of the first plurality of surfaces by a first distance along the axis of symmetry and at least one of the second plurality of complementary surfaces is separated from at least one of the remaining surfaces of the second plurality of complementary surfaces by a second distance equal to the first distance along the axis of symmetry.

Furthermore, in accordance with another preferred embodiment of the present invention, the apparatus further includes at least a first ferromagnetic spacer member disposed between the first yoke surface and at least one of the first magnetic structure and the at least second magnetic structure, and at least a second ferromagnetic spacer member disposed between the second yoke surface and at least one of the third magnetic structure and the at least fourth magnetic structure.

Furthermore, in accordance with another preferred embodiment of the present invention, the at least first ferromagnetic spacer member and the at least second ferromagnetic spacer member are identically selected from a substantially disk-like ferromagnetic spacer member, a substantially regular polygonal ferromagnetic spacer member, a substantially annular ferromagnetic spacer member, and a substantially annular regular polygonal spacer member.

Furthermore, in accordance with another preferred embodiment of the present invention, the at least first ferromagnetic spacer member and the at least second ferromagnetic spacer member are made of a material having high magnetic permeability.

Furthermore, in accordance with another preferred embodiment of the present invention, the at least first ferromagnetic spacer member and the at least second ferromagnetic spacer member are made of a non-magnetic, non-ferromagnetic material.

Furthermore, in accordance with another preferred embodiment of the present invention, each of the first pole-piece and the second pole-piece is segmented into a plurality of pole-piece segments having first gaps therebetween and each of the first magnetic structure, and the third magnetic structure is segmented into magnetic structure segments having second gaps therebetween. At least some of the magnetic structure segments have an average remanence value different from the average remanence value of the remaining segments of the first and second magnetic structures to at least partially compensate for magnetic inhomogeneities resulting from the asymmetry of the open ferromagnetic yoke.

Furthermore, in accordance with another preferred embodiment of the present invention, the at least first annular collimator and the at least second annular collimator are segmented into a plurality of collimator segments having first gaps therebetween. The at least second magnetic structure, and the at least fourth magnetic structure are segmented into magnetic structure segments having second gaps therebetween. At least some of the magnetic structure segments have an average remanence value different from the average remanence value of the remaining segments of the first and second magnetic structures to at least partially compensate for magnetic inhomogeneities resulting from the asymmetry of the open ferromagnetic yoke.

Furthermore, in accordance with another preferred embodiment of the present invention, the thickness of the first magnetic structure along the axis of symmetry is different from the thickness of at least one of the at least second magnetic structure along the axis of symmetry.

Furthermore, in accordance with another preferred embodiment of the present invention, the thickness of the first magnetic structure along the axis of symmetry is equal to the thickness of at least one of the at least second magnetic structure along the axis of symmetry.

Furthermore, in accordance with another preferred embodiment of the present invention, at least one pair of complementary surfaces selected from the pairs of the first surface and the fifth surface, the second surface and the sixth surface, the third surface and the, seventh surface, the fourth surface and the eighth surface is a pair of non-planar surfaces. Each surface of the at least one pair of complementary surfaces is a mirror image of the other surface of the at least one pair of complementary surfaces with respect to the mid-plane.

Furthermore, in accordance with another preferred embodiment of the present invention, at least one pair of complementary surfaces selected from the pairs of the first surface and the fifth surface, the second surface and the sixth surface, the third surface and the,seventh surface, the fourth surface and the eighth surface is a pair of partly planar partly curved surfaces. Each surface of the at least one pair of complementary surfaces is a mirror image of the other surface of the at least one pair of complementary surfaces with respect to the mid-plane.

Furthermore, in accordance with another preferred embodiment of the present invention, at least one pair of complementary surfaces selected from the surface pairs of the first surface and the fifth surface, the second surface and the sixth surface, the third surface and the seventh surface, the fourth surface and the eighth surface is a pair of stepped surfaces. Each surface of the at least one pair of complementary surfaces is a mirror image of the other surface of the at least one pair of complementary surfaces with respect to the mid-plane.

Furthermore, in accordance with another preferred embodiment of the present invention, the first surface and the third surface are substantially iso-potential surfaces. The first surface has a first value of magnetic potential thereof and the third surface has a second value of magnetic potential thereof. The first value of magnetic potential is different than the second value of magnetic potential. The fifth surface and the seventh surface are substantially iso-potential surfaces The fifth surface has a third value of magnetic potential thereof and the seventh surface has a fourth value of magnetic potential thereof. The third value of magnetic potential is substantially equal to the first value of magnetic potential, and the fourth value of magnetic potential is substantially equal to the second value of magnetic potential.

Furthermore, in accordance with another preferred embodiment of the present invention, at least one of the yoke, the first pole-piece, the second pole-piece, the at least first collimator and the at least second collimator is made from a material selected from soft iron, an alloy including iron and silicon, and an alloy including iron and nickel.

Furthermore, in accordance with another preferred embodiment of the present invention, the at least first ferromagnetic spacer member and the at least second ferromagnetic spacer member are made from a material selected from soft iron, an alloy including iron and silicon, and an alloy including iron and nickel.

Furthermore, in accordance with another preferred embodiment of the present invention, at least one of the first pole-piece, the second pole-piece, the at least first collimator and the at least second collimator is adjustable relative to the mid-plane.

Furthermore, in accordance with another preferred embodiment of the present invention, the angle between the mid-plane and the at least one of the first pole-piece, the second pole-piece, the at least first collimator and the at least second collimator is adjustable for correcting the magnetic field.

Furthermore, in accordance with another preferred embodiment of the present invention, the distance between the mid-plane and at least part of the at least one of the first pole-piece, the second pole-piece, the at least first collimator and the at least second collimator is adjustable for correcting the magnetic field.

Furthermore, in accordance with another preferred embodiment of the present invention, The apparatus according further includes a plurality of adjusting screws adjustably attached to the yoke. At least one of the position and angle of the at least one of the first pole-piece, the second pole-piece, the at least first collimator and the at least second collimator is adjusted by rotating at least one of the plurality of adjusting screws.

There is further provided, in accordance with another preferred embodiment of the present invention, a method for constructing an open magnetic apparatus for providing a volume of substantially homogenous magnetic field. The apparatus has an axis of symmetry passing therethrough. The method includes the steps of providing an open ferromagnetic yoke having a first yoke surface and a second yoke surface opposed to the first yoke surface. The second yoke surface is shaped like a mirror image of the first yoke surface with respect to a mid-plane equidistant from the first yoke surface and the second yoke surface. The symmetry axis is perpendicular to the mid-plane, providing a first magnetic assembly attached to the first yoke surface, the first magnetic assembly includes a first ferromagnetic pole-piece substantially parallel to the mid-plane and having an outer radius, the axis of symmetry passing through the center of the first pole-piece, the first pole-piece is radially symmetric along any axis perpendicular to the axis of symmetry and passing through the center of the first pole-piece, the first pole-piece has a first surface facing the volume and a second surface facing the first yoke surface, and a first magnetic structure disposed between the second surface of the first pole-piece and a surface formed by a projection on the first yoke surface of the second surface of the first polepiece in a direction parallel to the axis of symmetry, the first magnetic structure has a first magnetization vector directed substantially parallel to the axis of symmetry, and at least a first substantially annular ferromagnetic collimator concentric with the first pole-piece and having an inner radius larger than the outer radius of the first pole-piece, the at least first collimator is radially separated from the first pole-piece by a first gap, the at least first collimator has a fourth surface facing the volume and a fifth surface facing the first yoke surface, and at least a second magnetic structure disposed between the fifth surface of the at least first collimator and a surface formed by a projection on the first yoke surface of the fourth surface of the first collimator in a direction parallel to the axis of symmetry, the second magnetic structure has a second magnetization vector directed substantially parallel to the axis of symmetry. And providing a second magnetic assembly opposed to the first magnetic assembly and attached to the second yoke surface, the volume is disposed in the open region defined between the first magnetic assembly and the second magnetic assembly, the second magnetic assembly includes, a second ferromagnetic pole-piece substantially parallel to the mid-plane and having an outer radius substantially equal to the outer radius of the first pole-piece, the axis of symmetry passes through the center of the second pole-piece, the second pole-piece is radially symmetric along any axis perpendicular to the axis of symmetry and passing through the center of the second pole-piece, the second pole-piece has a fifth surface facing the volume and a sixth surface facing the second yoke surface, and a third magnetic structure disposed between the sixth surface of the second pole-piece and a surface formed by a projection on the second yoke surface of the sixth surface of the second pole-piece in a direction parallel to the axis of symmetry, the third magnetic structure has a third magnetization vector substantially equal to the first magnetization vector, and at least a second substantially annular ferromagnetic collimator concentric with the second pole-piece and having an inner radius substantially equal to the inner radius of the at least first collimator and larger than the outer radius of the second pole-piece, the at least second collimator is radially separated from the first pole-piece by a second gap, the at least second collimator having a seventh surface facing the volume and an eighth surface facing the second yoke surface, and at least a fourth magnetic structure disposed between the eighth surface of the at least second collimator and a surface formed by a projection on the second yoke surface of the eighth surface of the second collimator in a direction parallel to the axis of symmetry, the at least fourth magnetic structure has a fourth magnetization vector substantially equal to the second magnetization vector, wherein the first pole-piece and the second pole-piece are selected from a cylindrical pole piece, an annular pole-piece, a regular polygonal pole-piece and a regular polygonal annular pole-piece, and the at least first collimator and the at least second collimator are selected from an annular collimator and a regular polygonal annular collimator.

There is also provided, in accordance with another preferred embodiment of the present invention, a method for designing an open yoked magnetic apparatus providing a volume of substantially homogenous magnetic field. The volume has radial symmetry with respect to an axis of symmetry passing therethrough. The volume has a center point located on a mid-plane. The mid-plane is perpendicular to the axis of symmetry and symmetrically bisects the volume. The method includes the steps of providing a first set of parameters defining the desired dimensions of the volume and the desired magnitude of the magnetic field within the volume, providing an integer number N representing the number of high order harmonics of the magnetic field which are to be compensated, providing a second set of dimensional parameters defining a plurality of K ferromagnetic members concentrically arranged around the axis of symmetry and radially symmetric with respect to any axis perpendicular to the axis of symmetry, the plurality of K ferromagnetic members includes a substantially disc-like or annular pole-piece and K−1 substantially annular collimators, each of the plurality of K ferromagnetic members is associated with a magnetic structure of a plurality of K magnetic structures such that the K-th magnetic structure is disposed between the K-th ferromagnetic member and a portion of a surface of a ferromagnetic yoke of the yoked magnetic apparatus, computing from the second set of dimensional parameters a matrix $M_{jK}$ including N-K matrix elements, wherein each of the matrix elements $m_{jK}$ represents the contribution of the K-th magnetic structure to a j-th harmonic coefficient $a_j$ wherein the harmonic coefficient $a_j$ represents the coefficient of the j-th term of higher than zeroth order terms of the magnetic field expansion equation for the magnetic field formed by a magnetic structure of the plurality of K magnetic structures and by the pole-piece, the magnetic structure is disposed between the pole-piece and a portion of the surface of the yoke, computing from the matrix $M_{jK}$ and from the values of the high order coefficients $a_j$ a plurality of K remanence values, each of the remanence values $J_K$ of the plurality of K remanence values represents the average remanence value for the K-th magnetic structure, checking whether the absolute value of all of the remanence values $J_K$ is smaller than or equal to a maximal remanence value $J_{MAX}$, the maximal remanence value $J_{MAX}$ represents the maximal remanence value of the magnetic material available for constructing the magnetic apparatus, performing a solution stability check to verify that the solution based on the second set of parameters is a stable solution within the tolerance range of the magnetic material available for constructing the magnetic apparatus, checking whether any of the K ferromagnetic members is magnetically saturated, and accepting the solution based on the second set of parameters if none of the K ferromagnetic members is magnetically saturated.

Furthermore, in accordance with another preferred embodiment of the present invention, the first set of parameters includes the length of the volume along the axis of symmetry, the cylindrical radius of the volume along a direction perpendicular to the axis of symmetry, and the zeroth order coefficient $a_0$ of the zeroth order term of the magnetic field expansion equation for the magnetic field of the pole-piece and the magnetic structure.

Furthermore, in accordance with another preferred embodiment of the present invention, the second set of dimensional parameters includes the parameters $HC_K$, $H_K$, $D_K$, $R(K)_{IN}$ and $R(K)_{OUT}$ wherein $H_K$ represents the thickness of the Kth magnetic structure measured along the axis of symmetry, $HC_K$ represents the thickness of the Kth ferromagnetic member measured along the axis of symmetry, $D_K$ represents the distance between the mid-plane and the surface of the Kth ferromagnetic member facing away from the mid-plane, $R(K)_{IN}$ represents the inner radius of the Kth ferromagnetic member and $R(K)_{OUT}$ represents the outer radius of the Kth ferromagnetic member.

Furthermore, in accordance with another preferred embodiment of the present invention, the pole-piece of the K ferromagnetic members is a disc-like pole-piece having a circular cross-section in a plane parallel to the mid-plane. The value of the $R(K)_{out}$ is the radius of the circular cross-section and the value of the $R(K)_{IN}$ is zero.

Furthermore, in accordance with another preferred embodiment of the present invention, at least one of the K ferromagnetic members is an annular ferromagnetic member. The value of the $R(K)_{out}$ is the outer radius of the at least one of the annular ferromagnetic members with respect to the axis of symmetry and the value of the $R(K)_{IN}$ is the inner radius of the at least one of the ferromagnetic members with respect to the axis of symmetry.

Furthermore, in accordance with another preferred embodiment of the present invention, the pole-piece of the K ferromagnetic members is a right regular polygonal prism-like pole-piece having a polygonal cross-section in a plane parallel to the mid-plane. The value of the $R(K)_{out}$ is the length of the line connecting the center of the polygonal cross-section with a vertex of the polygonal cross-section and the value of $R(K)_{IN}$ is zero.

Furthermore, in accordance with another preferred embodiment of the present invention, at least one of the pole-piece or the collimators of the K ferromagnetic members is a right regular annular polygonal prism-like pole-piece or collimator having an annular polygonal cross-section. The cross-section has an outer polygonal circumference and an inner polygonal circumference. The value of $R(K)_{out}$ is the length of a first line connecting the center of the annular polygonal cross-section with a vertex of the outer polygonal circumference and the value of $R(K)_{IN}$ is the length of a second line connecting the center of the annular polygonal cross section with the mid-point of a side of the inner polygonal circumference. The second line is perpendicular to the side.

Furthermore, in accordance with another preferred embodiment of the present invention, at least one of the pole-piece or the collimators of the K ferromagnetic members is a right regular annular polygonal prism-like pole-piece having at least one annular polygonal surface. The surface has an outer polygonal circumference and an inner polygonal circumference. The value of $R(K)_{out}$ is the length of a first line connecting the center of the annular polygonal surface with a vertex of the outer polygonal circumference and the value of $R(K)_{IN}$ is the length of a second line connecting the center of the annular polygonal surface with the mid-point of a side of the inner polygonal circumference. The second line is perpendicular to the side.

Furthermore, in accordance with another preferred embodiment of the present invention, the number N is an integer number in the range of 2–6.

Furthermore, in accordance with another preferred embodiment of the present invention, the method further includes after the first step of checking, if the absolute value of one or more of the remanence values $J_K$ is smaller than or equal to the maximal remanence value $J_{MAX}$, the step of repeating the third step of providing, the first and the second step of computing and the first step of checking a sufficient number of times until the absolute value of all of the remanence values $J_K$ is smaller than or equal to the maximal remanence value $J_{MAX}$. The step of repeating includes changing at least one dimensional parameter of the second set of dimensional parameters each time the third step of providing is performed within the step of repeating.

Furthermore, in accordance with another preferred embodiment of the present invention, the step of performing a solution stability check includes the steps of computing a worst case value for each of the harmonic coefficients $a_j$, computing the value of the expression $$\frac{1}{a_0}\sum_{j=1}^{N} a_j \pi j I_0\left(\pi j \frac{r}{Z_0}\right)\cos\left(\frac{\pi j z}{Z_0}\right)$$

and comparing the value of the expression to a value $\epsilon$ representing the allowed deviation from the value of the magnetic field of the volume. The solution is stable if the value of the expression is smaller than or equal to the value of $\epsilon$.

Furthermore, in accordance with another preferred embodiment of the present invention, the method further includes, after the step of performing, if the solution based on the second set of parameters is not a stable solution within the tolerance range of the magnetic material available for constructing the magnetic apparatus, the step of repeating the third step of providing, the first and the second step of computing, the first step of checking and the step of performing a sufficient number of times until the solution is a stable solution within the tolerance range of the magnetic material available for constructing the magnetic apparatus. The step of repeating includes changing at least one dimensional parameter of the second set of dimensional parameters each time the third step of providing is performed within the step of repeating.

Furthermore, in accordance with another preferred embodiment of the present invention, the method further includes after the second step of checking, if at least one of the K ferromagnetic members is magnetically saturated, the step of repeating the third step of providing, the first and the second step of computing, the first step of checking, the step of performing and the second step of checking a sufficient number of times until none of the K ferromagnetic members is magnetically saturated. The step of repeating includes changing at least one dimensional parameter of the second set of dimensional parameters prior to performing the third step of providing included within the step of repeating.

Furthermore, in accordance with another preferred embodiment of the present invention, The method further includes after the second step of checking, if at least one of the K ferromagnetic members is magnetically saturated, the step of changing the parameters of the ferromagnetic material included in the at least one of the K ferromagnetic members and repeating the second step of checking.

Furthermore, in accordance with another preferred embodiment of the present invention, the method further includes after the second step of checking, a third step of checking whether additional cycles of the method are desired and, if additional cycles of the method are desired repeating the third step of providing, the first step of computing, the second step of computing, the first step of checking, the step of performing and the second step of checking. The step of repeating includes changing at least one dimensional parameter of the second set of dimensional parameters prior to performing the third step of providing included within the step of repeating.

Furthermore, in accordance with another preferred embodiment of the present invention, The method further includes the step of recording the current values of the second set of dimensional parameters.

Furthermore, in accordance with another preferred embodiment of the present invention, the method further includes the step of providing an output representing the current values of the second set of dimensional parameters.

Finally, in accordance with another preferred embodiment of the present invention, the output is selected from a hard copy, an data file stored on a storage medium, and a symbolic representation displayed on a display device.

BRIEF DESCRIPTION OF THE DRAWINGS

The present invention will be described with reference to the accompanying drawings, wherein like reference numerals identify like or corresponding components In the drawings.

DETAILED DESCRIPTION OF THE DRAWINGS

Figure 1:
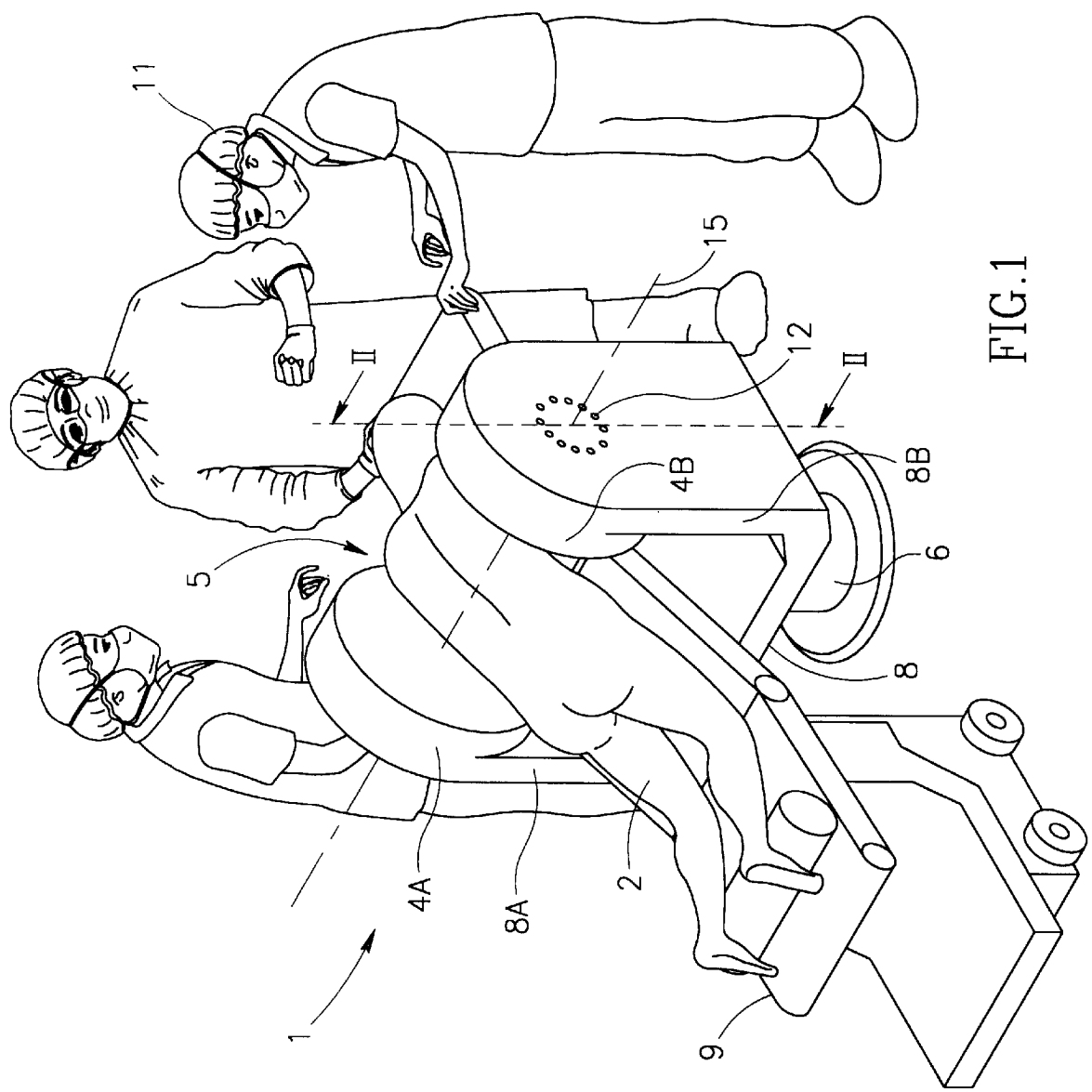
FIG. 1 is a schematic isometric view of an open compact yoked magnetic probe for MRI or MRT, in accordance with a preferred embodiment of the present invention.

Reference is now made to FIG. 1 which is a schematic isometric view of an open compact yoked magnetic probe, in accordance with a preferred embodiment of the present invention.

The magnetic probe 1 is an open magnetic probe having an opening 5 therewithin. The magnetic probe 1 includes an open U-shaped yoke 8 having two prongs 8A and 8B. The magnetic probe also includes two permanent magnet assemblies 4A and 4B which are attached to the prongs 8A and 8B, respectively, of the yoke 8. The yoke 8 is made from a ferromagnetic material such as cast iron, but any other type of suitable ferromagnetic material can also be used. The magnetic probe 1 also includes a base 6 which is attached to the yoke 8 for supporting the yoke 8 above the floor. The yoke 8 may be fixedly attached to the base 6 or can be rotatably attached to the base 6 (not shown) in such a way that the yoke 8 can be freely rotated around an axis (not shown) which is perpendicular to the plane of the floor. The yoke 8 may also by tiltably attached to the base 6 to allow tilting of the yoke 8 at a selected angle to the plane of the floor.

A patient or a body part or organ thereof can be positioned within the opening 5 for performing imaging. In the non-limiting example illustrated in FIG. 1, a patient 2 is shown lying on a movable adjustable supporting device 9 such that a part of the back region of the body of the patient 2 is positioned within the imaging volume (not shown) of the magnetic probe 1.

It is noted that, the magnetic probes of the present invention also include a plurality of coils (not shown) which may include gradient coils, radio frequency (RF) transmitting and receiving coils and shimming coils. The construction and positioning of such coils within a magnetic probe are known in the art. The structure and placement of the various coils will therefore not be further discussed in the present application.

Figure 2:
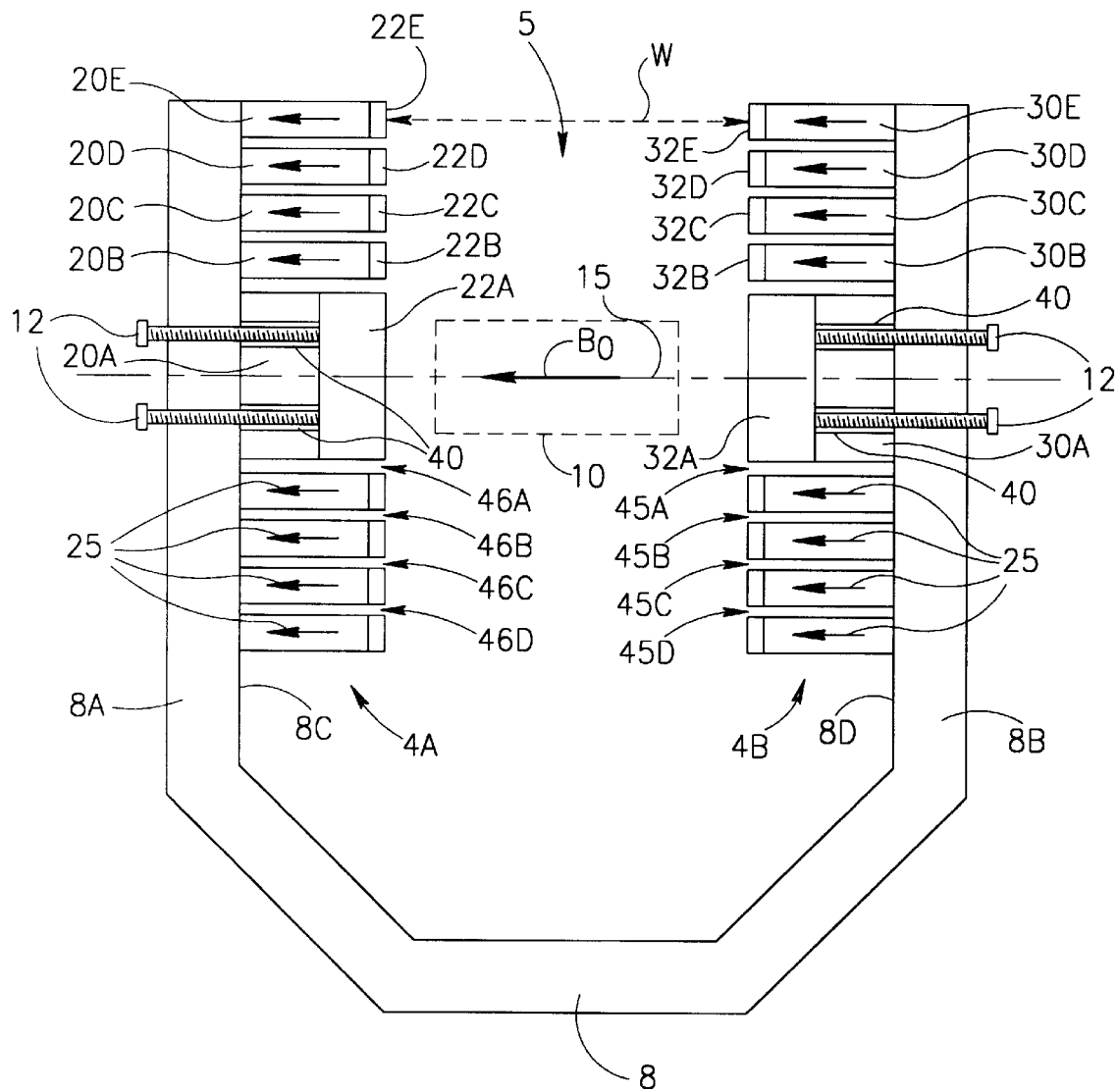
FIG. 2 is a schematic cross section of the permanent magnet assembly included in the magnetic probe of FIG. 1, taken along the lines II—II.
Figure 3:
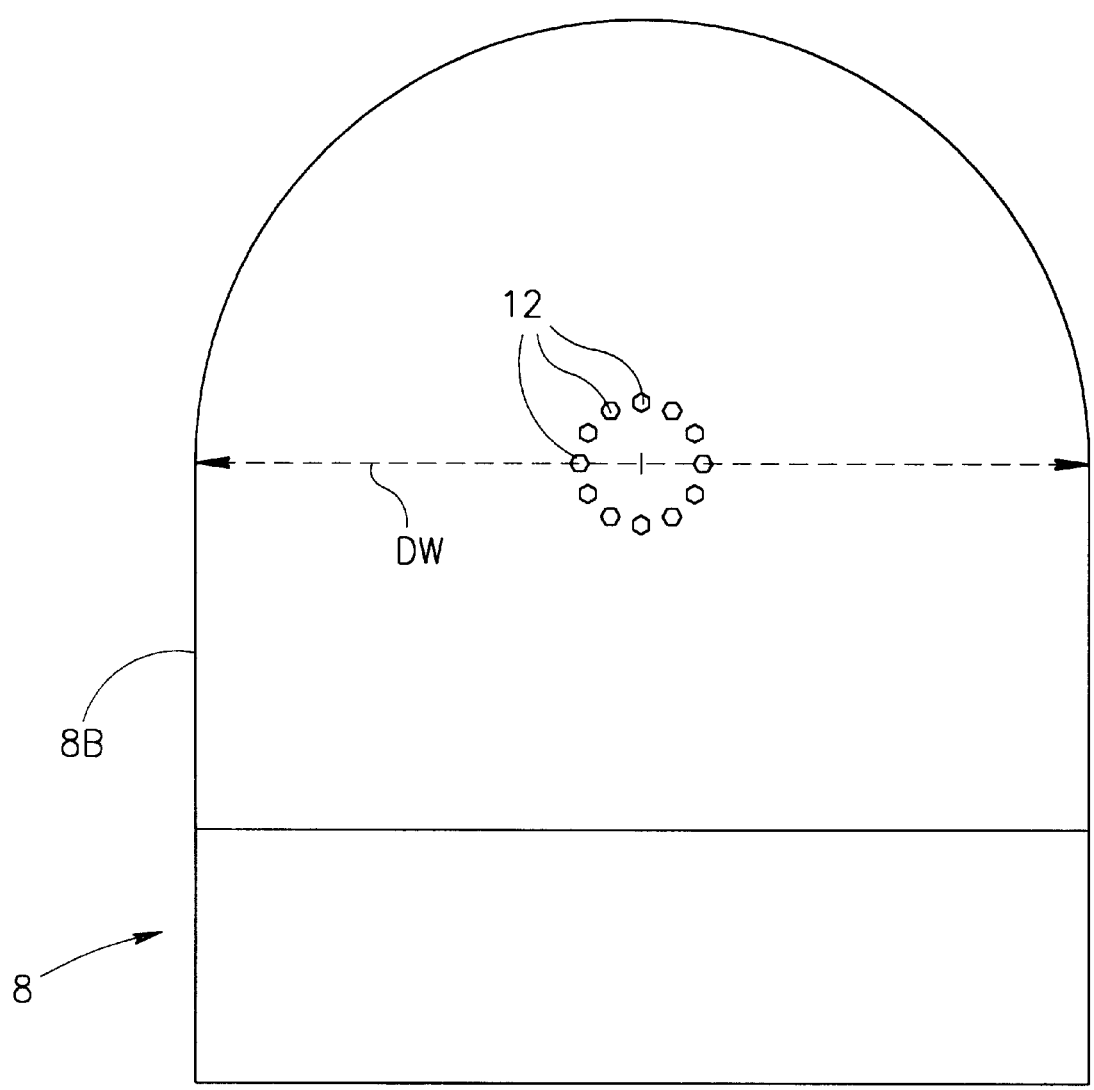
FIG. 3 is a schematic side view of the yoke part of the magnetic probe of FIG. 1.
Figure 4:
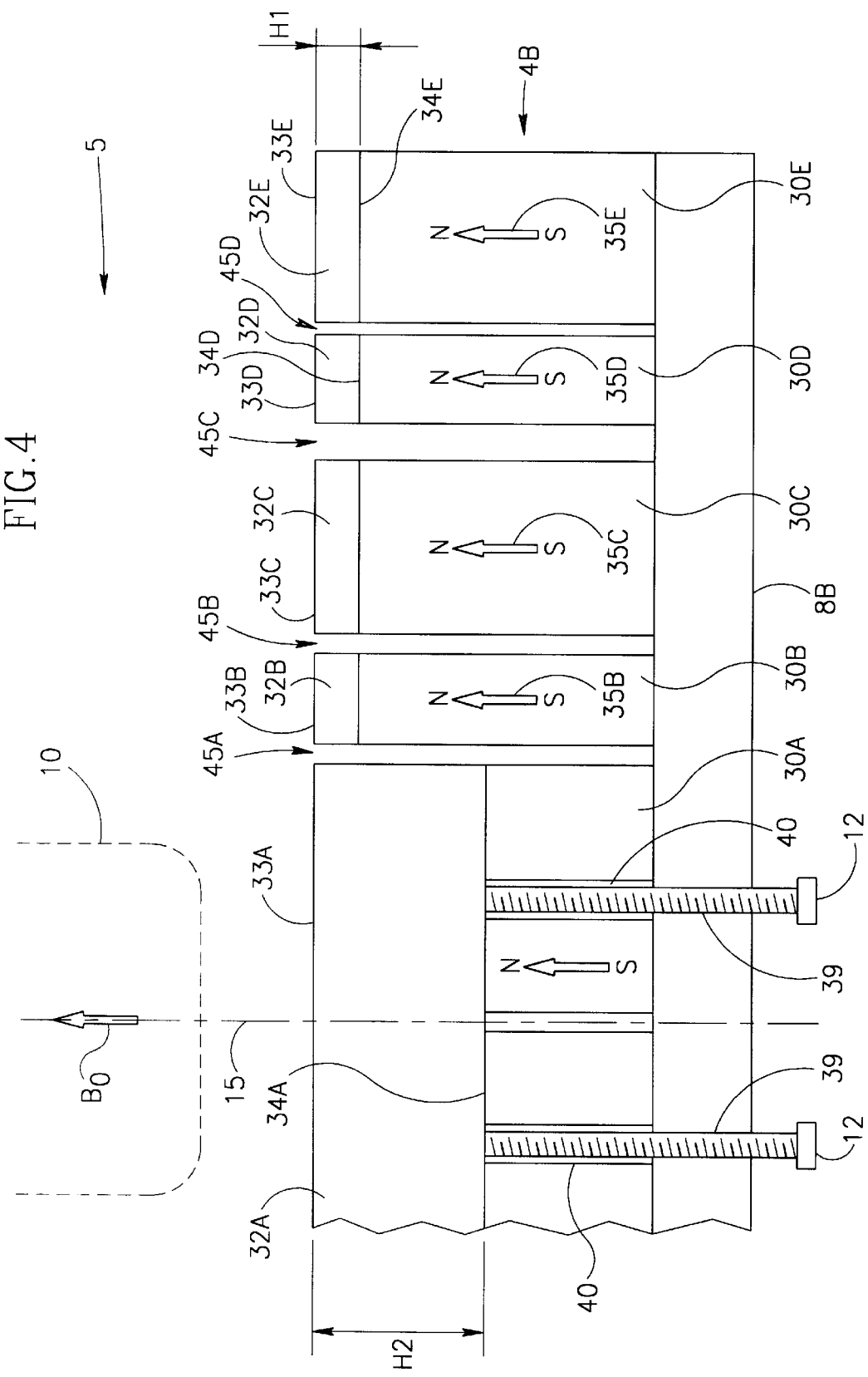
FIG. 4 is a schematic cross sectional view illustrating a part of the magnetic probe of FIG. 2 in detail.

Reference is now made to FIGS. 2–4. FIG. 2 is a schematic cross section of the yoke 8 and permanent magnet assemblies 4A and 4B included in the magnetic probe of FIG. 1, taken along the lines II—II. FIG. 3 is a schematic side view of the yoke 8 of the magnetic probe of FIG. 1, and FIG. 4 is a schematic cross sectional view illustrating a part of the magnetic probe 1 of FIG. 2 in detail.

Turning to FIG. 2, the permanent magnet assembly 4A includes five concentric generally annular magnetic structures 20A, 20B, 20C, 20D and 20E and the permanent magnet assembly 4B includes five concentric annular magnetic structures 30A, 30B, 30C, 30D and 30E, The magnetic structures 20A, 20B, 20C, 20D and 20E and the magnetic structures 30A. 30B, 30C, 30D and 30E are concentric with respect to an axis 15 which is also the axis passing through the center (not shown) of the imaging volume 10 of the magnetic apparatus of FIG. 2. The imaging volume 10 is also referred to as the Field of view (FOV). The annular magnetic structures 20A, 20B, 20C, 20D and 20E are separated by gaps 46A, 46B, 46C and 46D. The annular magnetic structures 30A, 30B, 30C, 30D and 30E of the permanent magnet assembly 4B are separated by gaps 45A, 45B, 45C and 45D which are dimensionally identical to the corresponding gaps 46A, 46B, 46C and 46D of the permanent magnet assembly 4A.

It is noted that, the annular magnetic structures 20A, 20B, 20C, 20D and 20E and the annular magnetic structures 30A, 30B, 30C, 30D and 30E are concentrically arranged with respect to an axis 15 which is perpendicular to the two substantially parallel surfaces 8C and 8D of the yoke 8.

It is noted that while the dimensions of the two gaps of each of the gap pairs 45A and 46A, 458 and 46B, 45C and 46C, and 45D and 46D are identical, the dimensions of the gaps included within each permanent magnet assembly 4A and 4B may vary depending on the specific implementation of the magnetic probe 1. For example, within permanent magnet assembly 4B (FIG. 4) gap 45C is wider than gaps 45A, 45B and 45C. It is also noted that the dimensions of at least some of the gaps within any selected one of the permanent magnet assemblies 4A and 4B may be identical. Generally, the precise dimensions of the gaps are determined by the optimization procedures used for designing the permanent magnet assemblies 4A and 4B.

It is further noted that, the radial gaps of each of the radial gap pairs 45A and 46A, 45B and 46B, 45C and 46C, and 45D and 46D are filled with a non-magnetic, non-ferromagnetic material such as air, plastic or the like. The radial dimensions of each of the gaps of the gap pairs 46A and 46A, 45B and 46B, 45C and 46C, and 45D and 46D are such that each one of the surfaces facing the FOV of the polepiece 22A and of each of the collimators 45B, 45C, 45D, of the magnetic assembly 4A is an iso-potential surface having a magnetic potential value different than the magnetic potential value of any of the remaining iso-potential surfaces facing the FOV of the pole-piece 22A and of each of the collimators 45B, 45C, 45D, of the magnetic assembly 4A, and each one of the surfaces facing the FOV of the pole-piece 32A and of each of the collimators 46B, 46C, 46D, of the magnetic assembly 4B is an iso-potential surface having a magnetic potential value different than the magnetic potential value of any of the remaining iso-potential surfaces facing the FOV of the pole-piece 32A and of each of the collimators 46B, 46C, 46D, of the magnetic assembly 4B.

The value of the magnetic potential of the surface facing the FOV of the pole-piece 22A is equal (within practically achievable manufacturing tolerances) to the value of the magnetic potential of the surface facing the FOV of the opposed complementary pole-piece 32A. Similarly, the value of the magnetic potential of the surface facing the FOV of each of the collimators 45A, 45B, 45C and 45D is equal (within practically achievable manufacturing tolerances) to the value of the magnetic potential of the complementary surface facing the FOV of the opposed complementary collimator 46A, 46B, 46C, and 46D, respectively. Each of the annular magnetic structures 20A, 20B, 20C, 20D, 20E, 30A, 30B, 30C, 30D and 30E has a first surface attached to the to the yoke 8 and a second surface distal from the yoke 8. The first surface of each of the annular magnetic structures is attached to the yoke 8 by a layer of glue (not shown) such as epoxy glue or by any other suitable bonding material. Alternatively, the first surface of each of the annular magnetic structures may be fixedly attached to the yoke 8 by screws (not shown) or other suitable mechanical devices (not shown).

Each of the annular magnetic structures 20A, 20B, 20C, 20D, 20E, 30A, 30B, 30C, 30D and 30E has a second surface distal from the yoke 8 and parallel to the first surface.

The magnetic field polarity for each of the annular magnetic structures 20A, 20B, 20C, 20D, 20E, 30A, 30B, 30C, 30D and 30E is schematically represented by the arrows 25. It is noted that, while the arrows 25 are used to indicate the direction (polarity) of the magnetization vectors of the magnetic structures 20A, 20B, 20C, 20D, 20E, 30A, 30B, 30C, 30D and 30E, the arrows 25 do not represent the magnetization vectors themselves since their lengths are arbitrarily illustrated and do not represent the magnetic field magnitude of any of the magnetization vectors but are only indicative of their respective polarities. Similarly, throughout the application, the length of any arrows used for representing the direction (polarity) of the magnetization vectors of any magnetic structures does not represent the magnitude of these magnetization vectors.

Turning to FIG. 4, the permanent magnet assembly 4B further includes four field collimators 32B, 32C, 32D and 32E, and a pole piece 32A. The field collimators 32B, 32C, 32D and 32E, and the pole piece 32A are used for collimating the magnetic field of the annular magnetic structures. The field collimators 32B, 32C, 32D and 32E have a thickness H1 represented by the double headed arrow labeled H1 and the pole piece 32A has a thickness H2 represented by the double headed arrow labeled H2 wherein H2 is greater than H1.

Each of the field collimators 32B. 32C, 32D and 32E, and the pole piece 32A has a first surface 34B, 34C, 34D, 34E, and 34A, respectively, which is attached to the second surface of the annular magnetic structures 30B, 30C, 30D, 30E, and 30A, respectively, by a layer of glue (not shown) or other bonding material such as epoxy glue or by any other type of suitable glue.

Each of the field collimators 32B, 22C, 32D and 32E and pole piece 32A also has a second surface 33B, 33C, 33D, 33E, and 33A, respectively. The second surfaces 33B, 33C, 33D, 33E, and 33A are substantially co-planar.

It is noted, that the exact orientation of the pole pieces 22A and 32A can be fine-tuned after the construction of the magnet assemblies 4A and 4B, respectively, by properly adjusting one or more of the tuning screws 12 (FIGS. 2–4). Each of the prongs 8A and 8B of the yoke 8 includes twelve tuning screws 12 rotatably disposed therewithin. The tuning screws 12 are rotatably disposed within internally threaded bores 39 (FIG. 4) passing through the prongs 8A and 8B. The arrangement of the tuning screws 12 within the prong 8B is best seen in FIG. 3. The tuning screws 12 pass within twelve passages 40 passing within each of the annular magnetic structures 20A and 30A. Fine tuning of the orientation of the second surface 33A of the pole piece and 32A with respect to the axis 15 may be needed to compensate for inaccuracies in the main magnetic field orientation and homogeneity caused, inter alia, by the fact that due to manufacturing inaccuracies, the two surfaces 8C and 8D of the yoke 8 are not precisely parallel, or by inaccuracies in the shape or placement of other components of the permanent magnet assemblies 4A and 48. It is noted that, while in the preferred embodiment of the permanent magnet assembly of FIG. 2, each of the prongs 8A and 8B of the yoke 8 includes twelve tuning screws 12, other preferred embodiments may include other numbers of screws. Typically, any number of tuning screws which is equal to or larger than three screws per yoke prong may be used. The number of passages 40 is therefore identical to the number of tuning screws 12 which is used for a particular preferred embodiment.

In accordance with one preferred embodiment of the present invention, the diameter DW of the permanent magnet assemblies 4A and 4B is approximately 80 cm and the distance separating the pole pieces 22A and 32A which is represented by the dashed double headed arrow labeled W is approximately 50 cm. It will be appreciated that these dimensions are exemplary dimensions and that other values of these dimensions can be used depending on, inter alia, the required dimensions of the opening 5, the size and shape of the imaging volume 10, the required main magnetic field strength, and other structural considerations.

The field collimators 32B, 32C, 32D and 32E and pole piece 32A are made of soft iron, or of any other ferromagnetic material having magnetic properties suitable for magnetic field collimation.

The field collimators 32B, 32C, 32D and 32E and pole piece 32A act as collimating elements since the second surfaces thereof 33B, 33C, 33D, 33E, and 33A, respectively, each acts as a magnetically equipotential surface. Each of these equipotential surfaces creates a substantially uniform magnetic field strength distribution over its entire surface which magnetic field is directed substantially perpendicular to the equipotential surface. The field collimators 32B, 32C, 32D and 32E and pole piece 32A reduce the effects of inhomogeneities in the magnetic field generated by the annular magnetic structures underlying the collimators 32B, 32C, 32D and 32E and the pole piece 32A.

Similar to the permanent magnet assembly 4B, the permanent magnet assembly 4A further includes four field collimators 22B, 22C, 22D and 22E, and a pole piece 22A which are attached to the annular magnetic structures 20B, 20C, 20D, 20E and 20A, respectively.

It is noted that, structurally, the permanent magnet assembly 4A is generally a mirror image of the permanent magnet assembly 4B with respect to a mid-plane (not shown) which is a plane generally parallel to the plane of the surfaces 8C and 8D and is generally equidistant from both of the surfaces 8C and 8D. The structural details of the various components comprising the permanent magnet assembly 4A will therefore not be further described except for two features that distinguish the components of the permanent magnet assembly 4A from the corresponding components of the permanent magnet assembly 4B.

The first difference distinguishing the permanent magnet assembly 4A from the permanent magnet assembly 4B is the direction and polarity of the magnetic field of the annular magnetic structures 20B. 20C, 20D, 20E, 20A, 30B, 30C, 30D, 30E, and 30A. As best seen in FIG. 4, each of the annular magnetic structures, 30A, 30B, 30C, 30D, and 30E of the permanent magnet assembly 4B has a general magnetization direction or polarity which are schematically represented by the arrows 35A, 35B, 35C, 35D and 35E, respectively. For each of the arrows 35A, 35B, 35C, 35D and 35E, the labels N and S indicate the polarity of the north and south poles, respectively, of the relevant annular magnetic structure within which the arrow is drawn.

While the magnitude of the magnetic field strength of the two opposing complementary magnetic structures within each of the pairs of magnetic structures 20A and 30A, 20B and 30B, 20C and 30C, 20D and 30D, and 20E and 30E is equal (within manufacturing tolerances), the polarity of the magnetic fields of the annular magnetic structures 20A. 208, 20C, 20D, and 20E (FIG. 2) is similar to, rather than being the mirror image of the polarity of the magnetic fields (not shown) of the opposed corresponding annular magnetic structures 30A, 30S, 30C, 30D, and 30E (with respect to the equidistant mid-plane defined hereinabove). This generates a uniform homogenous magnetic field represented by the arrow labeled $B_0$ generally aligned along the axis 15 which is an axis of symmetry common to the permanent magnet assemblies 5A and 4B. Briefly returning to FIG. 2, an imaging volume 10 is defined within the magnetic probe 1. The imaging volume 10 is disposed between the two permanent magnetic assemblies 4A and 4B. The imaging volume 10 represents a volume within which the main magnetic field has such values of intensity and homogeneity which are suitable for performing magnetic resonance imaging of a body part or an organ with a predefined imaging resolution and quality.

It is noted that, while the preferred embodiment of the magnetic probe of FIG. 2 has an imaging volume which is roughly cylindrical, other preferred embodiments of the magnetic probe may be implemented in which the imaging volume has a different geometry depending, inter alia, on the precise magnetic and/or geometrical parameters of the components of the magnetic probe 1.

The second difference that may possibly but not necessarily distinguish the permanent magnet assembly 4A from the permanent magnet assembly 4B concerns the details of the internal fine structure of the annular magnetic structures 20B, 20C, 20D. 20E, 20A, 30B, 30C, 30D, 30E, and 30A which is disclosed in detail hereinafter. The annular magnetic structures 20A, 20B, 20C, 20D, 20E, 30A, 30B, 30C, 30D and 30F comprise a permanently magnetized material such as a permanently magnetized alloy made from iron, neodimium and boron (FeNdB alloy). It is noted that in accordance with an embodiment of the present invention, the annular magnetic structures 20A, 20B, 20C, 20D, 20E, 30A, 308, 30C, 30D and 30E are each formed of a monolithic single piece of permanently magnetized material having a specific value of remanence as calculated by the design method disclosed hereinafter. However, since the manufacturing of such permanently magnetized annular forms may be prohibitively expensive and may therefore not be commercially available, at least some of the annular magnetic structures 20A, 20B, 20C, 20D, 20E, 30A, 30B, 30C, 30D and 30E may be made off a plurality of discrete permanently magnetized blocks as is disclosed in detail hereinafter.

It is noted that while the annular magnetic structures 22A and 32A of FIG. 2 are shown to have a passage 47 within them, they may be substituted with disk like magnetic structures (not shown) which do not have a passage therewithin.

Figure 5:
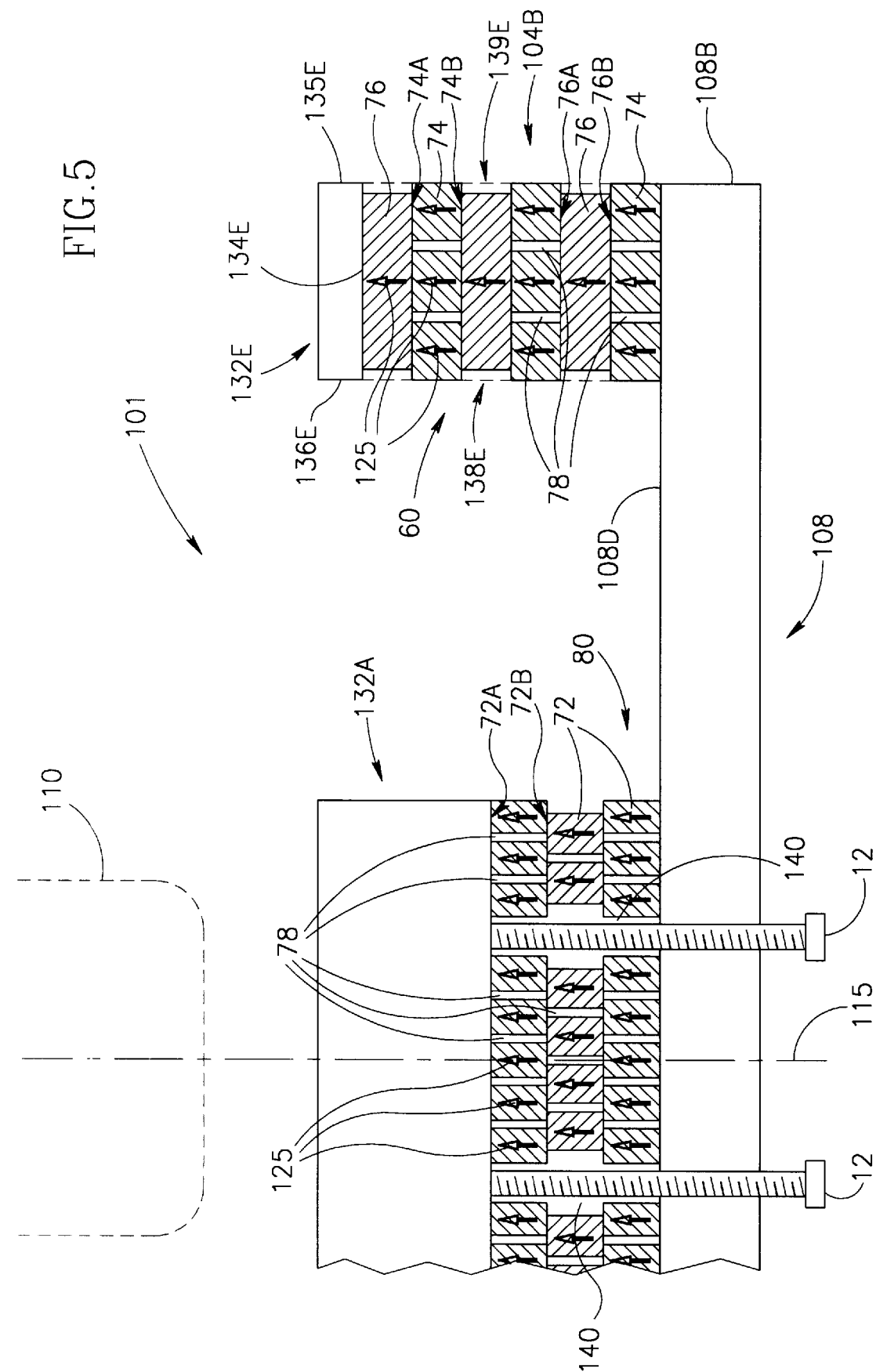
FIG. 5 is a schematic cross sectional view of part of a magnetic probe having annular magnetic structures constructed from discrete permanent magnetic blocks, in accordance with a preferred embodiment of the present invention.

Reference is now made to FIG. 5 which is a schematic cross sectional view of part of a magnetic probe having annular magnetic structures constructed from discrete permanent magnetic blocks, in accordance with a preferred embodiment of the present invention.

The magnetic probe 101 partially illustrated in FIG. 5 includes a yoke 108 of which only part of the prong 108B is shown. As in the magnetic probe 1 of FIG. 1, the magnetic probe 101 includes two permanent magnet assemblies of which only part of the permanent magnet assembly 104B is shown. The permanent magnet assembly includes a plurality of substantially disk like or substantially annular magnetic structures. Only the inner substantially disk like magnetic structure 80 and the outer substantially annular magnetic structure 60 are shown. The rest of the plurality of concentric substantially annular magnetic structures which are attached to the yoke 108 between the inner disk like magnetic structure 80 and the outer substantially annular magnetic structure 60 are not shown for the sake of clarity of illustration. These annular magnetic structures are arranged with gaps (not shown) between them similarly to the arrangement disclosed for the annular magnetic structures 30A, 30B, 30C, 30D and 30E of FIG. 4.

The disk like structure 80 is covered by a pole piece 132A made from soft iron or from another suitable ferromagnetic material. The pole piece 132A is attached to the disk like magnetic structure 80 by the force of magnetic attraction between them.

Similarly, the substantially annular structure 60 is covered by an annular field collimator 132E made from soft iron or from another suitable ferromagnetic material. The field collimator 132E is attached to the substantially annular magnetic structure 60 by the force of magnetic attraction between them.

All the other permanent magnetic structures (not Shown) are also covered by annular field collimators (not shown). The surfaces of all the field collimators which face towards the imaging volume 110 are all substantially coplanar.

The substantially disk like magnetic structure 80 includes a plurality of magnetic blocks 72. The magnetic blokes 72 are arranged within the disk like magnetic structure in such a way that a plurality of voids 78 are formed between the various magnetic blocks 72 of which the disk like magnetic structure 80 is constructed. The different magnetic blocks 72 are attached to each other by layers of glue (not shown) such as epoxy glue or any other suitable bonding material. The polarity of the magnetic field of each of the magnetic blocks 72 is represented by the arrows 125. The layer of the magnetic blocks 72 which contacts the surface 108D of the yoke 108 is fixedly attached to the surface 108D by a layer of glue (not shown) such as epoxy glue or any other suitable bonding material.

The substantially annular magnetic structure 60 includes a plurality of magnetic blocks 74 and 76. The magnetic blocks 76 are larger than the magnetic blocks 74. The magnetic blokes 74 and 76 are arranged within the annular magnetic structure 60 in such a way that a plurality of voids 78 are formed between the various magnetic blocks 74 and 76 of which the annular magnetic structure 60 is constructed. The magnetic blocks 74 and 76 are attached to each other by layers of glue (not shown) such as epoxy glue or any other suitable bonding material. The layer of the magnetic blocks 74 which contacts the surface 108D of the yoke 108 is fixedly attached to the surface 108D by a layer of glue (not shown) such as epoxy glue or any other suitable bonding material.

The polarity of the magnetic field of each of the magnetic blocks 74 and 76 is represented by the arrows 125.

It is noted that, while the magnetic blocks 72 of the disk like magnetic structure 80 are identical in size and dimensions, and while the shape and the dimensions of the magnetic blocks 74 differ from the shape and the dimensions of the magnetic blocks 76, many other variations in the shape and dimensions of the magnetic blocks are possible. For example, the various magnetic blocks may have rectangular shapes or other different prismatic or wedge like shapes (not shown). Preferably, each of the magnetic blocks 72, 74 and 76 has at least one pair of parallel surfaces 72A and 72B, 74A and 74B, and 76A and 76B, respectively, for facilitating the stacking of the magnetic blocks in layers which are generally parallel to the surface 108D of the yoke 108 as best seen in FIG. 5. Thus, the magnetic blocks comprising the magnetic structures 60 and 80 may or may not have identical shapes and dimensions and the voids 78 are not necessarily of the same dimensions or shapes and may vary according to the precise arrangement of the magnetic blocks 72, 74 and 76 within the layers of magnetic blokes.

Additionally, because of the collimating property of the pole piece 132A and the field collimator 132E overlying the disk like and annular magnetic structures 60 and 80, respectively, the method of constructing the magnetic structure from magnetic blocks has the advantage that the precise arrangement of the magnetic blocks 72 and of the voids 78 is not critical and that many variations of the arrangement of the magnetic blocks are possible.

Furthermore, a feature of the preferred embodiment of the present invention disclosed hereinabove is that the precise shapes, and dimensions of the magnetic blocks within the permanent magnetic structures are not critical because of the collimating action of the collimators and the pole piece.

Moreover, it will be appreciated by those skilled in the art that, theoretically, the magnetic blocks used to construct the magnetic structure 80 or any other magnetic structure of the magnets of the present invention may be of any desired shape including completely irregular non-prismatic shapes, as long as they can be arranged to provide the required average remanence value and as long as the magnetization vectors of all the blocks are aligned parallel to the axis of symmetry of the volume of substantially homogenous magnetic field (such as, for example, the axis 110 of FIG. 5). However, practically, prismatic blocks having two parallel surfaces perpendicular to the magnetization vector of the block are preferred because they provide, among others, an easy way of performing the alignment of the magnetization vectors and may also improve the compactness of packing of the blocks between the yoke and the pole-piece or collimator in cases in which high values of average remanence are required. In certain cases, such as the case of prismatic blocks (not shown) having a regular hexagonal cross section in a plane perpendicular to the axis of symmetry of the collimator or pole-piece, it may be possible to pack the hexagonal blocks densely, with no substantial voids therebetween (except near the outer circumference of the magnetic structure).

It is noted that, while the precise arrangement of the magnetic blocks is not critical, preferably, two general conditions should be met. The first condition is that all of the magnetic blocks 72, 74 and 76 must be positioned within the nominal volume of the relevant magnetic structure. For example, the nominal volume of the annular magnetic structure 60 is defined as the annular volume enclosed between the second surface 134E of the field collimator 132E, the inner surface 108D of the prong 108B of the yoke 108 and the two concentric imaginary cylindrical surfaces 138E and 139E (FIG. 5). The cylindrical surfaces 138E and 139E which are represented by the two dashed lines labeled 138E and 1 39E in the cross sectional view of FIG. 5 are formed by extending the two concentric cylindrical surfaces 136E and 135E of the field collimator 132E towards the inner surface 108D until they intersect therewith. Thus, preferably, all of the magnetic material of the magnetic blocks 74 and 76 must be substantially within the boundaries of the nominal volume of the annular magnetic structure 60. However, it is noted that small deviations in which a small portions of the magnetic blocks 74 and 76 are disposed outside the boundaries of the nominal volume of the annular magnetic structure 60 may be possible if the resulting deviation from homogeneity of the magnetic field is within the specified desired values. Moreover, practically, larger deviations from the desired degree of homogeneity due to portions of some of the magnetic blocks 74 and/or 76 extending out of the boundaries of the nominal volume may still be compensated or corrected after the construction of the magnet is finished by applying passive and/or active shimming methods to the finished magnet. Such shimming methods are not the subject matter of the present invention and are well known in the art and will therefore not be disclosed hereinafter.

This condition should, preferably, be fulfilled for any of the other disk like or annular magnetic structures comprising the magnetic probe 101.

It is noted that deviations from homogeneity due to placement of a small portion of the magnetic material such as the magnetic blocks 74 and 76 outside of the boundary of the nominal volume 60 disclosed hereinabove may have to be compensated by active or passive shimming after the construction of the magnet is completed. This is also true for deviations caused by the placement of portions of magnetic material of any of the annular or disk-like magnetic structures outside their corresponding nominal volumes.

The second condition is that the ferromagnetic material comprising the collimators and pole-pieces should be far enough from saturation to adequately (within the desired design homogeneity values) result in a substantial isopotentiality of each of the pole-pieces and collimators despite the uneven distribution of the magnetic material (such as the magnetic blocks 72,74 and 76 or the like) within the magnetic structure underlying the corresponding pole-pieces and collimators.

Practically, the soft iron or other ferromagnetic material comprising the collimators and the pole-pieces does not have ideal ferromagnetic properties. Therefore, one or more of the pole-pieces or collimators may be found to deviate from isopotentiality. In such a situation, it may be necessary to use a different type of ferromagnetic material for constructing the pole-pieces and/or collimators such as, for example, a different type of commercially available soft iron or silicon-iron alloy having a different BH curve. Alternatively, the magnetic material (such as the magnetic blocks 72,74 and 76 or the like) within the magnetic structure underlying the corresponding pole-pieces and collimators may have to be redistributed to provide the required degree of isopotentiality. An additional alternative is to change the thickness of the collimator or pole-piece.

It is noted that, the passages 140 through which the tuning screws 12 pass are formed by suitably arranging the various magnetic blocks 72 around the tuning screws 12 prior to gluing or bonding of the magnetic blocks 72. The passages 140 may or may not have a uniform shape and may or may not have a uniform cross section.

The magnetic blocks 72, 74 and 76 are made from a permanently magnetized material such as a permanently magnetized FeNdB alloy, but can be also formed from any other suitable permanently magnetized material that can provide a sufficiently strong magnetic field within the imaging volume 110.

It is noted that, while the annular magnetic structures 20A, 20B, 20C, 20D, 20E, 30A, 30B, 30C, 30D and 30E of FIG. 2 are shown to be constructed as a single piece of permanently magnetized material, this embodiment may be expensive to manufacture. The method of construction of the permanent magnetic structures from relatively small discrete magnetic blocks is preferably used and has the advantage of making the construction of the magnetic probe simpler and more cost effective.

It is further noted that, preferably, the number of annular concentric magnetic structures included in each of the permanent magnetic assemblies 4A and 4B of FIG. 2 and the permanent magnetic assembly of 104B of FIG. 5 is between three and six annular concentric magnetic structures. However, a number of annular magnetic structures greater than six may also be used.

It is still further noted that, while in the preferred embodiment illustrated in FIG. 2 the polarity of the magnetic field of all of the annular magnetic structures within each of the permanent magnet assemblies 4A and 4B is identical, other different implementations may be constructed in which the polarity of the magnetic field is not identical for all of the annular magnetic structures comprising a permanent magnet assembly. However, the magnetic polarity of each of the pairs of corresponding angular magnetic structures, such as the pairs 20A and 30A, 20B and 30B, 20C and 30C, 20D and 30D, 20E and 30E is identical.

Figure 6:
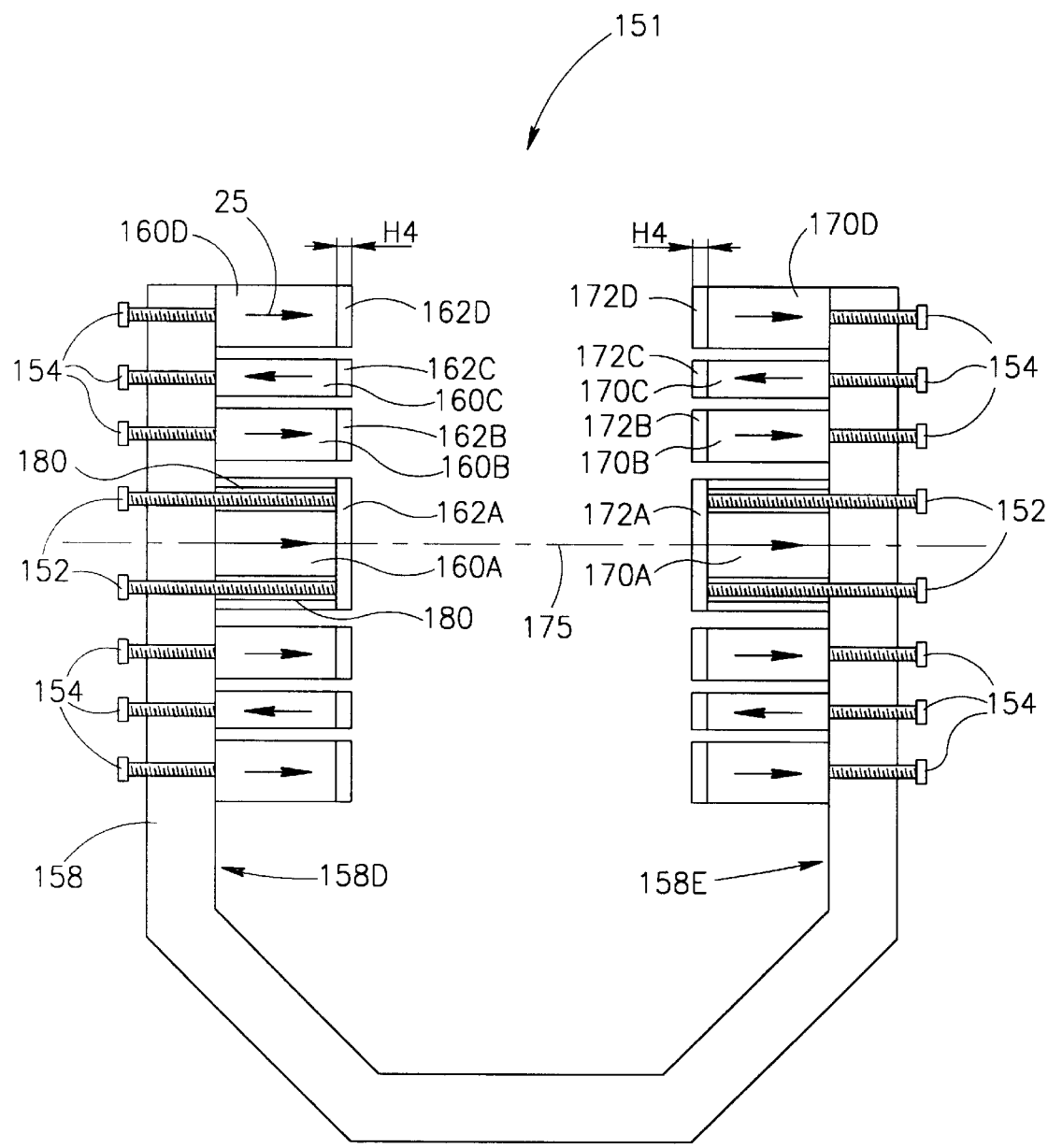
FIG. 6 is a schematic cross sectional view illustrating an open yoked magnetic probe having adjusting screws for fine adjustment of the permanent magnet assemblies, in accordance with a preferred embodiment of the present invention.

Reference is now made to FIG. 6 which is a schematic cross sectional view illustrating an open yoked magnetic probe having adjusting screws for fine adjustment of the permanent magnet assemblies, in accordance with a preferred embodiment of the present invention.

The magnetic probe 151 includes a yoke 158 having two parallel generally flat surfaces 158D and 158E. The magnetic probe 151 further includes magnetic structures 160A, 160B, 160C, and 160D attached to the surface 158D and magnetic structures 170A, 170B, 170C, and 170D attached to the surface 158E. The magnetic structures 160A and 170A are dislike in shape and have a plurality of passages 180 passing therethrough. The magnetic structures 160B, 160C and 160D are annular magnetic structures arranged on the surface 158D concentrically with respect to the axis 175 which is perpendicular to the parallel surfaces 158D and 158E. The magnetic structures 170B, 170O and 170D are annular magnetic structures arranged on the surface 158E concentrically with respect to the axis 175.

It is noted that the polarity of the magnetization of the magnetic structures 160A, 160B 160C, 160D, 170A, 170B, 170C, and 170D is represented by the arrows 25.

The magnetic probe 151 further includes field collimators 162B, 162C, 162D, 172B, 172C and 172D which are attached to the magnetic structures 160B, 160C, 160D, 170B, 170C and 170D, respectively, by epoxy glue (not shown) or by any other suitable glue or bonding material. The magnetic probe 151 further includes two pole pieces 162A and 172A which are magnetically attached to the magnetic structures 160A and 170A, respectively.

The precise alignment of the pole pieces 162A and 172A with respect to the axis 175 can be done by a adjusting any number of the screws 152 passing through passages 180 and rotatably screwed within the yoke 158. The precise alignment of the field collimators 162B, 162C, 162D, 172B, 172C and 172D with respect to the axis 175 can be done by a adjusting any number of the screws 154 which are rotatably screwed within the yoke 158. The precise number and arrangement of the screws 152 and 154 within the yoke 158 may vary.

It is noted that, in contrast with the magnetic probe 1 of FIG. 2, the thickness of the field collimators 162B, 162C, 162D, 172B, 172C and 172D represented by the double headed arrow H4 is equal to the thickness of the pole pieces 162A and 172A.

It is further noted that, in contrast with the magnetic probe 1 of FIG. 2, the polarity of magnetization of the magnetic structure 160C is opposite to the polarity of magnetization of the magnetic structures 160A, 160B and 160D. Similarly, the polarity of magnetization of the magnetic structure 170C is opposite to the polarity of magnetization of the magnetic structures 170A, 170B and 170D.

Figure 7:
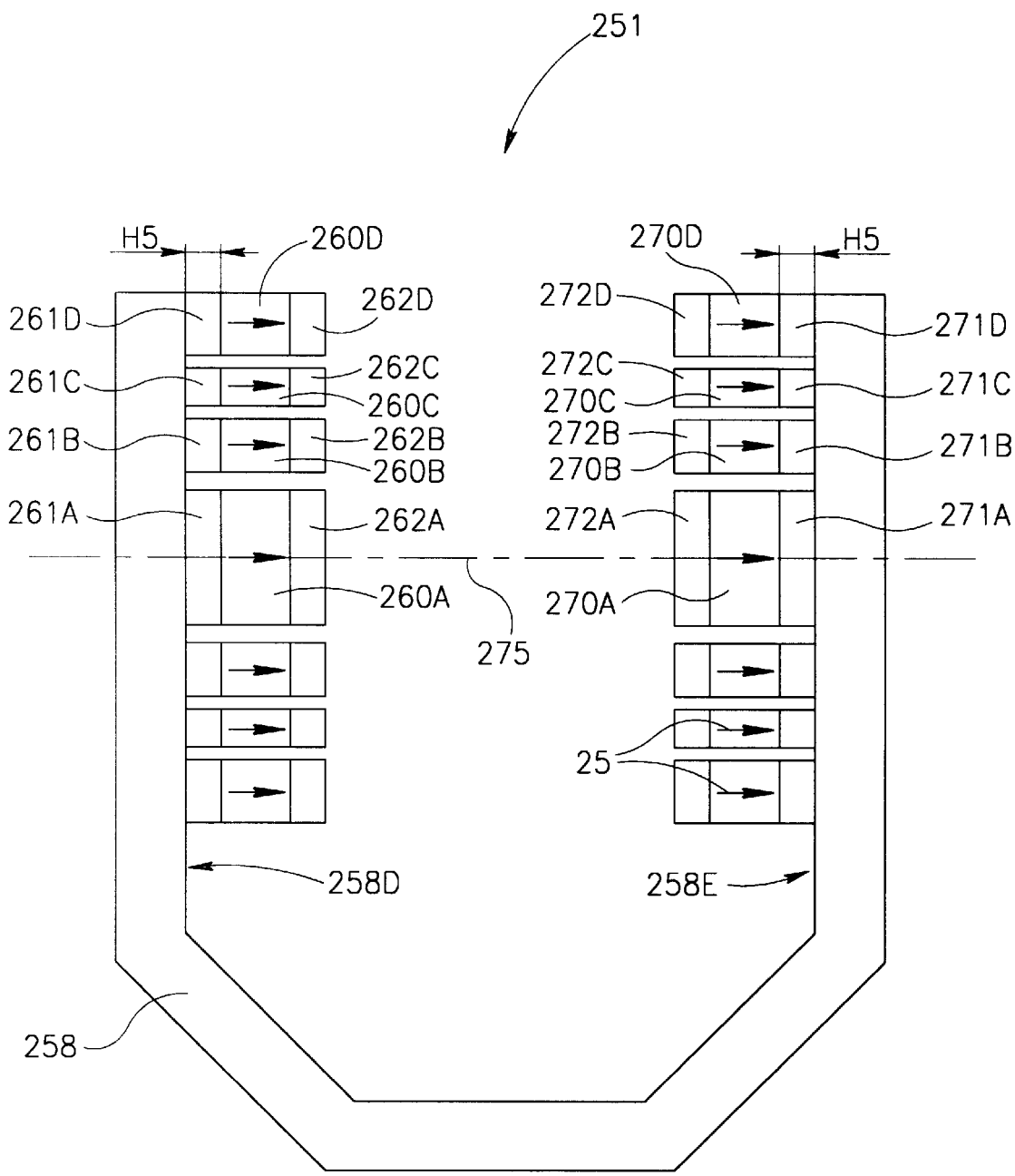
FIG. 7 is a schematic cross sectional view illustrating an open yoked magnetic probe having spacer members, in accordance with a preferred embodiment of the present invention.

Reference is now made to FIG. 7 which is a schematic cross sectional view illustrating an open yoked magnetic probe having spacer members, in accordance with a preferred embodiment of the present invention.

The magnetic probe 251 includes a yoke 258 having two parallel generally flat surfaces 258D and 258E. The magnetic probe 251 further includes magnetic structures 260A, 260B, 260C, and 260D which are attached to spacer members 261A, 261B, 261C and 261D, respectively. The spacer members 261A, 261B, 261C and 261D are attached the surface 258D. The magnetic probe 251 further includes magnetic structures 270A, 270B, 270C0 and 270D which are attached to spacer members 271A, 271B, 271C and 271D, respectively. The spacer members 271A, 271B, 271C and 271D are attached to the surface 258E.

The spacer members 261A, 261B, 261C, 261D, 271A, 271B, 271C and 271D are preferably made of soft iron or any other material having suitable ferromagnetic properties. The spacer members 261A, 261B, 261C, 261D, 271A, 271B, 271C and 271D serve to effectively extend the yoke 258 which reduces the amount of magnetic material needed for construction of the magnetic structures overlying the spacer members 261A, 261B, 261C, 261D, 271A, 271B 271C and 271D.

The magnetic structures 260A and 270A are disc-like in shape. The magnetic structures 260B, 260C and 260D are annular magnetic structures arranged on the surface 258D concentrically with respect to the axis 275 which is perpendicular to the parallel surfaces 258D and 258E. The magnetic structures 270B, 270C and 270D are annular magnetic structures arranged on the surface 258E concentrically with respect to the axis 275.

It is noted that the polarity of the magnetization of the magnetic structures 260A, 260B, 260C, 260D, 270A, 270B, 270C, and 270D is represented by the arrows 25.

The magnetic probe 251 further includes field collimators 262B, 262C, 262D, 272B, 272C and 172D which are attached to the magnetic structures 260B, 260C, 260D, 270B, 270C and 270D, respectively, by epoxy glue (not shown) or by any other suitable glue or bonding material. The magnetic probe 251 further includes two pole pieces 262A and 272A which are magnetically attached to the magnetic structures 260A and 270A, respectively.

The components of the magnetic probe 251 may be fixed with the pole pieces 262A and 272A fixedly attached to the magnetic structures 260A and 270A, respectively by epoxy glue or another suitable bonding material. Alternatively, the components of the magnetic probe 251 may be adjustable as disclosed hereinabove in which case the yoke 258 includes adjustable screws (not shown) for adjusting the alignment of the pole pieces 262A and 272A and/or the field collimators 262B, 262C, 262D, 272B, 272C and 272D.

It is noted that while the spacer members 261A, 261B, 261C, 261D, 271A, 271B, 271C and 271D of the magnetic probe 251 have rectangular cross-sections, other preferred embodiments of the magnetic probe of the present invention may be constructed in which at least some of the spacer members have other types of cross sections. For example, FIG. 8 to which reference in now briefly made, illustrates a magnetic probe 290 in which some of the spacer members have a trapezoidal cross section. The magnetic probe 290 of FIG. 8 is similar to the magnetic probe 251 of FIG. 7 except that the spacer members 263B and 273B have a trapezoidal cross section.

Figure 8:
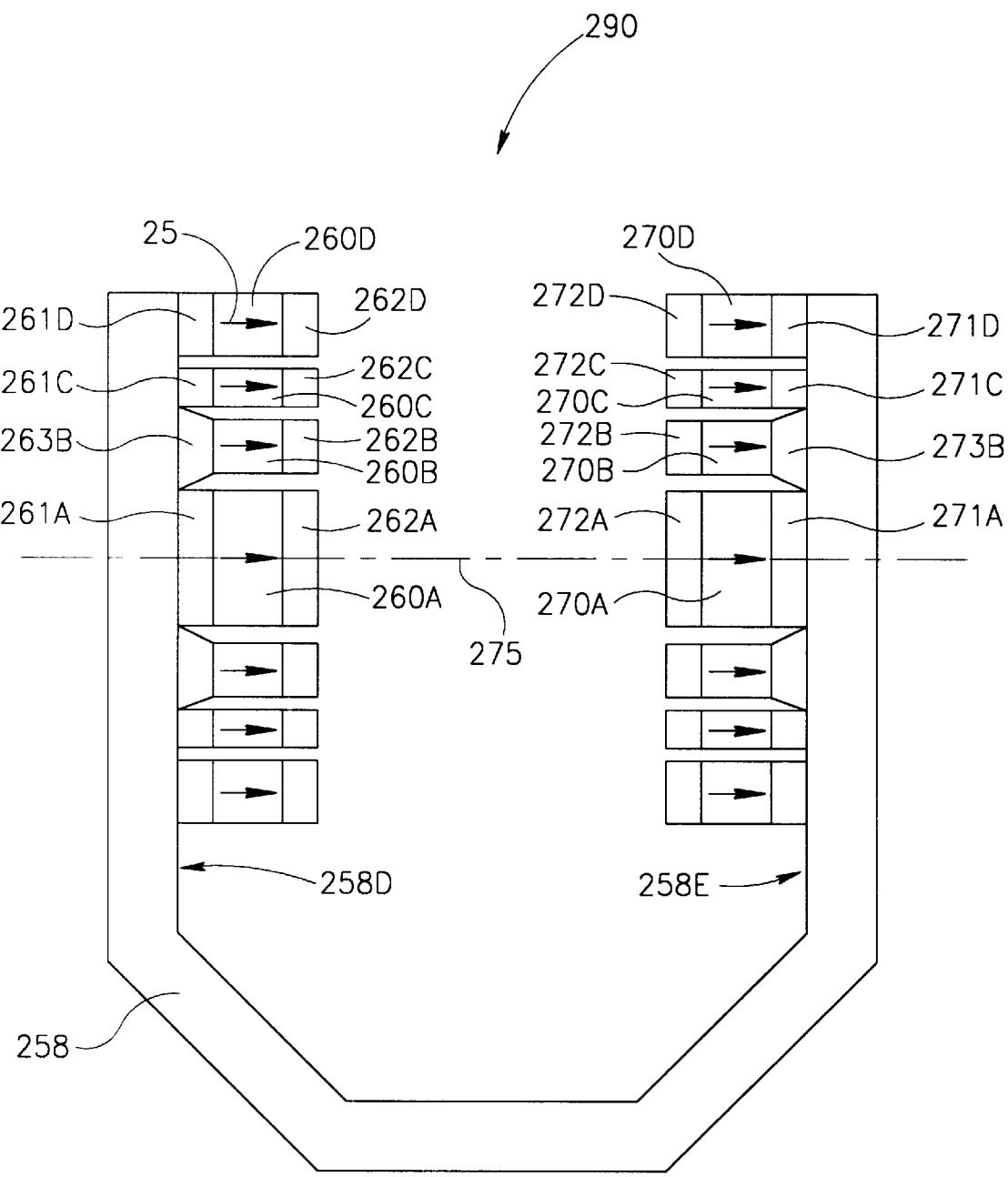
FIG. 8 is a schematic cross sectional view illustrating a magnetic probe in which some of the spacer members have a trapezoidal cross section.

It is noted that additional preferred embodiments of the magnetic probe of the present invention may be constructed in which at least some of the spacer members have different cross sectional shapes as long as opposed pairs of spacer members such as the opposed pairs 261A and 271A, 263B and 273B, 261C and 271C, and 261D and 271D of FIG. 8 have identical cross sectional shapes and are arranged as mirror images of each other spaced apart from each other along the axis 275 of the probe 290.

It is further noted that, while the spacer members 261A, 261B, 261C, 261D, 271A, 271B, 271C and 271D of the magnetic probe 251 (FIG. 7) all have the same thickness represented by the double headed arrows H5, other preferred embodiments of the magnetic probe of the present invention may be constructed in which at least some of the opposed pairs of spacer members disclosed hereinabove have different thickness values. For example, the spacer members 261A and 271A may be thicker than the remaining spacer members of the magnetic probe 251.

Figure 9:
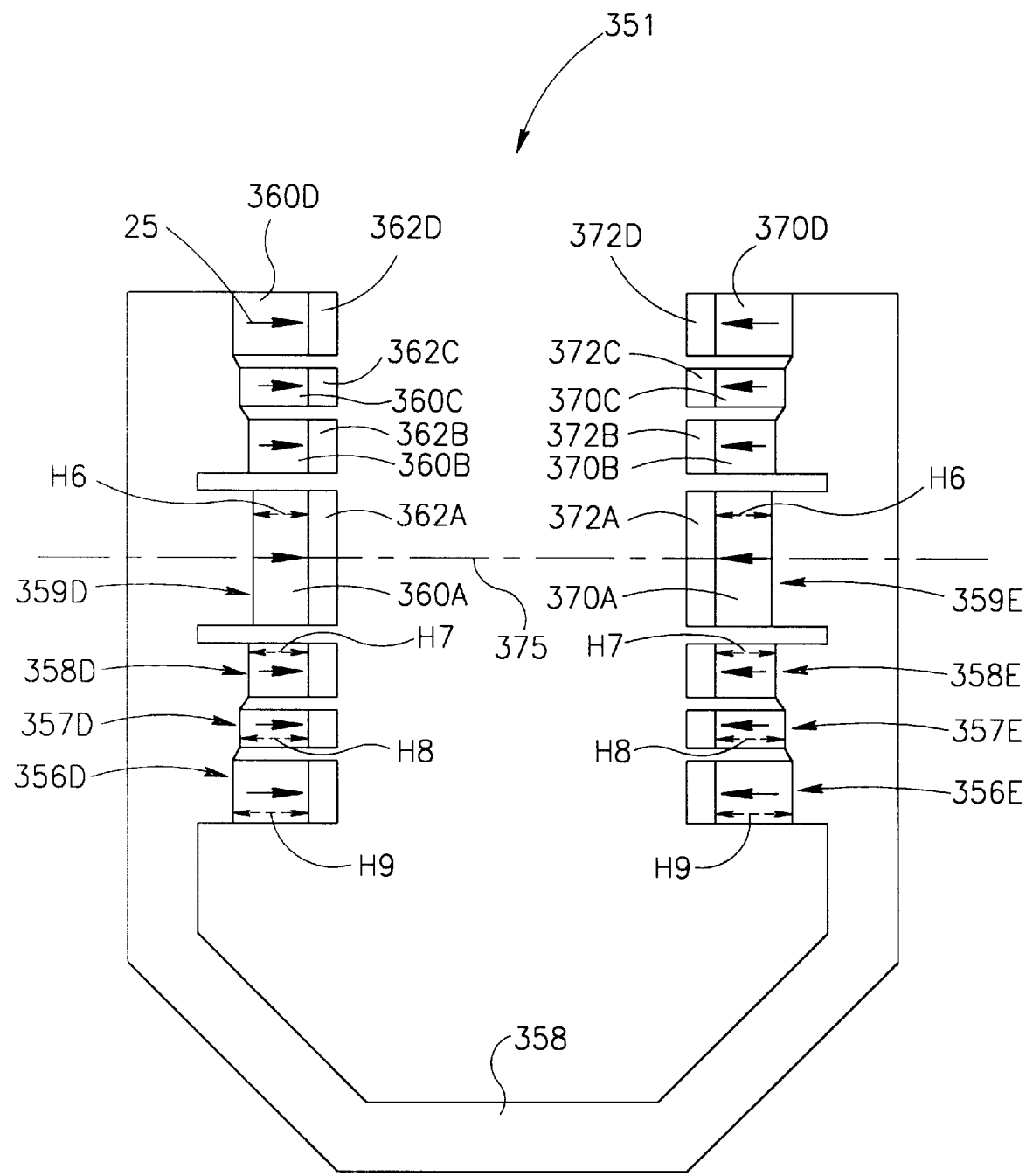
FIG. 9 is a schematic cross sectional view illustrating an open yoked magnetic probe including magnetic structures of different thickness, in accordance with a preferred embodiment of the present invention.

Reference is now made to FIG. 9 which is a schematic cross sectional view illustrating an open yoked magnetic probe including magnetic structures of different thickness, in accordance with a preferred embodiment of the present invention.

The magnetic probe 351 includes a yoke 358 having two opposing generally flat circular surfaces 359D and 359E and two opposing pluralities of generally flat annular surfaces 356D, 357D, 358D, and 356E, 357E and 358E. The surfaces 359D, 356D, 357D and 358D are concentric with respect to the axis 375 and surfaces 359E, 356F, 357E and 358E are also concentric with respect to the axis 375.

The planes (not shown) within which each of the surfaces 359D, 359E, 356D, 357D, 358D, 356E, 357E and 358E lie are perpendicular to the axis 375 and intersect the axis 375 at points which are all separated from each other along the axis 375.

The magnetic probe 351 further includes magnetic structures 360A, 360B, 360C, and 360D which are attached to the surfaces 359D, 358D, 357D and 356D, respectively. The magnetic probe 351 also includes the magnetic structures 370A, 370B, 370C, and 370D attached to the surfaces 359E, 358E, 357E and 356E, respectively. The magnetic structures 360A and 370A are disc-like in shape and the magnetic structures 360B, 360C and 360D are annular magnetic structures arranged concentrically with respect to the axis 375. The magnetic structures 370B, 370C and 370D are annular magnetic structures arranged concentrically with respect to the axis 375.

The polarity of the magnetization of the magnetic structures 360A, 360B, 360C, 360D, 370A, 370B, 370C, and 370D is represented by the arrows 25.

The magnetic probe 351 further includes field collimators 362B, 362C, 362D, 3728, 372C and 372D which are attached to the magnetic structures 360B, 360C, 360D, 370B, 370C and 370D, respectively, by epoxy glue (not shown) or by any other suitable glue or bonding material. The magnetic probe 351 further includes two pole pieces 362A and 372A which are attached to the magnetic structures 360A and 370A, respectively, by glue or by another suitable bonding material.

The magnetic probe 351 may include adjusting screws (not shown) arranged within the yoke 358 as disclosed hereinabove for adjusting the precise alignment of the pole pieces 362A and 372A and/or of the magnetic structures 360B, 360C, 360D, 370B, 370C and 370D. In such a case, the pole pieces 362A and 372A are not glued to the magnetic structures 360A and 370A, respectively, but are magnetically attached thereto, and the magnetic structures 360B, 360C, 360D, 370B, 370C and 370D are not glued to the surfaces 3580, 357D, 356D, 358E, 357E and 356E, respectively but are magnetically attached thereto.

It is noted that, the magnetic structures 360A, 360B, 360C and 360D have different thicknesses represented by the double headed arrows labeled H6, H7, H8, and H9, respectively, measured along a direction parallel to the axis 375. However, the thickness of each of the magnetic structures within the opposed pairs of magnetic structures 360A and 370A, 360B and 370B, 360C and 370C and 360D and 370D, is identical.

It is noted that, while the thicknesses H6, H7, H8 and H9 are all different from each other, other embodiments of the present invention are possible in which at least some of the thicknesses H6, H7, H8 and H9 are identical.

Figure 10:
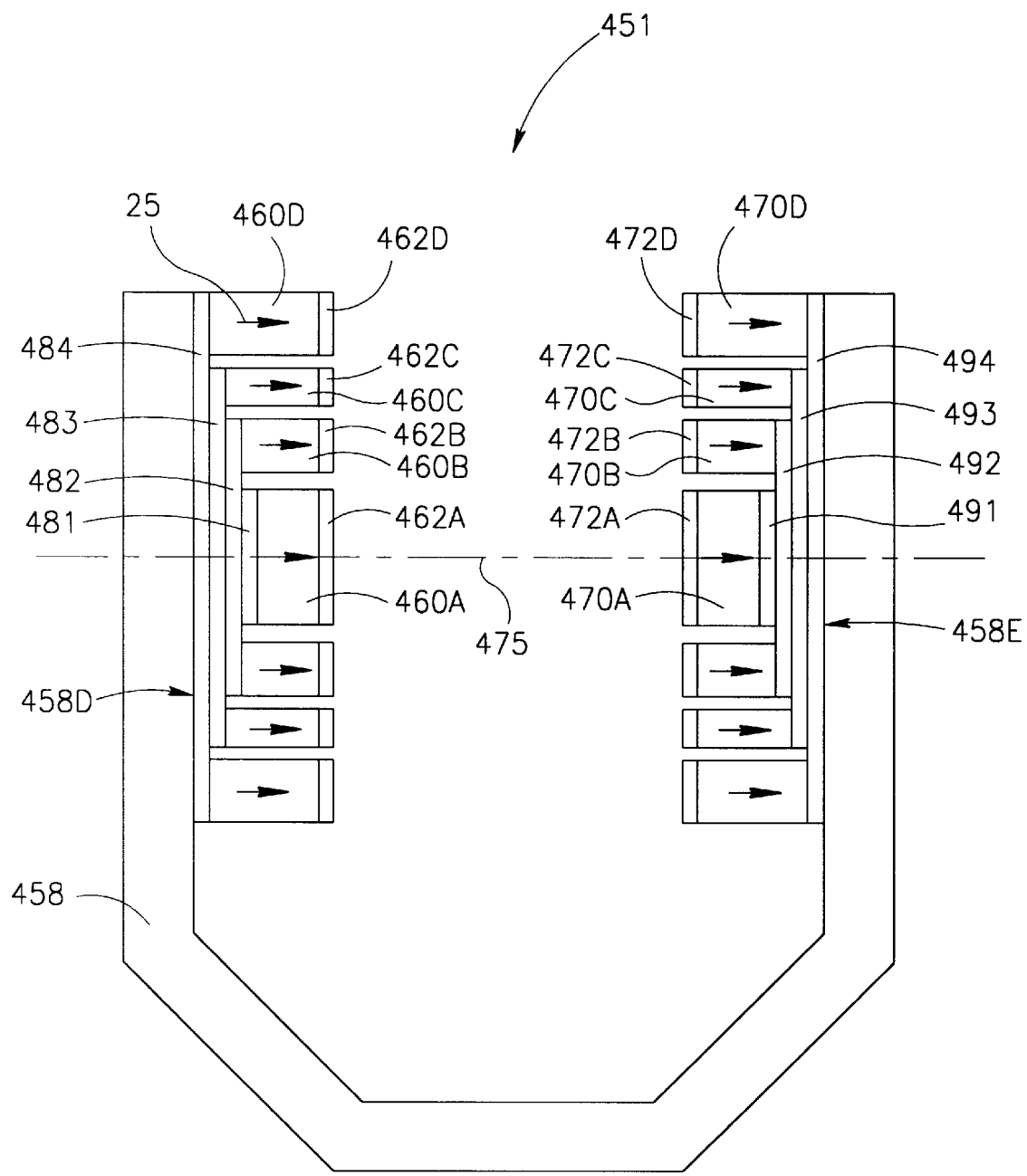
FIG. 10 is a schematic cross sectional view illustrating an open yoked magnetic probe having spacer members and including magnetic structures of different thickness, in accordance with a preferred embodiment of the present invention.

Reference is now made to FIG. 10 which is a schematic cross sectional view illustrating an open yoked magnetic probe having spacer members and including magnetic structures of different thickness, in accordance with a preferred embodiment of the present invention.

The magnetic probe 451 includes a yoke 458 having two parallel generally flat surfaces 458D and 458E. The magnetic probe 451 further includes a plurality of concentric disk like spacer members 481, 482, 483 and 484. The spacer members 481, 482, 483 and 484 are attached each to the other by epoxy glue (not shown) or by any other suitable bonding material. The spacer member 484 is also attached to the surface 458D of the yoke 458 by epoxy glue (not shown) or by any other suitable bonding material.

The magnetic probe 451 further includes another plurality of concentric disk like spacer members 491, 492, 493 and 494. The spacer members 491, 492, 493 and 494 are attached each to the other by epoxy glue (not shown) or by any other suitable bonding material. The spacer member 494 is also attached to the surface 458E of the yoke 458 by epoxy glue (not shown) or by any other suitable bonding material. The magnetic probe 451 further includes magnetic structures 460A, 460B, 460C, and 460D which are attached by epoxy glue (not shown) or by any other suitable bonding material or by magnetic attraction to the spacer members 481, 482, 483 and 484, respectively.

The magnetic probe 451 further includes the magnetic structures 470A, 470B, 470C, and 470D which are attached to spacer members 491, 492, 493 and 494, respectively as disclosed hereinabove.

The spacer members 481, 482, 483, 484, 491, 492, 493 and 494 are preferably made of soft iron or any other material having suitable ferromagnetic properties. The spacer members 481, 482, 483, 484, 491, 492, 493 and 494 serve to effectively extend the yoke 458 which reduces the amount of magnetic material needed for construction of the magnetic structures overlying the spacer members 481, 482, 483, 484, 491, 492, 493 and 494.

The magnetic structures 460A and 470A are disc-like in shape. The magnetic structures 460B, 460C and 460D are annular magnetic structures arranged concentrically with respect to the axis 475 which is perpendicular to the parallel surfaces 458D and 458E. The magnetic structures 470B, 470C and 470D are annular magnetic structures arranged concentrically with respect to the axis 475.

The polarity of the magnetization of the magnetic structures 460A, 460B, 460C, 460D, 470A, 470B, 470C, and 470D is represented by the arrows 25.

The magnetic probe 451 further includes field collimators 462B, 462C, 462D, 472B, 472C and 472D which are attached to the magnetic structures 460B, 460C, 460D, 470B, 470C and 470D, respectively, by epoxy glue (not shown) or by any other suitable glue or bonding material. The magnetic probe 451 further includes two pole pieces 462A and 472A which are magnetically attached to the magnetic structures 460A and 470A, respectively.

The components of the magnetic probe 451 may be fixed with the pole pieces 462A and 472A fixedly attached to the magnetic structures 460A and 470A, respectively by epoxy glue or another suitable bonding material. Alternatively, the components of the magnetic probe 451 may be adjustable, in which case the magnetic probe 451 includes adjustable screws (not shown) rotatably attached to and passing within the yoke 458 and suitably passing through the spacer members 481, 482, 483, 484, 491, 492, 493 and 494 for adjusting the alignment of the pole pieces 462A and 472A and/or the field collimators 462B, 462C, 462D, 472B, 472C and 472D. as disclosed hereinabove in detail.

Figure 11:
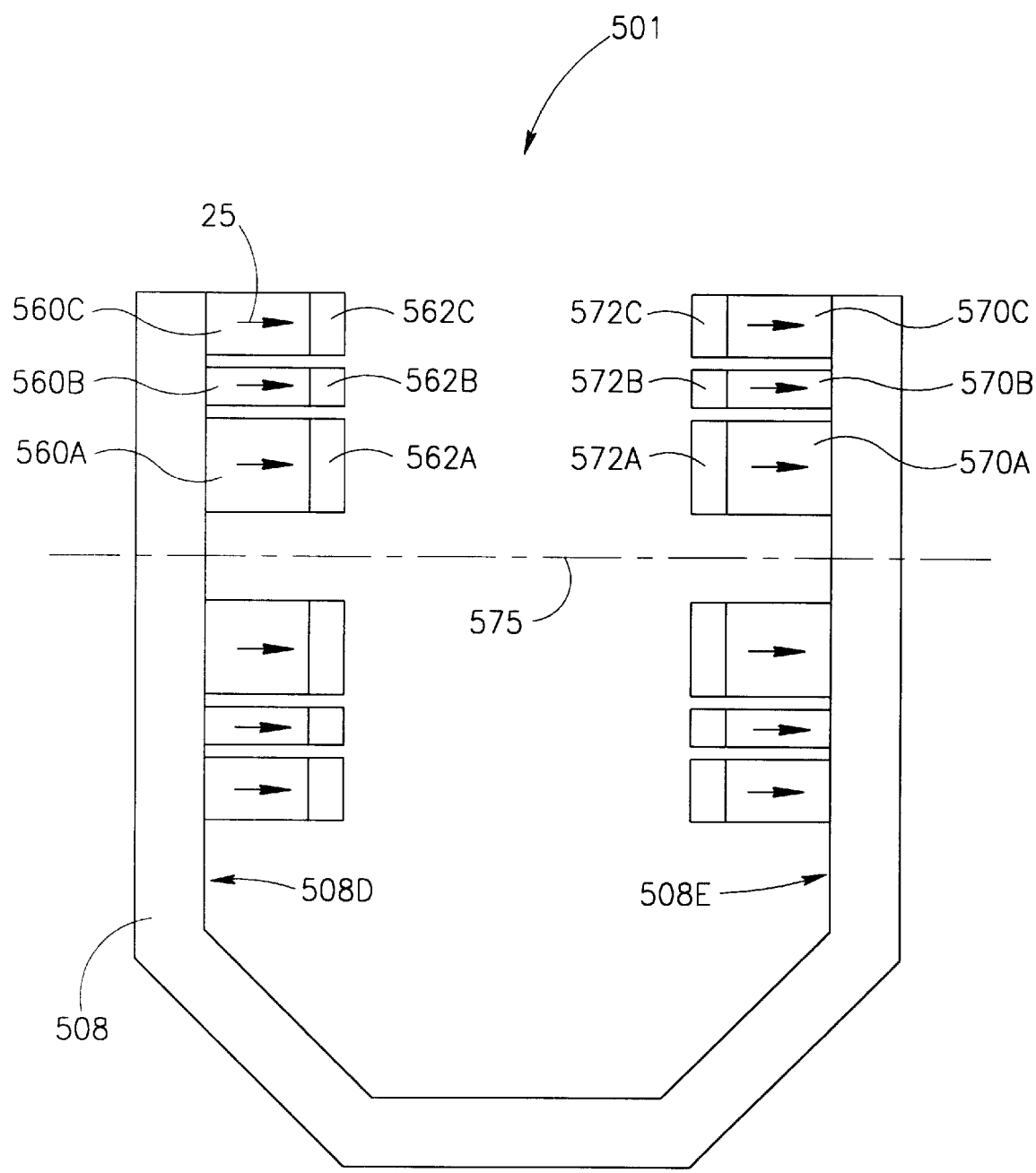
FIG. 11 is a schematic cross sectional view illustrating an open yoked magnetic probe having no pole pieces, in accordance with a preferred embodiment of the present invention.

Reference is now made to FIG. 11 which is a schematic cross sectional view illustrating an open yoked magnetic probe 501 having no pole pieces, in accordance with a preferred embodiment of the present invention.

The magnetic probe 501 includes a yoke 508 having two parallel generally flat surfaces 508D and 508E. The magnetic probe 501 further includes magnetic structures 560A, 560B and 560C attached to the surface 508D and magnetic structures 570A, 570B and 570C attached to the surface 508E. The magnetic structures 560A, 560B and 560C are annular magnetic structures arranged on the surface 508D concentrically with respect to the axis 575 which is perpendicular to the parallel surfaces 508D and 508E. The magnetic structures 570A, 570B and 570C are annular magnetic structures arranged on the surface 508E concentrically with respect to the axis 575.

The polarity of the magnetization of the magnetic structures 560A, 560B, 560C, 570A, 570B and 570C is represented by the arrows 25.

The magnetic probe 501 further includes field collimators 562A 562B, 162C, 572A, 572B and 572C which are attached to the magnetic structures 560A, 560B, 560C, 570A, 570B and 570C, respectively, by epoxy glue (not shown) or by any other suitable glue or bonding material.

It is noted that, while the components of the magnetic probe 501 are fixedly attached by glue to the yoke 508, other embodiments of the magnetic probe may be constructed which may have adjustable components and adjusting screws (not shown) as disclosed in detail hereinabove. In such preferred embodiments one or more of the annular magnetic structures 560A, 560B, 560C, 570A, 570B and 570C will not be glued to the yoke 508 but will be magnetically attached to enable realignment of the adjustable magnetic structures by suitably turning the adjusting screws.

Figure 12:
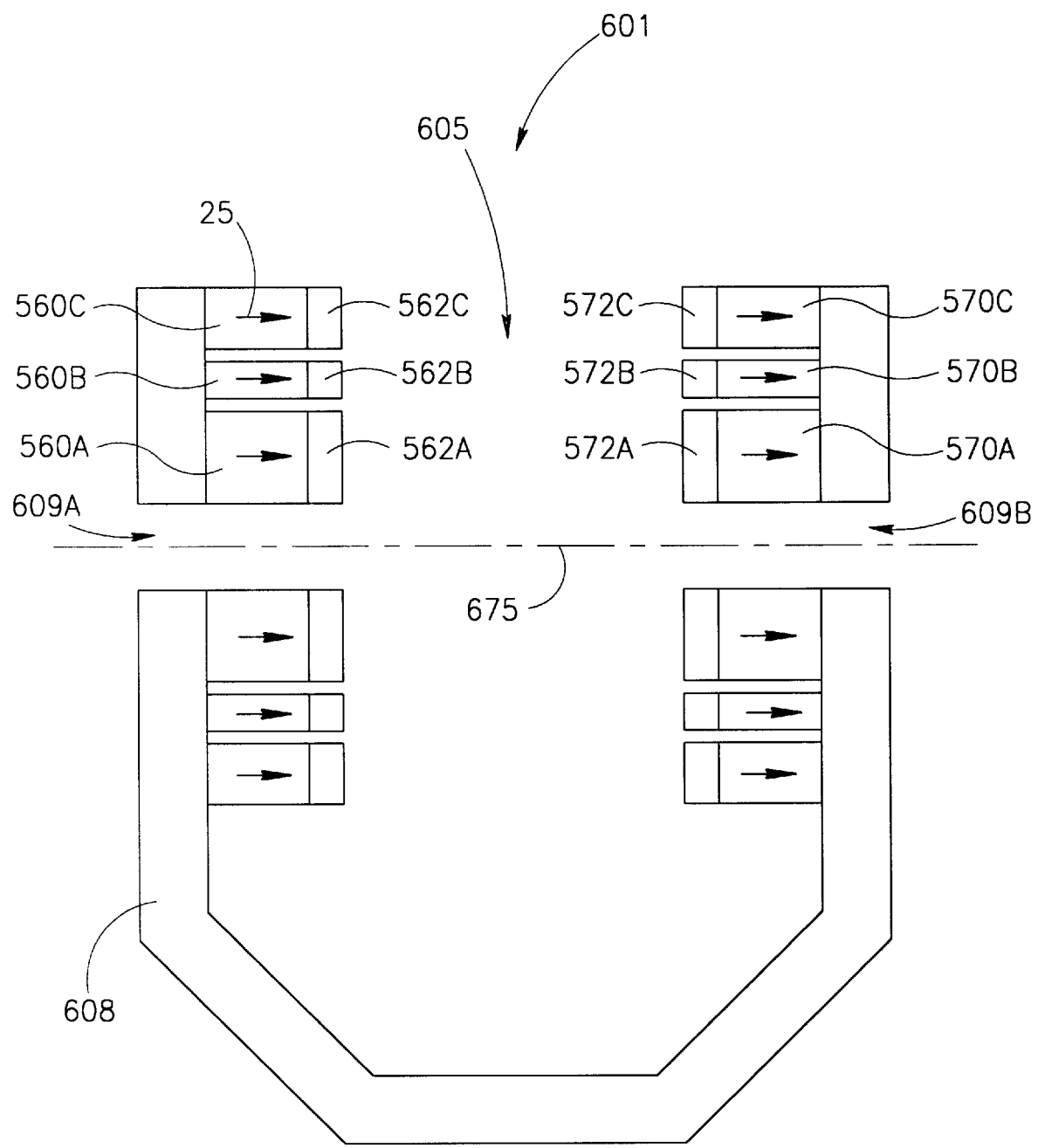
FIG. 12 is a schematic cross sectional view of a yoked magnetic probe having passages within the yoke structure.

It is further noted that it may be advantageous to provide the magnetic probe of the invention with additional openings for providing access to the imaged organ or body part (not shown). FIG. 12 to which reference is now briefly made is a schematic cross sectional view of a magnetic probe 601 having passages within the yoke. The magnetic probe 601 of FIG. 12 is similar to the magnetic probe 501 of FIG. 11 except that in contrast with the yoke 508 (FIG. 11), the yoke 608 of the magnetic probe 601 Of FIG. 12 has two passages 609A and 609B passing therethrough. The passages 609A and 609B may be used during imaging or surgery to insert a surgical instrument or any other instrument which may useful for imaging or surgical purposes into the space 605 within the probe 601.

It is noted that, while in the preferred embodiments disclosed hereinabove some or all of the various magnetic structures or the pole pieces could be tilted at an angle relative to the axis of the concentric annular magnetic structures, a single magnetic structure or a single pole piece could only be tilted as a whole unit. However under certain circumstances it may be desirable to have means for more finely tuning the alignment and homogeneity of the main magnetic field within the imaging volume of the magnetic probe.

Figure 13:
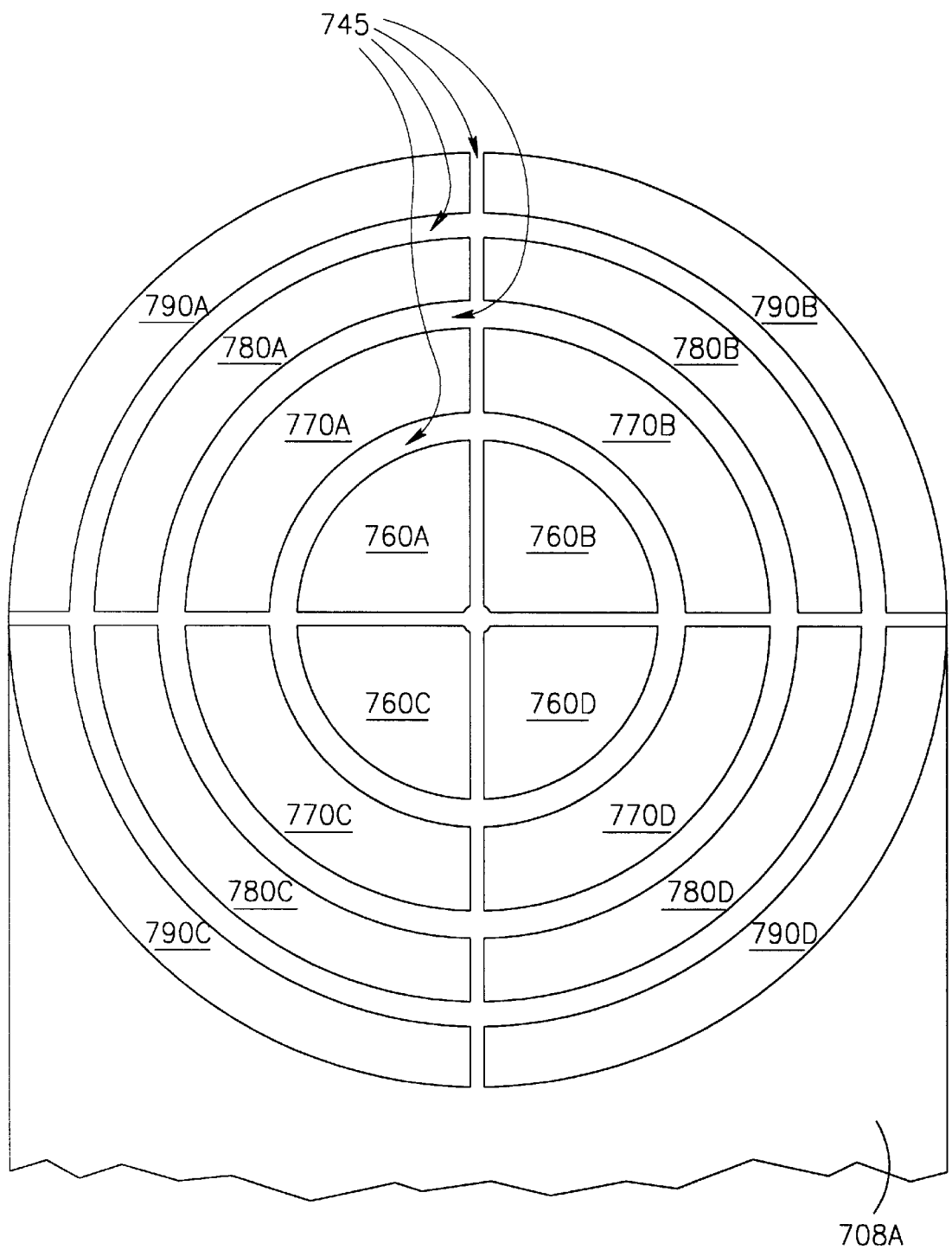
FIG. 13 is a side view illustrating part of a magnetic probe having multi-section concentric annular and disk like magnetic structures, in accordance with another preferred embodiment of the present invention.

Reference is now made, to FIG. 13 which is a side view illustrating part of a magnetic probe having multi-section concentric annular and disk like magnetic structures, in accordance with another preferred embodiment of the present invention.

FIG. 13 illustrates a prong 708A of a yoke (not shown in its entirety for the sake of clarity of illustration) of a magnetic probe (not shown). The prong 708A is viewed from its internal side which faces towards the imaging volume (not shown) of the magnetic probe. The side view illustrates 4 pole piece segments 760A, 760B, 760C and 760D and 12 arc-like field collimator segments 770A, 770B, 770C, 770D, 780A, 780B, 780C, 770D, 790A, 790B, 790C and 790D. The pole piece segments 760A, 760B, 760C and 760D and the arc-like field collimator segments 770A, 770B, 770C, 770D, 780A, 780B, 780C, 770D, 790A, 790B, 790C and 790D overlie magnetic structures (not shown) which are attached to the prong 708A of the yoke of the magnetic probe. The arrangement of the pole piece segments and the field collimator segments over the magnetic structures is similar to the arrangement shown in the magnetic probe 151 of FIG. 6. However, In contrast to the magnetic structure 160A and the pole piece 162A of FIG. 6 which are monolithic disc like structures, the pole piece of FIG. 13 is segmented into the four segments 760A, 760B, 760C and 760D.

Similarly, in contrast to the field collimators 162B. 162C and 162D of the magnetic probe 151 of FIG. 6 which are monolithic annular ferromagnetic structures, the field collimators of FIG. 13 are segmented into field collimator segments 770A, 770B, 770C, 770D, 780A, 780B, 780C, 770D, 790A, 790B, 790C and 790D as are the corresponding magnetic structures (not shown) underlying them.

The pole piece segments 760A, 7608, 760C and 760D, the field collimator segments 770A, 770B, 770C, 770D, 780A, 780B, 780C, 770D, 790A, 790B, 790C and 790D and the magnetic structures (not shown) underlying them are separated by gaps 745 reaching the surface of the yoke prong 708A.

The advantage of this preferred embodiment of the magnetic probe design is that each of the segments 760A, 760B, 760C and 760D and the segments 770A, 770B, 770C, 770D, 780A, 780B, 780C, 770D, 790A, 790B, 790C and 790D is individually adjustable by changing the orientation of the segment using a plurality of adjusting screws (not shown) which are adjustably attached to the prong 108A under each of the segments in a way similar to that of other adjusting screws disclosed hereinabove. Additionally, it is possible to adjust the amount of magnetic material underlying any of the above disclosed segments for performing adjustment or tuning of the homogeneity of the magnetic field within the imaging volume 10 (FIG. 2).

This may enable more precise tuning of the magnetic field alignment and other properties within the imaging volume (not shown).

It is noted that, while the preferred embodiment of FIG. 13 has sixteen segments per prong (thus, the magnetic probe has 32 segments altogether), the magnetic probe can also be constructed with other different numbers of segments. The number of segments is determined, inter alia, by the required degree of fine tuning and by practical considerations of price, and ease of construction.

It is further noted that each of the pole-pieces, collimators and the underlying magnetic structures may have a different number of segments. For example, in another preferred embodiment of the present invention the pole-piece (not shown) and it's underlying magnetic structure (not shown) may have 4 segments, the first collimator (not shown) and it's underlying magnetic structure (not shown) may have 8 segments and the second collimator (not shown) and it's underlying magnetic structure (not shown) may have 16 segments. Additionally, in accordance with yet another preferred embodiment of the present invention, some of the collimators (not shown) and their underlying magnetic structures (not shown) may be segmented while the remaining collimators (not shown) and their underlying magnetic structures (not shown) are non-segmented. Thus, many variations and permutations of the degree of segmentation and the number of segments of each of the pole-pieces, collimators and their underlying magnetic structures are possible, which are within the scope of the present invention.

It is still further noted that while the preferred embodiments illustrated in FIGS. 6–12 disclose magnetic structures which are each made as a solid monolithic structure, The magnetic structures of all of the preferred embodiments of FIGS. 6–12 can also be constructed from pluralities of magnetic blocks which are glued together as illustrated in FIG. 5 and disclosed in detail hereinabove.

It is still further noted that, in all the preferred embodiments of the magnetic probes disclosed hereinabove the surfaces of all the field collimators and pole pieces of a single prong of the yoke facing the imaging volume of the magnetic probe were coplanar to simplify and facilitate the optimization procedure, other preferred embodiments of the present invention are possible in which the surfaces of the field collimators and pole pieces facing the imaging volume of a single prong of the yoke of the magnetic probe, are not coplanar (For example, see the preferred embodiment of the magnet illustrated in FIG. 17 hereinbelow).

Further yet, while in all the preferred embodiments disclosed hereinabove all the field collimators have an identical thickness, other preferred embodiments of the present invention are possible in which at least some of the field collimators attached to the same prong of the yoke may have different values of thickness.

Furthermore, the thickness of all the field collimators and the pole pieces of the preferred embodiments disclosed hereinabove is selected such that the field collimators and pole pieces will not reach magnetic saturation at the level of magnetic field strength of the underlying corresponding magnetic structures.

It is noted that, in the present application the term thickness of a component is always used to denote the dimension of that component along an axis which is parallel to the axis passing between the center points of the two opposed concentric pluralities of field collimators of the magnetic probe.

Furthermore, while the magnetic structures of the preferred embodiments disclosed hereinabove are disclosed as including a single type of permanently magnetized material, it is also possible to use various types of hybrid magnetic designs which are within the scope and spirit of the present invention. For example, at least one of the opposing magnetic structure pairs of any of the preferred embodiments of the magnetic probe of the present invention such as the magnetic structure pair 20E and 30E of FIG. 2 may be constructed of at least two layers made of different permanently magnetized material. In a non limiting example one of the layers can be made of permanently magnetized FeNdB alloy and the other layer may be made of a samarium-cobalt permanent magnet.

Another non limiting example of a hybrid magnetic probe design is a magnetic probe in which different opposing complementary magnetic structure pairs may be made of different types of permanently magnetized material. For example, in the preferred embodiment of FIG. 2 the opposing complementary magnetic structure pair 20E and 30E may be made of a permanently magnetized samarium cobalt alloy while the other pairs of complementary opposing magnetic structures 20A and 30A, 20B and 30B. 20C and 30C and 20D and 30D may be made of permanently magnetized Fe NdB alloy. It will be appreciated by those skilled in the art that many such combinations and permutations of various magnetic materials and designs are possible which are within the scope of the present invention.

The method of determining the configuration of the permanent magnet assemblies of a magnetic probe in accordance with the present invention includes selecting the dimensions W (FIG. 2) and DW (FIG. 3) which are required for a particular desired implementation of a magnetic probe together with the desired main field strength within the imaging volume and calculating the specific dimensions and spacing of the various magnetic structures, field collimators and/or the pole pieces, additionally a filling factor is calculated for each of the annular magnetic structures underlying the various field collimators and the pole piece.

The filling factor is defined as the ratio of the total volume of the magnetic material included within the nominal volume defined for the annular magnetic structure as disclosed hereinabove and the total void volume included within that nominal volume. This filling factor can then be used to determine the number of the magnetic blocks and the arrangement of voids which are to be included within that particular permanent magnetic structure for which the specific filling ratio was determined.

The method of optimization of the magnetic probe design may also be varied to include other types of optimization methodology. For example, one may provide the structural dimensions of the magnetic probe and the required field strength within the imaging volume as the starting parameters and optimize the design for minimal cost. Other similar optimization methods can also be used.

Such methods of optimization and calculation of the dimensional parameters and filling ratio of the various components of the permanent magnet assemblies are well known in the art and will therefore not be further described.

Figure 14:
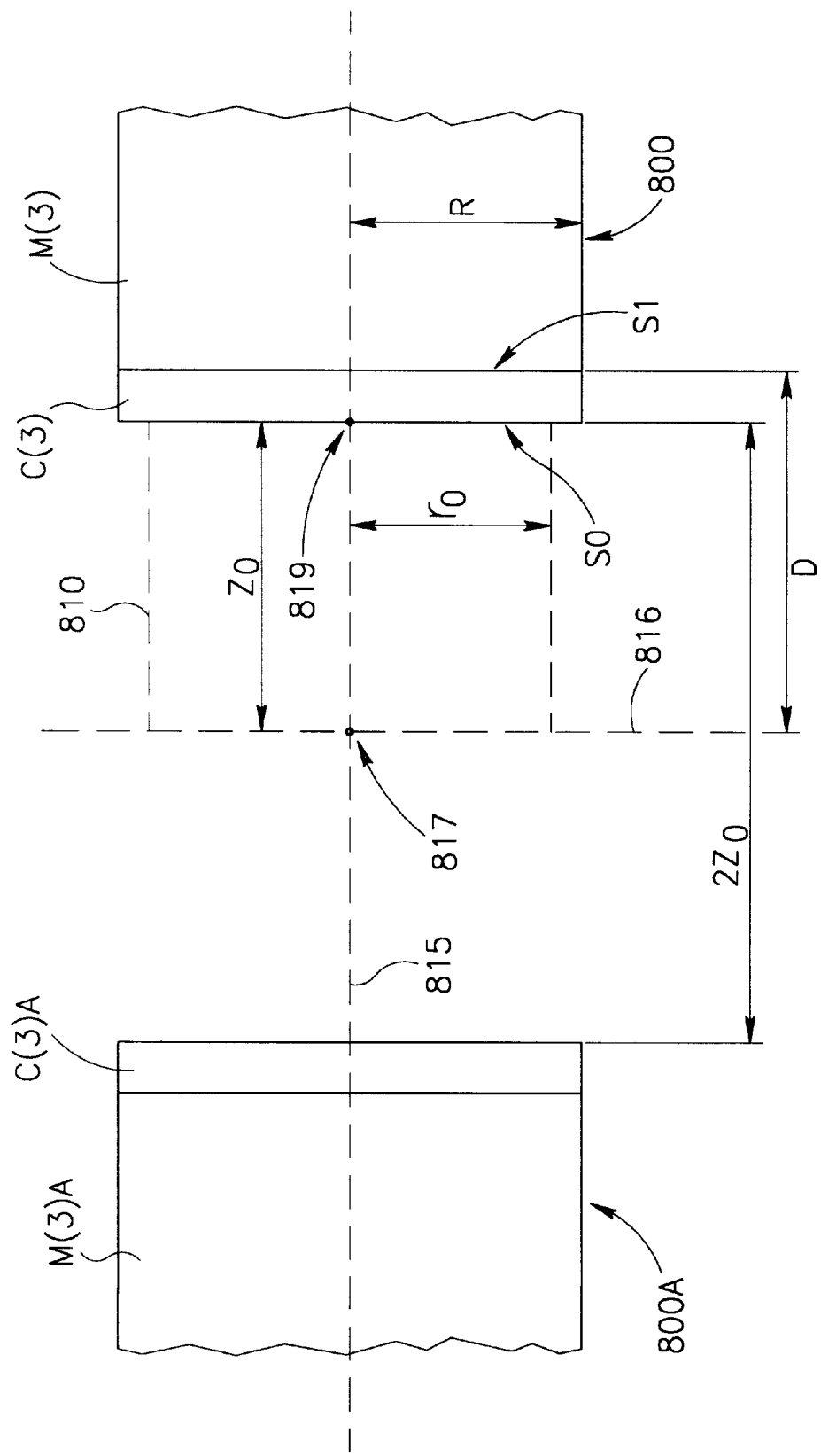
FIG. 14 is a schematic cross sectional diagram of a field generator useful in understanding the method for designing yoked magnets, in accordance with a preferred embodiment of the present invention.

Reference is now made to FIG. 14 which is a schematic cross sectional diagram of a field generator useful in understanding the method for designing open yoked magnets, in accordance with a preferred embodiment of the present invention.

FIG. 14 illustrates a cross section of two field generator structures 800 and 800A. The field generator 800 includes a pole-piece C(3) and a magnetic structure M(3). The field generator 800A includes a pole-piece C(3)A and a magnetic structure M(3)A. The pole-pieces C(3) and C(3)A are two parallel disc-like pole pieces made from a ferromagnetic material and separated from each other by a distance $2Z_0$ along a common axis 815. The axis 815 passes through the centers of the parallel pole pieces C(3) and C(3)A and is perpendicular to the surface S0 of the pole piece C(3). The axis 815 intersects the Z=0 plane (not shown) at intersection point 817. The surface S0 is on the side of the pole piece C(3) which faces the point 817. The surface S1 of the pole piece C(3) is parallel to the surface S0. The surface S1 intersects the axis 815 at the point 819.

The magnetic structures M(3) and M(3)A include magnetic material. As disclosed in detail hereinabove and illustrated in FIGS. 2, 4, 5, and 13, the magnetic material of the magnetic structures M(3) and M(3)A may be a monolithic disk or annular structure of solid magnetic material or may be a disk or annular structure constructed from blocks or segments of magnetic material held together by magnetic attraction or glued together by a suitable glue. The blocks of magnetic material may have voids (not shown) between them. The blocks or segments may also be embedded within a non-magnetic, non-ferromagnetic material such as epoxy, plastic or the like.

Let us consider a cylinder 810 extending from the surface S0 of the pole piece C(3). The axis of the cylinder 810 coincides with the axis 815. The cylinder 810 has a height $Z_0$ and a radius $r_0 \leq R$, where R is the radius of central pole piece C(3). The magnetic potential is constant on the surface S0 of the pole piece C(3) and must be zero in the z=0 plane due to symmetry conditions. The Z=0 plane of FIG. 14 is the mid-plane (not shown) disposed equidistantly from the pole pieces C(3) and C(3)A and is perpendicular to the plane of the page. The line 816 represents the intersection of the z=0 plane (not shown) with the plain of the page. The magnetic potential $\phi$ (r,z) inside the cylinder 810 is given by equation 1.

$$\phi(r, z) = -a_0 \frac{z}{Z_o} - \sum_{j=1}^{N} a_j I_0\left(\pi j \frac{r}{Z_o}\right) \sin\left(\frac{\pi j z}{Z_o}\right) \quad (1)$$

wherein $0 \leq r \leq r_0$ and $0 \leq z \leq z_0$,
and wherein $I_o(x)$ represents the modified Bessel function of x. The magnetic field H(r,z) corresponding to the magnetic potential $\phi$ (r,z) of equation 1 is given in equation 2.

$$H(r, z) = -\frac{\partial \phi}{\partial z} = \frac{a_0}{Z_o} + \sum_{j=1}^{N} \frac{\pi j}{Z_o} a_j I_0\left(\pi j \frac{r}{Z_o}\right) \cos\left(\frac{\pi j z}{Z_o}\right) \quad (2)$$

The expression $a_0/Z_0$ represents the fundamental (the zero order harmonic) magnetic field expansion term and the remaining terms of the right hand side of equation 2 represent the higher order harmonic terms of the magnetic field.

To bring the magnetic field within the cylinder 810 to a specified level of homogeneity, a certain number of the high order harmonics needs to be cancelled or compensated for.

The number N of harmonics which need to be canceled is determined by the radius R of central pole piece C(3). For larger R smaller N is needed. Practically, magnet design is a trade off between the radial dimension of central pole piece (and therefore the dimension of the whole magnet) and the complexity of the remaining structure of the additional annular collimators and magnetic structures which are needed to cancel the N harmonic terms including the coefficients $a_1, a_2, \ldots a_N$ of equation 2.

Typically, a magnet design for canceling 3–4 harmonic terms (N=3–4) is a reasonably practical starting choice for a yoked MRI open magnet having an FOV with magnetic field homogeneity of ±50 parts per million (ppm). However, other values of N may also be used depending, inter alia, on the desired size and homogeneity of the FOV, manufacturing tolerances and other factors.

In the prior art design methods disclosed hereinabove, permanent magnets are typically designed with two different. separately designed structures. First, a field generator is designed to achieve a specified field strength and subsequently a filtering structure including one or more magnetic elements and collimators is designed for canceling harmonics.

In contrast, the approach used by the design method of the present invention is to combine the field generator and the filtering structure into one multi-element structure in the initial design phase such that the initially designed multi-element structure generates a magnetic field with a specified homogeneity. The advantage of this approach is that it allows the design of relatively compact magnets.

This improved compactness stems from the fact that the initial design step takes into account the contribution of all the elements of the designed magnet to the desired magnetic field.

Figure 15:
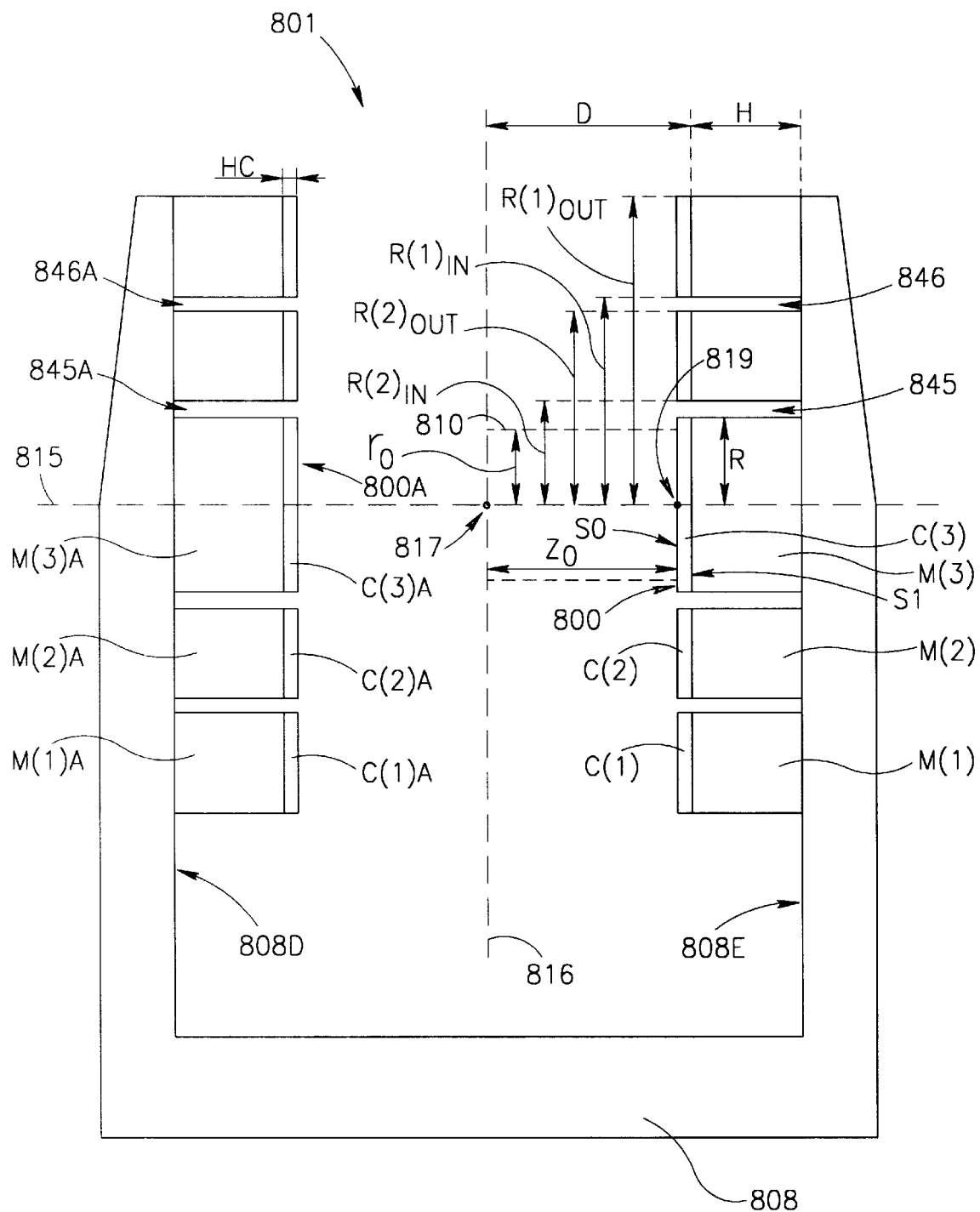
FIG. 15 is a schematic cross-sectional view of an exemplary preliminary magnet design useful as a starting design in the magnet design method of the present invention.

Reference is now made to FIG. 15 which is a schematic cross-sectional view of an exemplary preliminary magnet design useful as a starting design in the magnet design method of the present invention.

The starting magnet configuration 801 of FIG. 15 includes the two field generator structures 800 and 800A of FIG. 14. The starting magnet configuration 801 further includes an open ferromagnetic yoke 808 made of soft iron or another suitable ferromagnetic material. The yoke 808 has two parallel planar opposing surfaces 808E and 808D which are parallel to the Z=0 plane (not shown). The magnetic structure M(3) is disposed between the yoke surface 808E and the pole-piece C(3). The magnetic structure M(3)A is disposed between the yoke surface 808D and the pole-piece C(3)A.

The starting magnet configuration 801 further includes two complementary opposed pairs of concentric annular collimators C(2) and C(1), and C(2)A and C(1)A and two complimentary pairs of concentric annular magnetic structures M(2) and M(1), and M(2)A and M(1)A, also referred to as annular magnetic structures M(K) and M(K)A hereinafter, wherein K=1, 2, . . . N+1 is a position index denoting the position of the magnetic structure M(K) and the complementary magnetic structure M(K)A. For example, in the exemplary starting magnet design illustrated in FIG. 15, M(1) and M(1)A represent the outermost (K=1) pair of complementary magnetic structures surrounding the field generator structures 800 and 800A, respectively. M(2) and M(2)A represent the next (K=2) pair of complementary magnetic structures positioned inwardly of the magnetic structures M(1) and M(1)A. respectively. M(3) and M(3) represent the innermost magnetic structures of the field generator structures 800 and 800A, respectively.

The polarity of the magnetic field (not shown) of the two annular magnetic structures included in any selected pair of complementary annular (or disk-like) magnetic structures M(K) and M(K)A is identical and is oriented parallel to the axis 815. However, the polarity of different complementary pairs M(K) and M(K)A may be different from each other as disclosed hereinabove (for one, non-limiting exemplary embodiment see FIG. 6), It is noted that, while the polarity of the magnetic field of the magnetic structures M(3) and M(3)A may be initially set with the north poles(not shown) of both magnetic structures M(3) and M(3)A facing left or right, the polarity of the magnetic field of the remaining opposed magnetic structure pairs is determined by the steps of the design method as disclosed in detail hereinafter.

The magnetic structure M(2) is disposed between the yoke surface 808E and the collimator C(2) and the magnetic structures M(1) is disposed between the yoke surface 808E and the collimator C(1). The magnetic structure M(2)A is disposed between the yoke surface 808D and the collimator C(2)A and the magnetic structure M(1)A is disposed between the yoke surface 808D and the collimator C(1)A.

The thickness of each of the collimators C(2), C(1), C(2)A and C(1)A and of the pole pieces C(3) and C(3)A is denoted as $HC_K$ wherein K is the position index described hereinabove.

The thickness of each of the magnetic structures M(3), M(3)A, M(2), M(2)A, M(1) and M(1)A is denoted as $H_K$ wherein K is the position index described hereinabove.

In the initial step of design of the magnet of FIG. 15, the thickness $H_K$ of each of the pole pieces C(3) and C(3)A and of the collimators C(2), C(1), C(2)A and C(1)A in the direction of the axis 815 may be set to a common value of HC. Similarly, in the initial step of design of FIG. 15, each of the magnetic structures M(3), M(3)A, M(2), M(2)A, M(1) and M(1)A may be set to have an identical thickness H in the direction of the axis 815. For each collimator and pole piece, the distance between the Z=0 plane and the surface of the collimator or pole-piece which faces away from the Z=0 plane, is defined as $D_K$ and is given by the relation $D_K = Z_0 + HC_K$. Each of the pole-pieces and collimators is assigned an inner radius value $R(K)_{IN}$ and an outer radius value $R(K)_{out}$, wherein K=1, 2, . . . N+1 is the position index disclosed hereinabove.

In the non-limiting example illustrated in FIG. 15, the pole-piece M(3) has an inner radius (not shown) $R(3)_{IN}=0$ (since the pole-piece is a disk and not an annular structure) and an outer radius $R(3)_{out}=R$. The collimator C(2) has an inner radius $R(2)_{IN}$ and an outer radius $R(2)_{out}$ and the collimator C(1) has an inner radius $R(1)_{IN}$ and an outer radius $R(1)_{out}$.

The pole pieces M(3) and M(3)A are separated from the corresponding adjacent collimators C(2) and C(2)A by gaps 845 and 845A, respectively. The collimators C(2) and C(2)A are separated from the corresponding adjacent collimators C(1) and C(1)A by gaps 846 and 846A, respectively.

The radial dimension of the gaps 846 and 845 may or may not be identical. The radial dimension of the gaps 846A and 845A may or may not be identical. However, because of design symmetry considerations, the radial dimensions of opposing complementary gaps 845 and 845A are identical, and the radial dimensions the opposing complementary gaps 846 and 846A are identical. For example, the radial dimension of the gaps 845 and 845A equals $R(2)_{IN}-R$ and the radial dimension of the gaps 846 and 846A equals $R(1)_{IN}-R(2)_{OUT}$.

As disclosed in detail hereinabove and illustrated in FIGS. 2, 4, 5, and 13, the magnetic material of the magnetic structures M(3),M(2), M(1), M(3)A, M(2)A and M(1)A may be a monolithic annular structure of solid magnetic material or may be constructed from segments or blocks of magnetic material. The blocks of magnetic material may have voids (not shown) between them and may be held together by magnetic attraction or glued together by a suitable glue or alternatively may be embedded within a non-magnetic, non-ferromagnetic material such as epoxy, plastic or the like. The magnetic structures M(3), M(3)A, M(2), M(1), M(2)A and M(1)A may all have a similar construction. For example In accordance with a preferred embodiment of the present invention, the magnetic structures M(3), M(3)A, M(2), M(1), M(2)A and M(1)A may all be constructed from non-uniform blocks of magnetic material embedded in epoxy resin. Alternatively, In accordance with another preferred embodiment of the present invention, the magnetic structures M(3), M(3)A, M(2), M(1), M(2)A and M(1)A may all be constructed as a monolithic annular structure of magnetized material. Alternatively, one or more of the magnetic structures M(3), M(3)A, M(2), M(1), M(2)A and M(1)A may be constructed as a monolithic annular structure of magnetized material while the remaining magnetic structures may be constructed from non-uniform blocks of magnetic material embedded in epoxy resin.

It will be appreciated by those skilled in the art that theoretically, any combination of construction methods of any of the magnetic structures of the magnet 801 is possible. However, practical considerations may limit the choice of magnetic structure construction method as is disclosed in detail hereinafter.

It is noted that, while for clarity of illustration the preliminary magnet design 801 of FIG. 15 is illustrated as including only two complementary pairs of annular collimators C(2), C(1), C(2)A and C(1)A and two complementary pairs of corresponding annular magnetic structures M(2), M(1), M(2)A and M(1)A, designed to cancel two harmonics (N=2) of the magnetic field within the cylinder 810, this design is given by way of example only, and other starting designs may be used in the design method of the present invention which include additional complementary pairs of annular collimators and annular magnetic structures for canceling a larger number N of harmonics.

The calculations for canceling the high order harmonics are based on the fact that the coefficients $a_1, \ldots a_N$ of equations 1 and 2 are linear functions of the average magnetization values $J_K$ (K–1, 2, . . . N+1) of the corresponding complementary annular magnetic structures M(K) and M(K)A.

$$a_j = \sum_{K=1}^{N+1} M_{jK} J_K \quad (3)$$

Wherein j=1, . . . N and wherein the matrix $M_{jK}$ is generally defined for a magnet having K complementary magnetic structure pairs as:

$$\begin{bmatrix} m_{11} & m_{12} & m_{13} & \ldots \\ m_{21} & m_{22} & m_{23} & \ldots \\ m_{31} & m_{32} & m_{33} & \ldots \\ \ldots & \ldots & \ldots & \ldots \end{bmatrix}$$

Wherein $m_{11}$ is the contribution of the outermost magnetic structure having K=1 to the harmonic coefficient $a_1$ of equations 2 and 3, $m_{23}$ is the contribution of the magnetic structure having K=3 to the harmonic coefficient $a_2$, and so forth.

The matrix $M_{jK}$ depends only on the geometry of the magnet (the dimensions and positions of all the ferromagnetic collimators and pole pieces and of all the magnetic structures) and can be calculated only numerically, using finite element methods (FEM) or boundary element methods (BEM) which are well known in the art of magnet design and will therefore not be further discussed hereinafter.

If we want the variation of the magnetic field $\Delta H$ within the cylinder 810 to be smaller than $\epsilon H$ (For example, $\epsilon = 10^{-4} = 100$ ppm), equation 4 must be satisfied.

$$\frac{1}{a_0}\sum_{j=1}^{N}a_j\pi j I_0\left(\pi j\frac{r}{Z_o}\right)\cos\left(\frac{\pi j z}{Z_o}\right) \le \varepsilon \quad (4)$$

It is noted that, exact cancellation of $a_1, a_2, a_3 \ldots a_N$ is a sufficient but not necessary condition for the inequality of equation 4 to be satisfied. This implies that practically, the desired degree of homogeneity of the magnetic field within the FOV may be reached without necessarily fully canceling all the harmonics. For example, a design may be selected in which the $a_j$ values of are not zero but are made small enough such that the inequality of equation 4 is satisfied. Furthermore, a design may be selected in which some of the $a_j$ values may not be zero but may have opposed signs such that their sum has a value small enough that the inequality of equation 4 is satisfied. Practically, such solutions may be used to implement the desired magnet.

Figure 16:
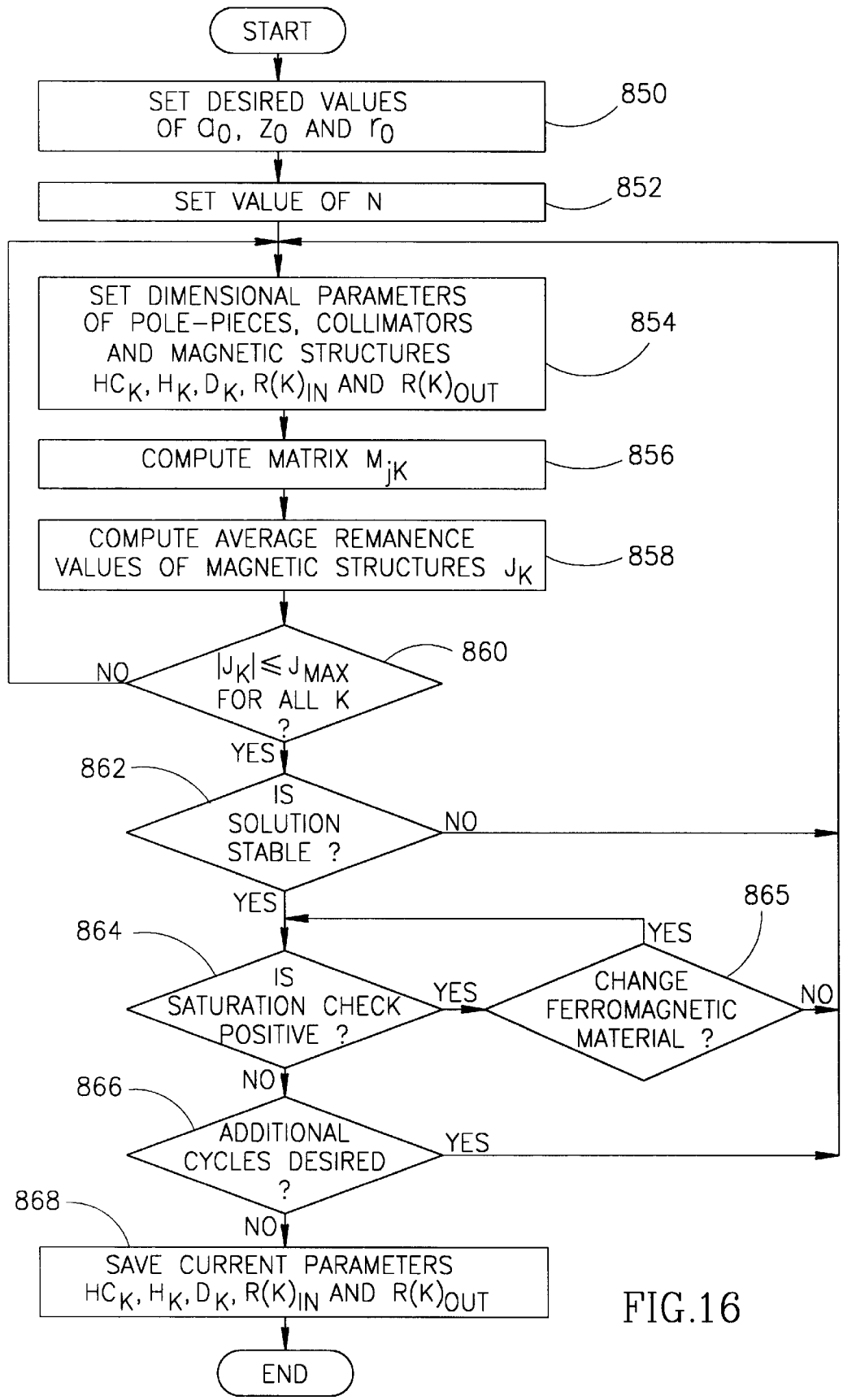
FIG. 16 is a schematic control flow diagram illustrating the steps of a method for magnet design, in accordance with a preferred embodiment of the present invention.

Reference is now made to FIG. 16 which is a schematic control flow diagram illustrating the steps of a method for magnet design, in accordance with a preferred embodiment of the present invention.

The method is preformed by a software program written by the inventors.

The method starts by setting the desired values of $a_0$, $z_0$ and $r_0$ (see FIG. 15) of the magnet to be designed (step 850). The designer then proceeds by setting the value of N which is the number of harmonics to be cancelled by the designed magnet (step 852). Practically, N=2–6, depending, inter alia, on the selected value of $z_0$, and on manufacturing tolerances.

The designer then proceeds by setting the initial dimensional parameters of the pole pieces, the collimators and the magnetic structures of the initial design. The parameters include the values of $HC_K$ which is the initial thickness of the pole pieces and the collimators having a position index K (FIG. 15). Practically, the value of $HC_K$ may be initially set as 2.5 centimeter for all the K pairs of pole pieces and collimators, but other different values may also be used. The parameters also include $H_K$ which represents the initial thickness of the K pairs of magnetic structures of the designed magnet. The initial value of $H_K$ may be uniformly set as $H_K$=H and is roughly estimated from the desired value of $a_0$, and from the remanence value $B_r$ of the magnetic material used for constructing the magnetic structures of the field generator (for example, M(3) and M(3)A of FIG. 15).

The parameters set in step 854 also include $D_K$ which may be initially set as the distance D between the point 817 and the point 819 on axis 815 (see FIGS. 14–15). The value of D may also be calculated from the given value $z_0$ and the set value of HC (D=$z_0$+HC).

The parameters set in step 854 also include the plurality of values representing the inner and the outer radii $R(K)_{IN}$ and $R(K)_{OUT}$, respectively, of the pole pieces and the collimators of the initial design of the magnet. For example, for the initial magnet design of FIG. 15, the plurality of inner and outer radii parameters set in step 854 includes $R(3)_{IN}$=0, $R(3)_{OUT}$=R, $R(2)_{IN}$, $R(2)_{OUT}$, $R(1)_{IN}$ and $R(1)_{OUT}$. Practically, a rule of thumb well known in the art is to set the pole-piece outer radius (assuming it is a disk-like pole-piece as illustrated in FIG. 15) as $R(N+1)_{OUT}$=R≧2$r_0$. ($r_0$ is the radius of the cylindrical FOV 810 of FIG. 14).

Typically, the initial guess for the inner and outer radii of the collimators is performed by using the formula $\Delta r_K$=$z_0$/K$\pi$ wherein $\Delta r_K$ represents the difference between the outer radius and the inner radius of the collimator or pole-piece having the position index K.

Additionally, the designer may use a value of 2.5 centimeter as the initial value of all the radial dimensions of the gaps between the collimators and for the radial dimension of the gap between the central pole piece and the innermost collimator. For example, all the gaps 845, 846, 845A and 846A of FIG. 15 may be initially set at a radial separation distance of 2.5 centimeter, but other different values may also be used, as long as the gaps are large enough so that the surfaces of the different collimators and the pole piece facing point 817 (FIG. 15) practically constitute separate isopotential surfaces.

The matrix $M_{jK}$ is now numerically calculated as disclosed hereinabove by using well known FEM or BEM methods.(step 856). The matrix $M_{jK}$ is now used to calculate the average remanence values $J_K$ of the magnetic structures as disclosed hereinabove (step 858). This calculation also determines the sign of the different $J_K$ values which defines the direction of magnetization of the magnetic material in the magnetic structure having a position index K relative to the direction of magnetization of the main magnetic field. A negative sign of a $J_K$ indicates that the direction of magnetization of the magnetic material in the magnetic structure having a position index K is directed at 180° to the direction of the main magnetic field.

The program now checks whether the absolute value of $J_K$ for all values of K is smaller or equal to $J_{MAX}$(step 860). $J_{MAX}$ is the highest value of remanence of any of the magnetic materials which are available for construction of the magnetic structures of the magnet.

If the absolute value of $J_K$ for one or more values of K is larger than $J_{MAX}$ this indicates that the initial magnet design cannot be practically constructed using the available magnetic materials and the program returns control to step 854 for resetting one or more of the initially set parameters HK, HCK, DK, $R(K)_{IN}$ and $R(K)_{OUT}$. For example, if one of the $J_K$ values is larger than the value of $J_{MAX}$, the corresponding magnetic structures having a position index K may be adjusted by increasing their thickness $H_K$ along the direction of axis 815, or by shortening the distance $D_K$.

It is noted that for some changes of the thickness $H_K$ of a particular magnetic structure or of the corresponding distance $D_K$ or combined changes of both $H_K$ and $D_K$, the design change may be implemented using different methods. One such method is implementation of changes by changing the yoke structure. For example, in FIG. 7, the ferromagnetic disk-like or annular structures 271A, 271B, 271C and 271D are inserted between the yoke 258 and the magnetic structures 270A, 270B, 270C and 270D. Alternatively, the opposing surfaces of the yoke itself may be modified as illustrated by the yoke 358 of FIG. 9. Additionally, a plurality of stacked disk-like or annular shaped ferromagnetic elements having different radii may be disposed between the plurality of magnetic structures and the yoke. For example, in FIG. 10, a plurality of the spacer members 481, 482, 483 and 484 are disposed between the yoke surfaces 458D and 458E and the plurality of the magnetic structures 460A, 460B, 460C, and 460D, respectively.

It is further noted that, typically, in order to maximize the obtainable magnetic field, the spacers inserted between the yoke surfaces and any magnetic structures or between any of the magnetic structures and the corresponding overlying collimator or pole-piece is made from a ferromagnetic structure having high magnetic permeability such as soft iron, silicon iron alloys, nickel-iron alloys or another suitable ferromagnetic material. However, spacers made from non-ferromagnetic material such as plastic or the like, may also be used. Such use of non-ferromagnetic spacers may be implemented if the resulting decrease in the average remanence values of the now modified magnetic structure (including the non-ferromagnetic spacer) is acceptable in view of the initially desired magnetic field intensity and homogeneity. Thus, while such designs including non-ferromagnetic spacers may not make full use of the maximally obtainable remanence value of the magnetic material, they may have advantages of ease of construction and manufacturing and in facilitating magnet alignment procedures.

If the absolute value of $J_K$ for all values of K is smaller than or equal to $J_{MAX}$, the program performs a stability check on the solution (step 862). The solution stability check is needed because the magnetic material(s) used in the construction of the magnet are supplied within certain tolerance values. For example, commercially available FeNdB magnets typically have remanence values which are within ±1% of the nominal remanence. Thus, practically, the real attainable remanence values may be $J_K \pm X$ %, wherein X is the manufacturing tolerance of the magnetic material.

The stability check may therefore be performed by computing the worst case value for each of the coefficients $a_j$. This may be done by computing for each of the different $J_K$ values a large set of possible values within the range $J_K+X$ % and $J_K-X$ % (in a non-limiting example, the range between $J_K+X$ % and $J_K-X$ % is divided to yield a set of 100 equally spaced values of $J_K$), and computing for each of the possible permutations of the computed $J_K$ values the resulting value of $a_j$ by substituting all the possible permutations of all of the computed sets of $J_K$ values in the equations for the coefficients $a_j$ represented by equation 3 hereinabove. All the resulting values of the coefficients $a_j$ are then processed to find a worst case value for each $a_j$. The worst case values of the coefficients $a_j$ are then substituted in equation 4, and the right hand side of the inequality 4 is computed.

If the left hand side of the inequality 4 is larger than $\epsilon$, the solution is unstable and control is transferred to step 854 for resetting one or more of the initially set parameters $H_K$, $HC_K$, $D_K$, $R(K)_{IN}$ and $R(K)_{OUT}$.

If the left hand side of the inequality 4 is smaller than or equal to $\epsilon$, the solution is stable and the program performs a saturation check (step 864). At this step a non-linear calculation is performed for the magnet using known parameters obtained from the known BH curves of the ferromagnetic material which is used for constructing the pole-pieces and collimators of the designed magnet. The results of the non-linear calculation are used to check whether any of the ferromagnetic material of the K pole-pieces and collimators has reached saturation. This type of non-linear saturation calculation is well known in the art, and may be performed by using off the shelf software programs such as, for example, the program ANSYS (Versions 5.1 or higher), commercially available from Swanson Analysis Systems Inc., PA, U.S.A.

Alternatively, the saturation check may be performed by assuming a constant permeability of the ferromagnetic material of which the collimator or pole-piece are made (approximating the BH curve as a linear curve) and checking saturation by calculating if the magnetic field within the ferromagnetic material is larger than a preset cutoff value. If the magnetic field within the ferromagnetic material is larger than the cutoff value, the ferromagnetic material of the collimator or pole-piece is considered to be saturated. This saturation check method using linear calculations is well known in the art and will therefore not be disclosed in detail hereinafter.

If any single one of the pole-pieces and collimators K is saturated, the saturation check is considered positive. The program checks if the user wishes to change the type of ferromagnetic material used in the yoke, pole-piece and collimators (step 865). If the user selects to change the type of ferromagnetic material, the program fetches the relevant parameters of the magnetic material selected by the user such as the parameters of the BH curve for the material (the steps for selecting the material type and fetching the parameters are not shown) and returns to step 864 for performing the stability check calculation using the newly fetched parameters of the selected ferromagnetic material.

If the user does not wish to select a new ferromagnetic material, control is transferred to step 854 for resetting one or more of the initially set parameters $H_K$, $HC_K$, $D_K$, $R(K)_{IN}$ and $R(K)_{OUT}$.

It is noted that the step 865 is optional and may be eliminated if the changing of the ferromagnetic material is not desired or not possible.

If none of the collimators or pole-pieces K are saturated, the user is asked if further optimization cycles are desired (step 866). If the designer requests further optimization cycles, the program transfers control to step 854 for performing additional optimization cycles. The further optimization cycles may be performed by changing one or more of the current values of the parameters $H_K$, $HC_K$, $D_K$, $R(K)_{IN}$ and $R(K)_{OUT}$. These additional cycles may be performed, inter alia, for reducing the overall dimensions of the magnet, for reducing the cost of the materials of the magnet, for reducing the complexity of manufacturing and/or tuning the magnet or for other optimization purposes as is known in the art. Dimension reducing cycles (not shown) may be performed automatically by the program, while other cycles such as manufacturing feasibility checking steps (not shown) may have to be performed non-automatically requiring human intervention.

For example, one may provide the structural dimensions of the magnet and the required field strength within the imaging volume as the starting parameters and optimize the design for reduced cost, reduced weight or the like. Other similar optimization methods can also be used. However, the basic steps of the method will include steps identical or similar to the steps 850 to 864 of FIG. 16 in which the basic desired values are set (steps 850 and 852), a starting set of dimensional parameters is set (step 854), the matrix $M_{jK}$ and the remanence values $J_K$ are computed (steps 856 and 858), the feasibility of practically implementing the computed $J_K$ values is checked (step 860), the solution stability is checked (step 862) and a saturation check for the ferromagnetic collimators and pole piece is performed (step 864). Additional cycles may then be performed for improving the design with respect to cost, weight or other magnet parameters as is known in the art.

If the current magnet design is deemed acceptable by the user such that no further cycles are desired, the program saves the current parameters $H_K$, $HC_K$, $D_K$, $R(K)_{IN}$ and $R(K)_{OUT}$ and $J_K$ (step 868) and ends. The program may also provide a hardcopy printout of the design (step not shown) or an electronic copy (step not shown) such as a data file stored on a magnetic medium or on any other type of storage medium of a fixed or removable type, such as a magnetic, optical, opto-magnetic or holographic storage medium. The program may also provide a symbolic representation of the solution on a display device such as the display of the computer used to run the program. The symbolic representation may include graphic data representing the magnet design and/or alphanumeric data including numbers, characters and other symbols representing the numerical values of the magnet component's parameters such as $H_K$. $HC_K$, $D_K$, $R(K)_{IN}$ and $R(K)_{OUT}$ and $J_K$.

It is noted that, while the first guess of the dimensions of the pole-piece of the magnets of the present invention assumes that the pole-piece and the corresponding underlying magnetic structure are disk-like structures, the designer may choose at later of the iteration cycles to modify the pole-piece and the underlying magnetic structure disposed between the pole-piece and the yoke into an annular pole-piece and an corresponding annular magnetic structure, respectively. This is done by changing the parameter $R(N+1)_{IN}$ from zero to a non-zero value. For example, the magnetic structures 70A and 56A of FIG. 11 are annular.

Figure 17:
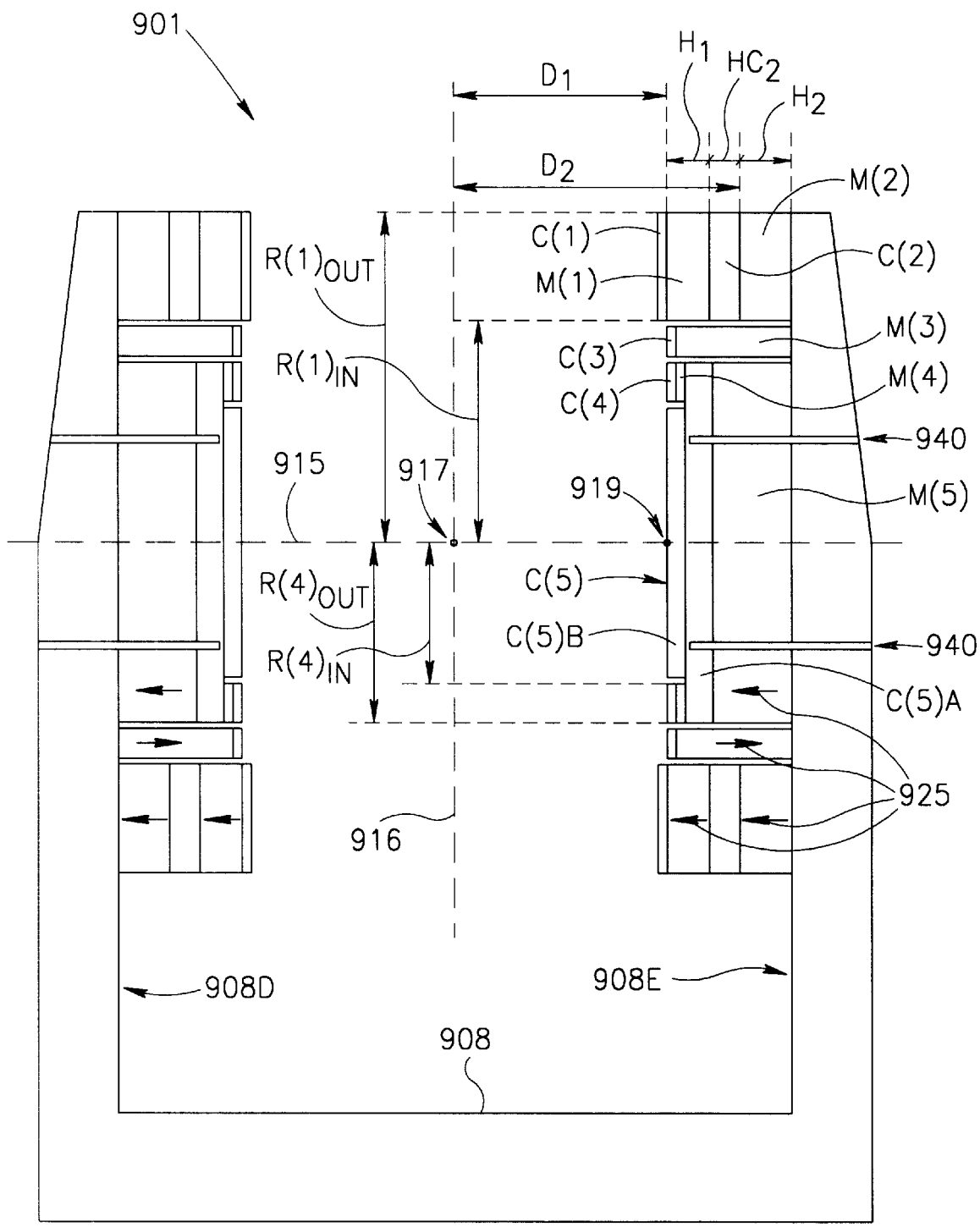
FIG. 17 is a schematic cross-sectional view illustrating a yoked open MRI magnet designed by the design method of FIG. 16, in accordance with another preferred embodiment of the present invention.

Reference is now made to FIG. 17 which is a schematic cross-sectional view illustrating a yoked open MRI magnet designed by the design method of FIG. 16, in accordance with another preferred embodiment of the present invention.

The magnet 901 includes a ferromagnetic yoke 908 similar to the yoke 808 of FIG. 15 and made from soft iron. The yoke 908 has two parallel flat surfaces 908E and 908D. It is noted that, because of the symmetry of the design, and for the sake of simplicity and clarity of illustration, only the parts of the right hand side of the illustrated magnet 901 are described and assigned reference numerals. The parts of the left hand side of the 901 magnet are dimensionally a mirror image of the corresponding parts on the right hand side of the illustration. It should be noted though that, as disclosed in detail hereinabove, the direction of magnetization of the magnetic material of the two magnetic structures within any of the pairs of opposed complementary magnetic structures is identical. However, different pairs of magnetic structures may have non identical magnetization directions as is disclosed hereinafter.

The right hand side of the magnet 901 includes a pole piece C(5) which includes two disk-like members made of soft iron C(5)A and C(5)B and a magnetic structure M(5) disposed between the yoke surface 908E and the disk-like member C(5)A of the pole-piece C(5). The axis 915 passes through the center of the pole-piece C(5). The line 916 represents the line of intersection of the Z=0 plane (not shown) with the plane of the page. The Z=0 plane is the mid-plane which is parallel to and equidistant from the yoke surfaces 908E and 908D. The right hand side of the magnet 901 also includes four annular collimators C(1), c(2), C(3) and C(4) which are concentric around the axis 915 and are generally parallel to the plane of the yoke surfaces 908E and 908D. The four annular collimators C(1), c(2), C(3) and C(4) are made from soft iron. The right hand side of the magnet 901 also includes four magnetic structures M(1), M(2), M(3) and M(4). The magnetic structure M(3) is disposed between the yoke surface 908E and the disk-like member C(3). The magnetic structure M(2) is disposed between the yoke surface 90BE and the annular collimator C(2). The magnetic structure M(1) is disposed between the annular collimator C(2) and the annular collimator C(1). The magnetic structure M(4) is disposed between the annular collimator C(4) and the disk-like member C(5)A of the pole-piece C(5).

The yoke 908, the magnetic structure M(5) and the disk like member C(5)A have passages 940 passing therethrough for passing adjusting screws (not shown) for adjusting the angle of the pole-piece C(5) relative to the surface 908E as disclosed hereinabove in detail and illustrated in FIGS. 2–4.

The directions of the magnetization vectors of the magnetic material of the magnetic structures M(1), M(2), M(3) and M(5) are shown by the arrows 925. The direction of the magnetization vector of the magnetic material of the magnetic structure M(4) is identical to the direction of magnetization vectors of the magnetic material of the magnetic structures M(1), M(2), and M(5) (for the sake of clarity of illustration this direction arrow is not shown). It is noted that the direction of magnetization vector of the magnetic material within the magnetic structure M(3) is opposed by 180° to the direction of magnetization vectors of the magnetic material of the magnetic structures M(1), M(2), M(4) and M(5). It is noted that the length of the arrows 925 is an arbitrarily chosen length and does not represent the magnitude of the magnetization vectors of the magnetic material of the magnetic structures M(1), M(2), M(3) and M(5).

It is noted that the annular collimators C(1) and C(2) and the magnetic structures M(1) and M(2) all have identical inner radii $R(1)_{IN}$ and identical outer radii $R(1)_{OUT}$. Thus, the annular structures C(1), C(2), M(1) and M(2) are stacked as illustrated. It is noted that, while the annular collimators C(1) and C(2) and the magnetic structures M(1) and M(2) have identical overlapping cross-sectional areas in a plane parallel to the surfaces 908E and 908D, the parameters $D_1$ and $D_2$ are different from each other, the collimator thickness parameters $HC_1$ and $HC_2$ are different from each other, and the magnetic structure thickness parameters $H_1$ and $H_2$ are different from each other.

Initially, the original starting design for the magnet included one annular collimator (not shown) and one magnetic structure (not shown) which together occupied an annular volume equal to the annular volumes of the annular structures C(1), C(2), M(1) and M(2). During the iteration cycles when the structure of the magnet is being optimized for cost of the magnetic materials, the cost of the initially planned magnetic structure was found to be prohibitively expensive, and the design parameters were changed to specify the annular collimator C(2), and the magnetic structures M(1) and M(2). This significantly reduced the amount of magnetic material required for construction of the magnet 901 with a concomitant reduction in manufacturing cost.

It is noted that while the annular collimator C(4) and the annular magnetic structure M(4) have an outer radius $R(4)_{OUT}$ which is identical to the outer radii of the disk-like member C(5)A and the magnetic structure M(5), the inner radius $R(4)_{IN}$ of the annular collimator C(4) and the annular magnetic structure M(4) is different than the inner radius $R(5)_{IN}=0$ of the disk-like member C(5)A and the magnetic structure M(5).

It is noted that because the yoke structure of all the preferred embodiments of the present application is open, it is asymmetrical. Such asymmetry results in an inhomogeneity in the magnetic field of the magnet. In order to correct this inhomogeneity, it may be necessary to change the angle of the pole-piece or one or more of the collimators of a magnet. This may be achieved by using adjusting screws. For example the adjusting screws 12 of FIG. 12 may be used for change the angle of the pole-piece 22A to compensate for the magnetic field inhomogeneity.

Another method which may be used to correct the magnetic field inhomogeneity introduced by the open yoke structure makes use of the segmented nature of the magnetic material used in some of the magnets of the present invention. Turning briefly to FIG. 13, the magnetic structures (not shown) underlying the collimator segments 770A, 780A, 790A, 770B, 780B. 790B, 770C, 780C, 790C, 770D, 780D and 790D and the pole-piece segments 760A, 760B, 760C and 760D may be constructed from magnetic material having pre-calculated different average remanence values. Thus The magnetic structures underlying the collimator segments 770A, 780A, 790A, 770B, 780B, 790B and the pole-piece segments 760A and 760B may be constructed to have a higher average remanence than the average remanence of the magnetic structures underlying the collimator segments 770C, 780C, 790C, 770D, 780D, 790D and the pole-piece segments 760C and 760D. It is noted that higher numbers of segments of separate magnetic structures (not shown) underlying separate collimator segments (not shown) may be used in order to enable finer tuning of the correction of the field inhomogeneity. However, limits on the number of usable segments may be practically imposed by cost and complexity of construction.

Figure 18:
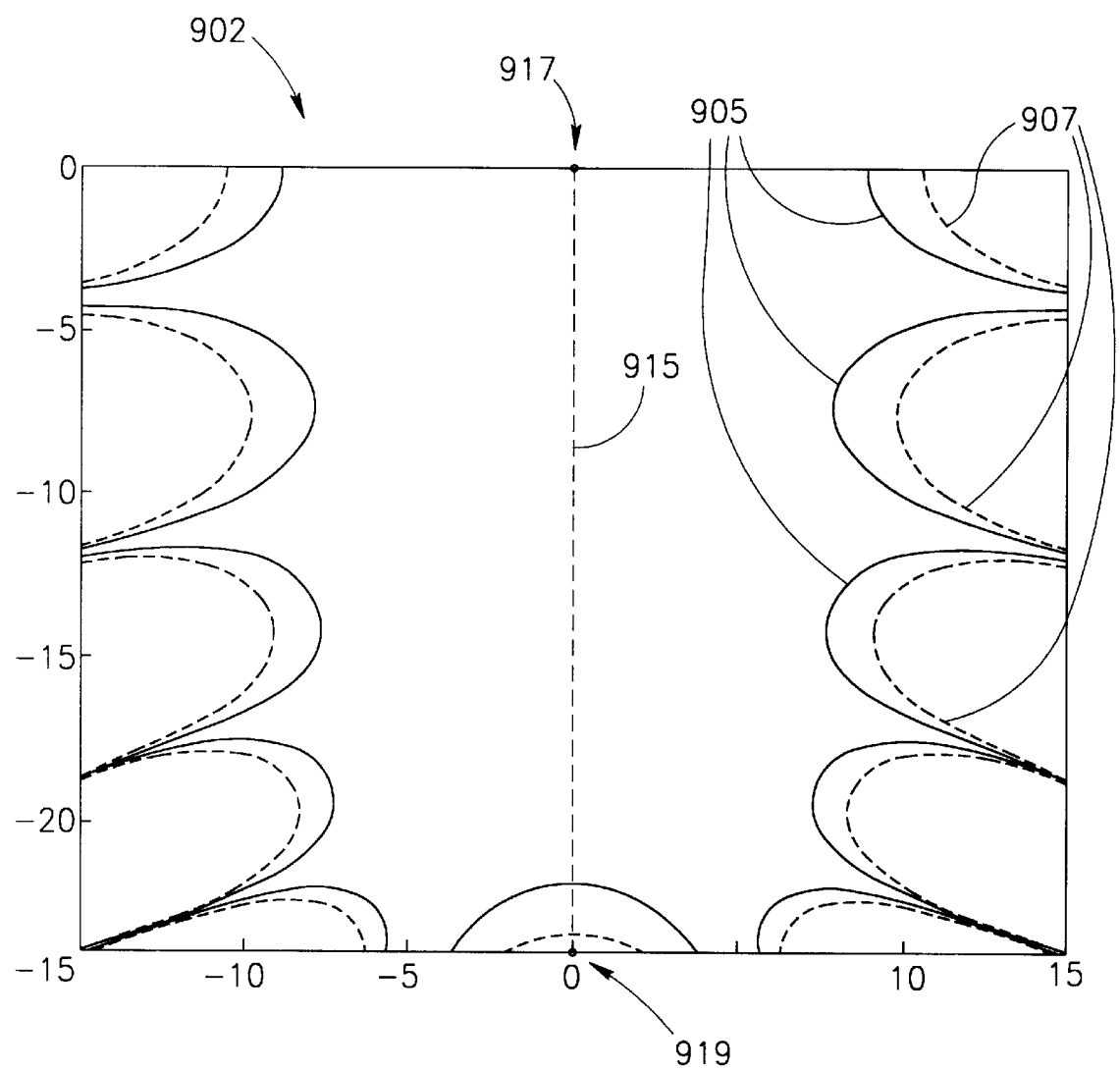
FIG. 18 is a schematic graph illustrating the calculated deviation from homogeneity within the field of view of the yoked magnet of FIG. 17.

Reference is now made to FIG. 18 which is a schematic graph illustrating the calculated deviation from homogeneity within the field of view of the magnet of FIG. 17. The vertical axis of the graph 902 represents the distance in centimeters along the axis 915 of FIG. 17 and the horizontal axis represents the radial distance in centimeters from the point 919 of FIG. 17 in a direction perpendicular to the axis 915. The solid curves 905 represent the boundary of the volume of revolution within which the intensity magnetic field of the magnet 901 of FIG. 17 is homogenous to within ±50 parts per million (ppm) of the main magnetic field within the FOV, The dashed curves 907 represent the boundary of the volume of revolution within which the intensity magnetic field of the magnet 901 of FIG. 17 is homogenous to within ±100 ppm of the main magnetic field within the FOV.

It is noted that, while preferably, all the surfaces of the ferromagnetic pole pieces and collimators which are perpendicular to the symmetry axis of the imaging volume in all the preferred embodiments of the magnets disclosed and illustrated hereinabove are planar surfaces, in other preferred embodiments of the present invention, the surfaces of the ferromagnetic pole pieces and collimators which are perpendicular to the symmetry axis of the imaging volume may be non-planar surfaces. For example, the surfaces may be stepped surfaces or curved surfaces.

Figure 19A:
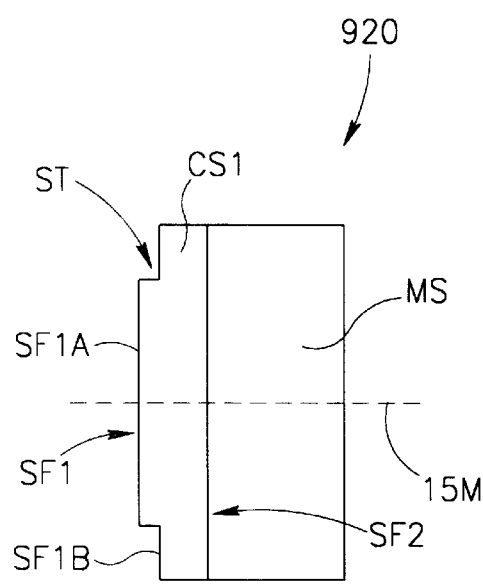
FIGS. 19A and 19B are schematic cross-sectional partial views of field generators having pole-pieces with a non-planar surface, in accordance with additional preferred embodiments of the present invention.
Figure 19B:
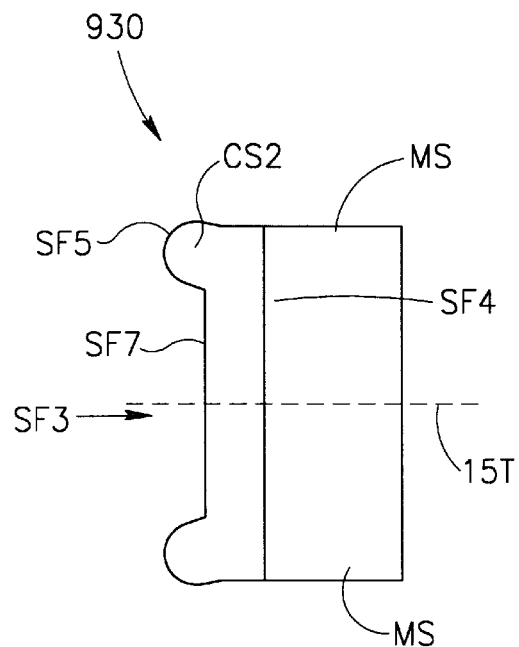

Reference is now made to FIGS. 19A and 19B which are schematic cross-sectional partial views of field generators having pole-pieces with a non-planar surface, in accordance with additional preferred embodiments of the present invention.

FIG. 19A illustrates a detail of a field generator 920 which is part of an open yoked magnet (the yoke and the other parts of the magnet are not shown for the sake of clarity of illustration). The field generator 920 includes a magnetic structure MS and a pole-piece CS1 attached thereto. The axis 15M is the axis of symmetry of the pole-piece CS1. The pole-piece CS1 has a surface SF2 facing the yoke (not shown) of the magnet and a surface SF1 facing the imaging volume (not shown) of the magnet. The surface SF1 is a stepped surface having a step ST therein. The surface SF1 includes a planar central surface portion SF1A and another planar surface portion SF1B. It is noted that while the surface SF1 of the pole-piece CS1 has a single step ST therein, other preferred embodiments of the magnetic apparatus of the present invention may have pole-pieces which have more than one step in them (multi-stepped surfaces). Single-stepped or multi-stepped surfaces may also be used in the design of annular collimators (not shown) of the open yoked magnets of the present invention.

FIG. 19B illustrates a detail of a field generator 930 which is part of an open yoked magnet (the yoke and the other parts of the magnet are not shown for the sake of clarity of illustration). The field generator 930 includes a magnetic structure MS and a pole-piece CS2 attached thereto. The axis 15T is the axis of symmetry of the pole-piece CS2. The pole-piece CS2 has a surface SF4 facing the yoke (not shown) of the magnet and a surface SF3 facing the imaging volume (not shown) of the magnet. The surface SF3 is a curved surface. The surface SF3 has a curved surface portion SF5 and a central planer surface portion SF7. The curvature of the surface SF3 may be needed to compensate for a magnetic field inhomogeneity introduced by another component (not shown) of the magnet. It is noted that while the surface SF3 of FIG. 19B has a particular type of curved portion SF5 therein, other preferred embodiment may have pole-pieces or collimators which have other types of curved surfaces or curved portions of surfaces depending, inter alia, on the type of the magnetic field inhomogeneity that needs to be corrected. Curved surfaces or surface shapes including any combination of planar surface portions, curved surface portions and steps may also be used as the surfaces facing the FOV and/or as the surfaces facing the yoke surface (not shown) in one or more of the annular collimators of the open yoked magnets of the present invention.

It is noted that the complementary pole-pieces (not shown) opposed to the pole-pieces 920 and 930 of FIGS. 19A and 19B, respectively, have surfaces (not shown) which are mirror images of the surfaces SF1 and SF3, respectively, with respect to the mid-plane (not shown) of the magnet as defined hereinabove for other preferred embodiments of the present invention.

It is further noted that, while the surface SF1 of the collimator CS1 and of FIG. 19A is a stepped planar surface, and the surface SF3 of the collimator CS2 and of FIG. 19B has a planar surface portion, and a curved surface portion, other preferred embodiments of the present invention are possible where the surfaces SF1 and SF3 may be selected from stepped surfaces, surfaces having planar surface portions and curved surface portions, and stepped surfaces having planar surface portions and curved surface portions.

It is still further noted that, whenever any type of surface shape is used in one or more of the pole-pieces and collimators of the magnetic apparatus, the complementary surface of the corresponding opposing one or more pole-piece and collimators are shaped as a mirror image of the one or more of the pole-pieces and collimators with respect to the mid-plane (not shown) of the magnetic apparatus.

Moreover, while the surfaces SF2 and SF4 of the collimators CS1 and CS2 of FIGS. 19A and 19B, respectively, are flat planar surfaces, other preferred embodiments of the present invention are possible where the surfaces SF2 and SF4 may be stepped surfaces, surfaces having planar surface portions and curved surface portions, and stepped surfaces having planar surface portions and curved surface portions.

Typically, the central planar surface portion SF1A of the surface SF1 of the pole-piece CS1 and the central planar surface portion SF7 of the surface SF3 of the pole-piece CS2 have a radius which may vary between 50% and 100% of the outer radius of the pole-piece. The extreme case were the radius of the central planar surface portion, is 100% of the outer radius of the pole-piece represents the case of a fully planar collimator surface. For example, the latter case is illustrated in the preferred embodiment of FIG. 2, and FIGS. 6–10.

It is further noted that, one or more of complementary collimator pairs of the magnetic apparatus of the present invention may have one or more of the opposing complementary surface pairs facing the FOV and the opposing complementary surface pairs facing the magnetic structure underlying the collimators shaped such that these pairs of complementary surfaces include curved or stepped or planar surface portions, or any combination thereof.

Generally, the surfaces of the pole-piece of any of the pole-pieces of the magnetic apparatus of the present invention, such as the surfaces SF1 and SF2 of the exemplary pole-piece CS1 or the surfaces SF3 and SF4 of the exemplary pole-piece CS2 can deviate from planarity in any way desired by the designer of the magnet as long as all the $a_j$ values for which j>N+1 satisfy the following inequality (equation 5), $$\sum_{j=N+1} |aj| < \sum_{j=1}^{N} |aj| \qquad (5)$$

Reference is now made to FIGS. 20A–20F which are isometric views of magnetic structures suitable for use in some preferred embodiments of the magnets of the present invention.

Figure 20A:
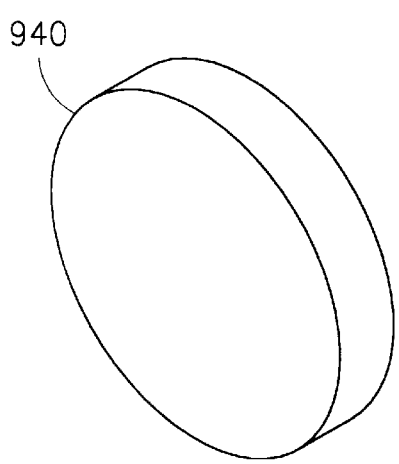
FIGS. 20A–20F are isometric views of magnetic structures suitable for use in some preferred embodiments of the magnets of the present invention.

FIG. 20A illustrates a magnetic structure 940 having a disc-like shape. Such a magnetic structure may be used, for example, as part of a field generator (not shown) such as the field generators 800 and 800A of FIG. 14. The magnetic structure 940 may be a single solid member made from a magnetic material such as a FeNdB permanent magnet or any other suitable permanent magnet. Alternatively, the magnetic structure 940 may be made of a plurality of blocks (not shown) made from a permanent magnetic material embedded in a disc of non-magnetic, non-ferromagnetic material such as a suitable plastic material, an epoxy resin or the like. As disclosed hereinabove in detail, the blocks can be of any suitable shape and can be arranged in any suitable arrangement within the embedding material to provide a desired average remanence value $J_K$ required by the design method of the present invention.

Figure 20B:
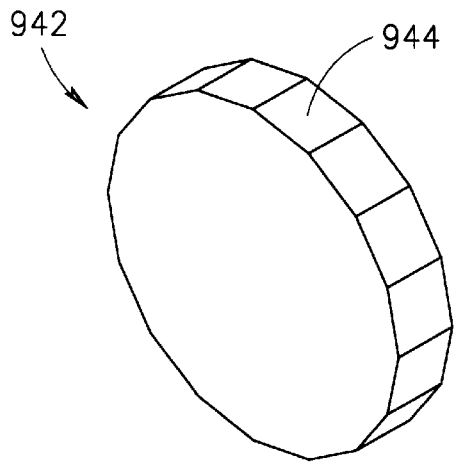

FIG. 20B illustrates a magnetic structure 942 shaped like a regular polygonal structure having a sides 944. Such a magnetic structure may be used, for example, as part of a field generator (not shown) such as the field generators 800 and 800A of FIG. 14. The magnetic structure 942 may be a single solid member made from a magnetic material such as a FeNdB permanent magnet or any other suitable permanent magnet. Alternatively, the magnetic structure 942 may be made of a plurality of blocks (not shown) made from a permanent magnetic material embedded in a disc of non-magnetic, non-ferromagnetic material such as a suitable plastic material, an epoxy resin or the like. As disclosed hereinabove in detail, the blocks can be of any suitable shape and can be arranged in any suitable arrangement within the embedding material to provide a desired average remanence value $J_K$ required by the design method of the present invention.

Preferably, the number of sides G of the magnetic structure is an even number which is much larger than the number N of harmonics which are compensated for in the design method disclosed hereinabove (G>>N). In a non-limiting example, for a magnet designed by the method of the present invention to compensate for N=3 harmonics G=16 may be a suitable number of sides for the magnetic structure 942. However other higher or lower values of G may be used depending, inter alia, on the required degree of homogeneity of the magnetic field, the dimensions of the pole-piece and collimators of the magnetic apparatus and on various manufacturing constraints.

Figure 20C:
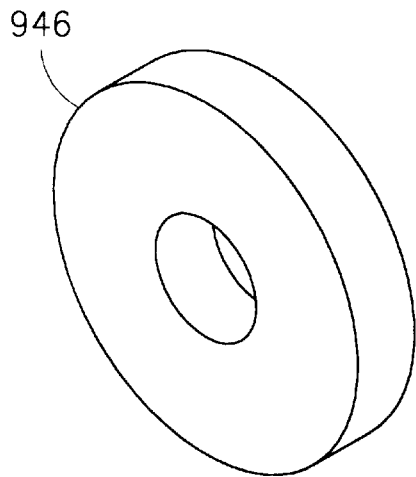

FIG. 20C illustrates an annular magnetic structure 946 having an annular shape. Such a magnetic structure may be used, for example, as part of a field generator (not shown) such as the field generators 800 and 800A of FIG. 14 or as any of the magnetic structures underlying the annular collimators disclosed hereinabove. The magnetic structure 946 may be a single solid member made from a magnetic material such as a FeNdB permanent magnet or any other suitable permanent magnet. Alternatively, the magnetic structure 946 may be made of a plurality of blocks (not shown) made from a permanent magnetic material embedded in a disc of non-magnetic, non-ferromagnetic material such as a suitable plastic material, an epoxy resin or the like. As disclosed hereinabove in detail, the blocks can be of any suitable shape and can be arranged in any suitable arrangement within the embedding material to provide a desired average remanence value $J_K$ required by the design method of the present invention.

Figure 20D:
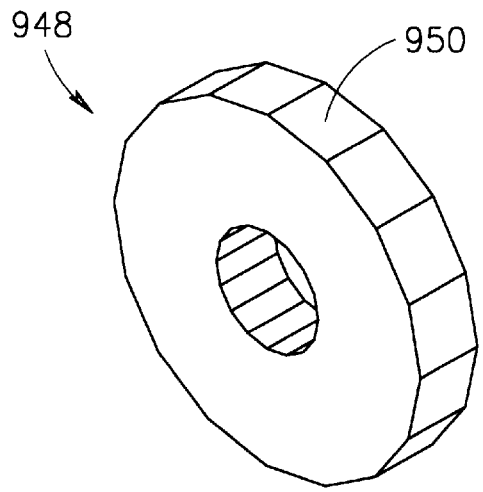

FIG. 20D illustrates a regular polygonal annular magnetic structure 948 having a regular polygonal annular shape. Such a magnetic structure may be used, for example, as part of a polygonal field generator (not shown) or as any of the magnetic structures underlying the annular collimators disclosed hereinabove. The magnetic structure 948 has G sides and may be a single solid member made from a magnetic material such as a FeNdB permanent magnet or any other suitable permanent magnet. Preferably G is an even number and G>>N as disclosed in detail hereinabove for the magnetic structure 942 of FIG. 20B. Alternatively, the magnetic structure 948 may be made of a plurality of blocks (not shown) made from a permanent magnetic material embedded in a disc of non-magnetic, non-ferromagnetic material such as a suitable plastic material, an epoxy resin or the like. As disclosed hereinabove in detail, the blocks can be of any suitable shape and can be arranged in any suitable arrangement within the embedding material to provide a desired average remanence value $J_K$ required by the design method of the present invention.

Figure 20E:
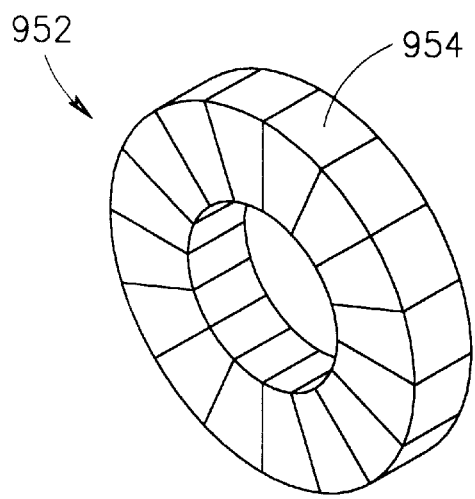

FIG. 20E illustrates a segmented annular magnetic structure 952 having an annular shape. Such a magnetic structure may be used, for example, as part of an annular field generator (not shown) or as any of the magnetic structures underlying the annular collimators disclosed hereinabove. The magnetic structure 952 is made of a plurality of segments 954 made from a permanent magnetic material such as a FeNdB permanent magnet or any other suitable permanent magnet.

Figure 20F:
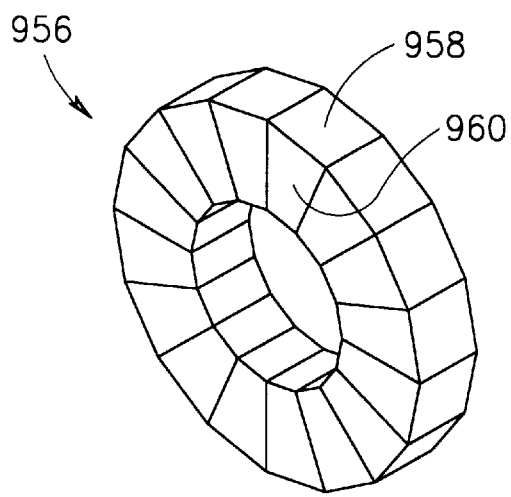

FIG. 20F illustrates a regular polygonal annular magnetic structure 956 having a regular polygonal annular shape. Such a magnetic structure may be used, for example, as part of a polygonal field generator (not shown) or as any of the magnetic structures underlying the annular collimators disclosed hereinabove. The magnetic structure 952 is made of a plurality of G equi-angular trapezoidal segments 958 made from a permanent magnetic material such as a FeNdB permanent magnet or any other suitable permanent magnet. The segments 958 have trapezoidal sides 960 and a trapezoidal cross-section in a plane parallel to the sides 960. Preferably, the number G is an even number and G>>N where N is the number of compensated harmonics as disclosed in detail hereinabove.

It is noted that when one or more of the polygonal magnetic structures disclosed hereinabove are used as part of the magnetic apparatus of the present invention, the pole piece (not shown) or collimator (not shown) overlying them are polygonally shaped.

Figure 21:
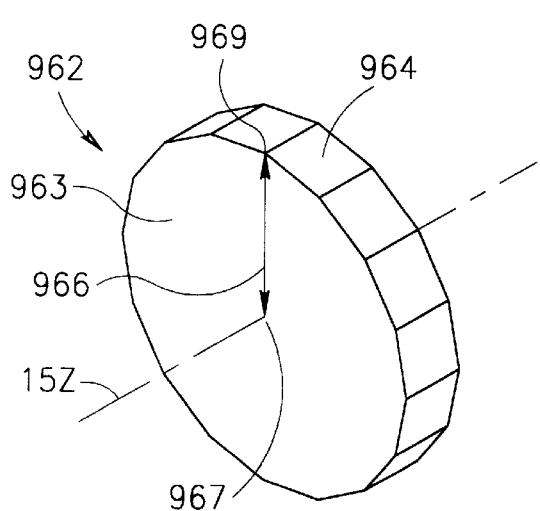
FIG. 21 is a schematic isometric view illustrating a ferromagnetic regular polygonal structure useful as a pole-piece in the magnetic apparatus, in accordance with a preferred embodiment of the present invention.
Figure 22:
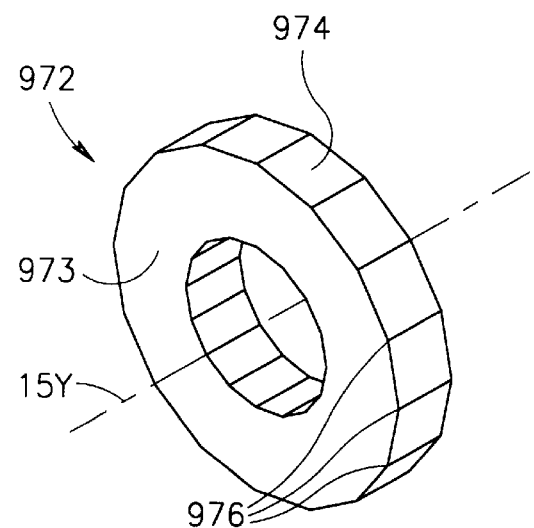
FIG. 22 is a schematic isometric view illustrating a ferromagnetic regular annular polygonal structure useful as a pole-piece or as a collimator in the magnetic apparatus, in accordance with a preferred embodiment of the present invention.

Reference is now made to FIGS. 21–22. FIG. 21 is a schematic isometric view illustrating a ferromagnetic regular polygonal structure useful as a pole-piece in the magnetic apparatus, in accordance with a preferred embodiment of the present invention. The pole piece 962 has 16 sides 964 but may have any other suitable even number of sides. The pole-piece 962 may be used together with the magnetic structure 942 of FIG. 20B, or together with the magnetic structure 956 of FIG. 20F for implementing a field generator (not shown), in which case the number of sides of the pole-piece 962 is equal to the number of sides G of the magnetic structure 942 of FIG. 20B, or the magnetic structure 956 of FIG. 20F, respectively as disclosed in detail hereinabove. The axis of symmetry 15Z passing at the center of the pole-piece 962 coincides with the axis of symmetry of the FOV of the magnetic apparatus (not shown) which includes the pole-piece 962. The pole-piece 962 has a maximal radial dimension $R_{MAX}$ represented by the double headed arrow 966 connecting the center point 967 of the polygonal surface 963 with one of the vertices 969 of the polygonal surface 963.

When the method of designing the magnetic apparatus disclosed hereinabove and illustrated in FIG. 16 is used to design magnetic apparatus having a regular right polygonal prism-like pole-piece, such as the pole-piece or collimator 962, the value which is used for the $R(K)_{IN}$ parameter of the set of dimensional parameters of step 854 of FIG. 16 is $R(K)_{IN}=0$ and the value which is used as an approximation of $R(K)_{OUT}$ in the dimensional parameter set of step 854 of FIG. 16 is $R(K)_{OUT}=R_{MAX}$. This approximation is useful as long as G>>N as disclosed hereinabove.

FIG. 22 is a schematic isometric view illustrating a ferromagnetic regular right annular polygonal structure useful as a pole-piece or as a collimator in the magnetic apparatus, in accordance with a preferred embodiment of the present invention. The pole piece 972 has 16 sides 974 but may have any other suitable even number of sides. The pole-piece 972 may be used together with the magnetic structure 952 of FIG. 20E, or together with the magnetic structure 956 of FIG. 20F as parts of the magnets of the present invention, in which case the number of sides of the pole-piece or collimator 972 is equal to the number of sides G of the magnetic structure 956 of FIG. 20F, or the number of segments 958 of the magnetic structure 952 of FIG. 20E, respectively, as disclosed in detail hereinabove. The axis of symmetry 15Y passing at the center of the pole-piece or collimator 972 coincides with the axis of symmetry of the FOV of the magnetic apparatus (not shown) which includes the pole-piece or collimator 972. The pole-piece or collimator 972 has two identical regular annular polygonal surfaces 973. Each of the polygonal surfaces 973 has a plurality of vertices 976 (16 vertices in the particular exemplary pole-piece or collimator 972 illustrated in FIG. 22).

Figure 23:
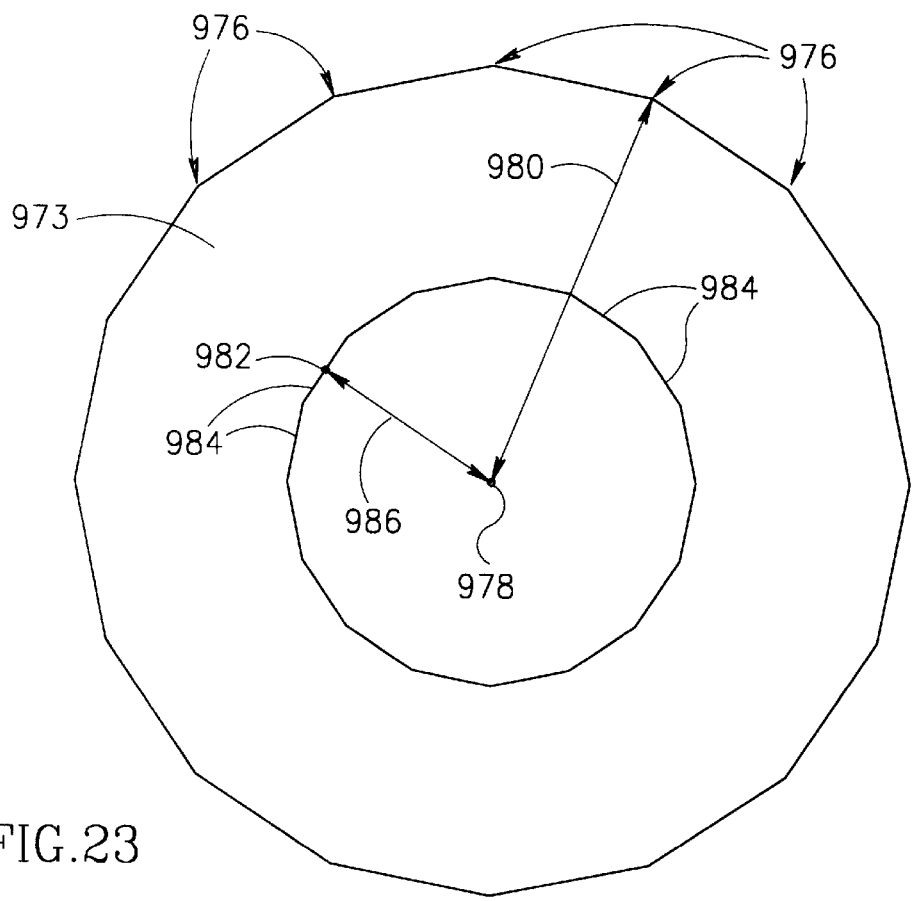
FIG. 23 is a schematic front view illustrating one of the regular annular polygonal surfaces of the pole-piece or collimator illustrated in FIG. 22.

Reference is now made to FIG. 23 which is a schematic front view of one of the regular annular polygonal surfaces 973 of the pole-piece or collimator illustrated in FIG. 22.

The pole-piece or collimator 972 has a maximal radial dimension $R_{MAX}$ represented by the double headed arrow 980 connecting the center point 978 of the annular polygonal surface 973 with one of the vertices 976 of the annular polygonal surface 973. The pole-piece or collimator 972 has a minimal radial dimension $R_{MIN}$ represented by the double headed arrow 986 connecting the center point 978 of the annular polygonal surface 973 with the mid-point 982. The mid-point 982 is a point which bisects one of the sides 984 of the inner regular polygonal circumference of the annular polygonal surface 973 into two equal segments (not shown) the line represented by the double headed arrow 986 is perpendicular to the side 984 which is bisected thereby.

When the method of designing the magnetic apparatus disclosed hereinabove and illustrated in FIG. 16 is used to design magnetic apparatus having an annular regular right polygonal pole-piece or collimator, such as the pole-piece or collimator 972, the value which is used as an approximation of the parameter $R_{IN}$ of the set of dimensional parameters of step 854 of FIG. 16 is $R(K)_{IN}=R_{MIN}$, and the value which is used as an approximation of $R(K)_{OUT}$ in the dimensional parameter set of step 854 of FIG. 16 is $R(K)_{OUT}=R_{MAX}$. This approximation is useful as long as G>>N, as disclosed hereinabove.

Additionally, if one or more of the surfaces 973 are not planar, than the approximated values of $R_{MAX}$ and $R_{MIN}$ are determined by using the values obtained using the same method detailed hereinabove for the surface 973 applied to an annular polygonal surface formed by taking a cross-section of the ferromagnetic member (not shown) in a plane perpendicular to the axis of symmetry of the magnetic apparatus.

It will be appreciated that when using the design method of the present invention, it is sufficient to input the parameters of only one side of the magnetic apparatus due to the symmetry of the magnetic apparatus. The parameters of the solution which is obtained may be used to specify the entire magnetic apparatus provided that the magnetization vector of each the magnetic structures on one side of the magnetic apparatus is identical in direction and substantially identical in magnitude to the magnetization vector of the complementary opposed magnetic structure on the opposite complementary side of the magnetic apparatus.

It is further noted that, typically, the ferromagnetic material used for constructing the yoke, pole-pieces and collimators of the magnets of the present invention is a material having a high magnetic permeability and a narrow hysteresis loop such as (magnetically) soft iron. However, other ferromagnetic materials may also be used for constructing one or more of the yoke, pole-pieces and collimators of the magnets. Such ferromagnetic materials may include silicon-iron alloys, nickel-iron alloys and other ferromagnetic materials having a high magnetic permeability.

It is noted that, the various ferromagnetic pole-pieces and ferromagnetic collimators used in the magnetic apparatus of the present invention may also be collectively referred to as "ferromagnetic members" hereinafter.

It is still further noted that throughout the present application any use of the expressions "optimization", "to optimize", "optimization method" and the like in relation to the magnet design is used in the general sense of significant improvement of the design and may not necessarily imply that the magnet design arrived at by using the design method of the present invention is the best theoretically possible design. It will be appreciated by those skilled in the art that the present method for magnet design may involve a compromise between various design factors such as, inter alia, design compactness, total cost manufacturing tolerances, final weight of the magnet and complexity of manufacturing and construction.

It is finally noted that while all the preferred embodiments of the magnetic apparatus of the present invention are adapted as magnetic apparatus for MRI/MRT probes, the magnetic apparatus and the method of design thereof may also be adapted for other applications requiring a region of substantially homogenous magnetic field.

It will be appreciated that the preferred embodiments disclosed hereinabove and illustrated in the drawings are given by way of example and that many variations and modifications of the present invention may be made which are within the scope and spirit of the present invention.

What is claimed is:

1. Open magnetic apparatus for providing a volume of substantially homogenous magnetic field having an axis of symmetry passing therethrough, the apparatus comprising:
   an open ferromagnetic yoke having a first yoke surface and a second yoke surface opposed said first yoke surface, said second yoke surface is shaped like a mirror image of said first yoke surface with respect to a mid-plane equidistant from said first yoke surface and said second yoke surface, said symmetry axis is perpendicular to said mid-plane;

a first magnetic assembly attached to said first yoke surface, said first magnetic assembly includes a first ferromagnetic pole-piece substantially parallel to said mid-plane and having an outer radius, said axis of symmetry passing through the center of said first pole-piece, said first pole-piece is radially symmetric along any axis perpendicular to said axis of symmetry and passing through said center of said first pole-piece, said first pole-piece having a first surface facing said volume and a second surface facing said first yoke surface, and a first magnetic structure disposed between said second surface of said first pole-piece and a surface formed by a projection on said first yoke surface of said second surface of said first pole-piece in a direction parallel to said axis of symmetry, said first magnetic structure having a first magnetization vector directed substantially parallel to said axis of symmetry, and at least a first substantially annular ferromagnetic collimator concentric with said first pole-piece and having an inner radius larger than said outer radius of said first pole-piece, said at least first collimator is radially separated from said first pole-piece by a first gap, said at least first collimator having a fourth surface facing said volume and a fifth surface facing said first yoke surface, and at least a second magnetic structure disposed between said fifth surface of said at least first collimator and a surface formed by a projection on said first yoke surface of said fourth surface of said first collimator in a direction parallel to said axis of symmetry, said second magnetic structure having a second magnetization vector directed substantially parallel to said axis of symmetry; and a second magnetic assembly opposed to said first magnetic assembly and attached to said second yoke surface, said volume is disposed in the open region defined between said first magnetic assembly and said second magnetic assembly, said second magnetic assembly includes, a second ferromagnetic pole-piece substantially parallel to said mid-plane and having an outer radius substantially equal to said outer radius of said first pole-piece, said axis of symmetry passing through the center of said second pole-piece, said second pole-piece is radially symmetric along any axis perpendicular to said axis of symmetry and passing through said center of said second pole-piece, said second pole-piece having a fifth surface facing said volume and a sixth surface facing said second yoke surface, and a third magnetic structure disposed between said sixth surface of said second pole-piece and a surface formed by a projection on said second yoke surface of said sixth surface of said second pole-piece in a direction parallel to said axis of symmetry, said third magnetic structure having a third magnetization vector substantially equal to said first magnetization vector, and at least a second substantially annular ferromagnetic collimator concentric with said second pole-piece and having an inner radius substantially equal to said inner radius of said at least first collimator and larger than said outer radius of said second pole-piece, said at least second collimator is radially separated from said first pole-piece by a second gap, said at least second collimator having a seventh surface facing said volume and an eighth surface facing said second yoke surface, and at least a fourth magnetic structure disposed between said eighth surface of said at least second collimator and a surface formed by a projection on said second yoke surface of said eighth surface of said second collimator in a direction parallel to said axis of symmetry, said at least fourth magnetic structure having a fourth magnetization vector substantially equal to said second magnetization vector, wherein said first pole-piece and said second pole-piece are selected from a cylindrical pole piece, an annular pole-piece, a regular polygonal pole-piece and a regular polygonal annular pole-piece, and said at least first collimator and said at least second collimator are selected from an annular collimator and a regular polygonal annular collimator.

2. The apparatus according to claim 1 wherein said first magnetization vector is directed parallel to said second magnetization vector.

3. The apparatus according to claim 1 wherein said first magnetization vector is directed anti-parallel to said second magnetization vector.

4. The apparatus according to claim 1 wherein at least one of said yoke, said first pole-piece, said second pole-piece, said at least first collimator and said at least second collimator is made from a material having high magnetic permeability.

5. The apparatus according to claim 1 wherein at least one of said first magnetic structure, said second magnetic structure, said at least third magnetic structure and said at least fourth magnetic structure is constructed as a single solid member made of permanently magnetized material.

6. The apparatus according to claim 1 wherein at least one of said first magnetic structure, said second magnetic structure, said at least third magnetic structure and said at least fourth magnetic structure is constructed from a plurality of identical equiangular segments made of permanently magnetized material.

7. The apparatus according to claim 1 wherein at least one pair of complementary surfaces selected from the pairs of said first surface and said fifth surface, said second surface and said sixth surface, said third surface and said seventh surface, said fourth surface and said eighth surface is a pair of planar surfaces substantially parallel to said mid-plane.

8. The apparatus according to claim 1 wherein said first yoke surface and said second yoke surface are substantially flat surfaces parallel to said mid-plane.

9. The apparatus according to claim 1 wherein each of said first pole-piece and said second pole-piece is segmented into a plurality of pole-piece segments having first gaps therebetween and each of said first magnetic structure, and said third magnetic structure is segmented into magnetic structure segments having second gaps therebetween, wherein at least some of said magnetic structure segments have an average remanence value different from the average remanence value of the remaining segments of said first and second magnetic structures to at least partially compensate for magnetic inhomogeneities resulting from the asymmetry of said open ferromagnetic yoke.

10. The apparatus according to claim 1 wherein said at least first annular collimator and said at least second annular collimator are segmented into a plurality of collimator segments having first gaps therebetween and said at least second magnetic structure, and said at least fourth magnetic structure are segmented into magnetic structure segments having second gaps therebetween, wherein at least some of said magnetic structure segments have an average remanence value different from the average remanence value of the remaining segments of said first and second magnetic structures to at least partially compensate for magnetic inhomogeneities resulting from the asymmetry of said open ferromagnetic yoke.

11. The apparatus according to claim 1 wherein the thickness of said first magnetic structure along said axis of symmetry is different from the thickness of at least one of said at least second magnetic structure along said axis of symmetry.

12. The apparatus according to claim 1 wherein the thickness of said first magnetic structure along said axis of symmetry is equal to the thickness of at least one of said at least second magnetic structure along said axis of symmetry.

13. The apparatus according to claim 1 wherein at least one pair of complementary surfaces selected from the pairs of said first surface and said fifth surface, said second surface and said sixth surface, said third surface and said seventh surface, said fourth surface and said eighth surface is a pair of non-planar surfaces, each surface of said at least one pair of complementary surfaces is a mirror image of the other surface of said at least one pair of complementary surfaces with respect to said mid-plane.

14. The apparatus according to claim 1 wherein at least one pair of complementary surfaces selected from the pairs of said first surface and said fifth surface, said second surface and said sixth surface, said third surface and said seventh surface, said fourth surface and said eighth surface is a pair of partly planar partly curved surfaces, each surface of said at least one pair of complementary surfaces is a mirror image of the other surface of said at least one pair of complementary surfaces with respect to said mid-plane.

15. The apparatus according to claim 1 wherein at least one pair of complementary surfaces selected from the surface pairs of said first surface and said fifth surface, said second surface and said sixth surface, said third surface and said seventh surface, said fourth surface and said eighth surface is a pair of stepped surfaces, each surface of said at least one pair of complementary surfaces is a mirror image of the other surface of said at least one pair of complementary surfaces with respect to said mid-plane.

16. The apparatus according to claim 1 wherein said first surface and said third surface are substantially iso-potential surfaces, said first surface has a first value of magnetic potential thereof and said third surface has a second value of magnetic potential thereof wherein said first value of magnetic potential is different than said second value of magnetic potential, and wherein said fifth surface and said seventh surface are substantially iso-potential surfaces, said fifth surface has a third value of magnetic potential thereof and said seventh surface has a fourth value of magnetic potential thereof wherein said third value of magnetic potential is substantially equal to said first value of magnetic potential, and said fourth value of magnetic potential is substantially equal to said second value of magnetic potential.

17. The apparatus according to claim 1 wherein at least one of said yoke, said first pole-piece, said second pole-piece, said at least first collimator and said at least second collimator is made from a material selected from soft iron, an alloy including iron and silicon, and an alloy including iron and nickel.

18. The apparatus according to claim 1 wherein at least one of said first magnetic structure, said second magnetic structure, said at least third magnetic structure and said at least fourth magnetic structure is constructed from a plurality of blocks made of permanently magnetized material.

19. The apparatus according to claim 18 wherein at least one magnetic block of said plurality of magnetic blocks is a prismatic magnetic block having two parallel surfaces perpendicular to the magnetization vector of said at least one block.

20. The apparatus according to claim 18 wherein at least some of the magnetic blocks of said plurality of magnetic blocks have voids therebetween.

21. The apparatus according to claim 20 wherein at least portions of said voids are filled with a non-magnetic non-ferromagnetic material.

22. The apparatus according to claim 1 wherein said first yoke surface includes a first plurality of substantially flat surfaces parallel to said mid-plane and concentrically arranged around said axis of symmetry, and said second yoke surface includes a second plurality of complementary substantially flat surfaces being a mirror-image of said first plurality of said surfaces with respect to said mid-plane.

23. The apparatus according to claim 22 wherein at least one of said first plurality of surfaces is separated from at least one of the remaining surfaces of said first plurality of surfaces by a first distance along said axis of symmetry and wherein at least one of said second plurality of complementary surfaces is separated from at least one of the remaining surfaces of said second plurality of complementary surfaces by a second distance equal to said first distance along said axis of symmetry.

24. The apparatus according to claim 1 further including at least a first ferromagnetic spacer member disposed between said first yoke surface and at least one of said first magnetic structure and said at least second magnetic structure, and at least a second ferromagnetic spacer member disposed between said second yoke surface and at least one of said at least third magnetic structure and said at least fourth magnetic structure.

25. The apparatus according to claim 24 wherein said at least first ferromagnetic spacer member and said at least second ferromagnetic spacer member are identically selected from a substantially disk-like ferromagnetic spacer member, a substantially regular polygonal ferromagnetic spacer member, a substantially annular ferromagnetic spacer member, and a substantially annular regular polygonal spacer member.

26. The apparatus according to claim 24 wherein said at least first ferromagnetic spacer member and said at least second ferromagnetic spacer member are made of a material having high magnetic permeability.

27. The apparatus according to claim 24 wherein said at least first ferromagnetic spacer member and said at least second ferromagnetic spacer member are made of a non-magnetic, non-ferromagnetic material.

28. The apparatus according to claim 24 wherein said at least first ferromagnetic spacer member and said at least second ferromagnetic spacer member are made from a material selected from soft iron, an alloy including iron and silicon, and an alloy including iron and nickel.

29. The apparatus according to claim 1 wherein at least one of said first pole-piece, said second pole-piece, said at least first collimator and said at least second collimator is adjustable relative to said mid-plane.

30. The apparatus according to claim 29 wherein the angle between said mid-plane and said at least one of said first pole-piece, said second pole-piece, said at least first collimator and said at least second collimator is adjustable for correcting said magnetic field.

31. The apparatus according to claim 29 wherein the distance between said mid-plane and at least part of said at least one of said first pole-piece, said second pole-piece, said at least first collimator and said at least second collimator is adjustable for correcting said magnetic field.

32. The apparatus according to claim 29 further including a plurality of adjusting screws adjustably attached to said yoke wherein at least one of the position and angle of said at least one of said first pole-piece, said second pole-piece, said at least first collimator and said at least second collimator is adjusted by rotating at least one of said plurality of adjusting screws.

33. A method for constructing an open magnetic apparatus for providing a volume of substantially homogenous magnetic field, the apparatus having an axis of symmetry passing therethrough, the method comprising the steps of:

providing an open ferromagnetic yoke having a first yoke surface and a second yoke surface opposed to said first yoke surface, said second yoke surface is shaped like a mirror image of said first yoke surface with respect to a mid-plane equidistant from said first yoke surface and said second yoke surface, said symmetry axis is perpendicular to said mid-plane;

providing a first magnetic assembly attached to said first yoke surface, said first magnetic assembly includes a first ferromagnetic pole-piece substantially parallel to said mid-plane and having an outer radius, said axis of symmetry passing through the center of said first pole-piece, said first pole-piece is radially symmetric along any axis perpendicular to said axis of symmetry and passing through said center of said first pole-piece, said first pole-piece having a first surface facing said volume and a second surface facing said first yoke surface, and a first magnetic structure disposed between said second surface of said first pole-piece and a surface formed by a projection on said first yoke surface of said second surface of said first pole-piece in a direction parallel to said axis of symmetry, said first magnetic structure having a first magnetization vector directed substantially parallel to said axis of symmetry, and at least a first substantially annular ferromagnetic collimator concentric with said first pole-piece and having an inner radius larger than said outer radius of said first pole-piece, said at least first collimator is radially separated from said first pole-piece by a first gap, said at least first collimator having a fourth surface facing said volume and a fifth surface facing said first yoke surface, and at least a second magnetic structure disposed between said fifth surface of said at least first collimator and a surface formed by a projection on said first yoke surface of said fourth surface of said first collimator in a direction parallel to said axis of symmetry, said second magnetic structure having a second magnetization vector directed substantially parallel to said axis of symmetry; and providing a second magnetic assembly opposed to said first magnetic assembly and attached to said second yoke surface, said volume is disposed in the open region defined between said first magnetic assembly and said second magnetic assembly, said second magnetic assembly includes, a second ferromagnetic pole-piece substantially parallel to said mid-plane and having an outer radius substantially equal to said outer radius of said first pole-piece, said axis of symmetry passing through the center of said second pole-piece, said second pole-piece is radially symmetric along any axis perpendicular to said axis of symmetry and passing through said center of said second pole-piece, said second pole-piece having a fifth surface facing said volume and a sixth surface facing said second yoke surface, and a third magnetic structure disposed between said sixth surface of said second pole-piece and a surface formed by a projection on said second yoke surface of said sixth surface of said second pole-piece in a direction parallel to said axis of symmetry, said third magnetic structure having a third magnetization vector substantially equal to said first magnetization vector, and at least a second substantially annular ferromagnetic collimator concentric with said second pole-piece and having an inner radius substantially equal to said inner radius of said at least first collimator and larger than said outer radius of said second pole-piece, said at least second collimator is radially separated from said first pole-piece by a second gap, said at least second collimator having a seventh surface facing said volume and an eighth surface facing said second yoke surface, and at least a fourth magnetic structure disposed between said eighth surface of said at least second collimator and a surface formed by a projection on said second yoke surface of said eighth surface of said second collimator in a direction parallel to said axis of symmetry, said at least fourth magnetic structure having a fourth magnetization vector substantially equal to said second magnetization vector, wherein said first pole-piece and said second pole-piece are selected from a cylindrical pole piece, an annular pole-piece, a regular polygonal pole-piece and a regular polygonal annular pole-piece, and said at least first collimator and said at least second collimator are selected from an annular collimator and a regular polygonal annular collimator.

34. A method for designing an open yoked magnetic apparatus providing a volume of substantially homogenous magnetic field, the volume having radial symmetry with respect to an axis of symmetry passing therethrough, said volume has a center point, said center point is located on a mid-plane, said mid-plane is perpendicular to said axis of symmetry and symmetrically bisects said volume, the method comprising the steps of:

providing a first set of parameters defining the desired dimensions of said volume and the desired magnitude of the magnetic field within said volume;

providing an integer number N representing the number of high order harmonics of said magnetic field which are to be compensated;

providing a second set of dimensional parameters defining a plurality of K ferromagnetic members concentrically arranged around said axis of symmetry and radially symmetric with respect to any axis perpendicular to said axis of symmetry, said plurality of K ferromagnetic members includes a substantially disc-like or annular pole-piece and K–1 substantially annular collimators, each of said plurality of K ferromagnetic members is associated with a magnetic structure of a plurality of K magnetic structures such that the K-th magnetic structure is disposed between the K-th ferromagnetic member and a portion of a surface of a ferromagnetic yoke of said yoked magnetic apparatus;

computing from said second set of dimensional parameters a matrix $M_{jK}$ comprising N-K matrix elements, wherein each of said matrix elements $m_{jK}$ represents the contribution of said K-th magnetic structure to a j-th harmonic coefficient $a_j$ wherein said harmonic coefficient $a_j$ represents the coefficient of the jth term of higher than zeroth order terms of the magnetic field expansion equation for the magnetic field formed by a magnetic structure of said plurality of K magnetic structures and by said pole-piece, said magnetic structure is disposed between said pole-piece and a portion of said surface of said yoke;

computing from said matrix $M_{jK}$ and from the values of the high order coefficients $a_j$ a plurality of K remanence values, each of the remanence values $J_K$ of said plurality of K remanence values represents the average remanence value for the K-th magnetic structure;

checking whether the absolute value of all of said remanence values $J_K$ is smaller than or equal to a maximal remanence value $J_{MAX}$, said maximal remanence value $J_{MAX}$ representing the maximal remanence value of the magnetic material available for constructing said magnetic apparatus, performing a solution stability check to verify that the solution based on said second set of parameters is a stable solution within the tolerance range of the magnetic material available for constructing said magnetic apparatus;

checking whether any of said K ferromagnetic members is magnetically saturated; and accepting said solution based on said second set of parameters if none of said K ferromagnetic members is magnetically saturated.

35. The method according to claim 34 wherein said first set of parameters includes the length of said volume along said axis of symmetry, the cylindrical radius of said volume along a direction perpendicular to said axis of symmetry, and the zeroth order coefficient $a_0$ of the zeroth order term of the magnetic field expansion equation for the magnetic field of said pole-piece and said magnetic structure.

36. The method according to claim 34 wherein said second set of dimensional parameters includes the parameters $HC_K$, $H_K$, $D_K$, $R(K)_{IN}$ and $R(K)_{OUT}$, wherein $H_K$ represents the thickness of the Kth magnetic structure measured along said axis of symmetry, $HC_K$ represents the thickness of the Kth ferromagnetic member measured along said axis of symmetry, $D_K$ represents the distance between said mid-plane and the surface of the Kth ferromagnetic member facing away from said mid-plane, $R(K)_{IN}$ represents the inner radius of said K-th ferromagnetic member and $R(K)_{OUT}$ represents the outer radius of said K-th ferromagnetic member.

37. The method according to claim 34 wherein said pole-piece of said K ferromagnetic members is a disc-like pole-piece having a circular cross-section in a plane parallel to said mid-plane the value of said $R(K)_{out}$ is the radius of said circular cross-section and the value of said $R(K)_{IN}$ is zero.

38. The method according to claim 34 wherein at least one of said K ferromagnetic members is an annular ferromagnetic member, the value of said $R(K)_{out}$ is the outer radius of said at least one of said annular ferromagnetic members with respect to said axis of symmetry and the value of said $R(K)_{IN}$ is the inner radius of said at least one of said ferromagnetic members with respect to said axis of symmetry.

39. The method according to claim 34 wherein said pole-piece of said K ferromagnetic members is a right regular polygonal prism-like pole-piece having a polygonal cross-section in a plane parallel to said mid-plane, the value of said $R(K)_{out}$ is the length of the line connecting the center of said polygonal cross-section with a vertex of said polygonal cross-section and the value of said $R(K)_{IN}$ is zero.

40. The method according to claim 34 wherein at least one of said pole-piece or said collimators of said K ferromagnetic members is a right regular annular polygonal prism-like pole-piece or collimator having an annular polygonal cross-section, said cross-section has an outer polygonal circumference and an inner polygonal circumference, the value of said $R(K)_{out}$ is the length of a first line connecting the center of said annular polygonal cross-section with a vertex of said outer polygonal circumference and the value of said $R(K)_{IN}$ is the length of a second line connecting the center of said annular polygonal cross section with the mid-point of a side of said inner polygonal circumference, said second line being perpendicular to said side.

41. The method according to claim 34 wherein at least one of said pole-piece or said collimators of said K ferromagnetic members is a right regular annular polygonal prism-like pole-piece having at least one annular polygonal surface, said surface has an outer polygonal circumference and an inner polygonal circumference, the value of said $R(K)_{out}$ is the length of a first line connecting the center of said annular polygonal surface with a vertex of said outer polygonal circumference and the value of said $R(K)_{IN}$ is the length of a second line connecting the center of said annular polygonal surface with the mid-point of a side of said inner polygonal circumference, said second line being perpendicular to said side.

42. The method according to claim 34 wherein said number N is an integer number in the range of 2–6.

43. The method according to claim 34 further including after said first step of checking, if the absolute value of one or more of said remanence values $J_K$ is smaller than or equal to said maximal remanence value $J_{MAX}$, the step of repeating said third step of providing, said first and said second step of computing and said first step of checking a sufficient number of times until the absolute value of all of said remanence values $J_K$ is smaller than or equal to said maximal remanence value $J_{MAX}$, wherein said step of repeating includes changing at least one dimensional parameter of said second set of dimensional parameters each time said third step of providing is performed within said step of repeating.

44. The method according to claim 34 wherein said step of performing a solution stability check includes the steps of computing a worst case value for each of said harmonic coefficients $a_j$, computing the value of the expression $$\frac{1}{a_0} \sum_{j=1}^{N} a_j \pi j I_0 \left( \pi j \frac{r}{Z_0} \right) \cos\left( \frac{\pi j z}{Z_0} \right)$$

and comparing said value of said expression to a value $\epsilon$ representing the allowed deviation from the value of said magnetic field of said volume, wherein the solution is stable if said value of said expression is smaller than or equal to said value of $\epsilon$.

45. The method according to claim 34 further including after said step of performing, if the solution based on said second set of parameters is not a stable solution within the tolerance range of the magnetic material available for constructing said magnetic apparatus, the step of repeating said third step of providing, said first and said second step of computing, said first step of checking and said step of performing a sufficient number of times until said solution is a stable solution within the tolerance range of the magnetic material available for constructing said magnetic apparatus, wherein said step of repeating includes changing at least one dimensional parameter of said second set of dimensional parameters each time said third step of providing is performed within said step of repeating.

46. The method according to claim 34 further including after said second step of checking, if at least one of said K ferromagnetic members is magnetically saturated, the step of repeating said third step of providing, said first and said second step of computing, said first step of checking, said step of performing and said second step of checking a sufficient number of times until none of said K ferromagnetic members is magnetically saturated, wherein said step of repeating includes changing at least one dimensional parameter of said second set of dimensional parameters prior to performing said third step of providing included within said step of repeating.

47. The method according to claim 34 further including after said second step of checking, if at least one of said K ferromagnetic members is magnetically saturated, the step of changing the parameters of the ferromagnetic material included in said at least one of said K ferromagnetic members and repeating said second step of checking.

48. The method according to claim 34 further including after said second step of checking, a third step of checking whether additional cycles of the method are desired and, if additional cycles of the method are desired repeating said third step of providing, said first step of computing, said second step of computing, said first step of checking, said step of performing and said second step of checking, wherein said step of repeating includes changing at least one dimensional parameter of said second set of dimensional parameters prior to performing said third step of providing included within said step of repeating.

49. The method according to claim 34 further including the step of recording the current values of said second set of dimensional parameters.

50. The method according to claim 34 further including the step of providing an output representing the current values of said second set of dimensional parameters.

51. The method according to claim 50 wherein said output is selected from a hard copy, an data file stored on a storage medium, and a symbolic representation displayed on a display device.

* * * * *

UNITED STATES PATENT AND TRADEMARK OFFICE
CERTIFICATE OF CORRECTION

PATENT NO. : 6,147,578
DATED : November 14, 2000
INVENTOR(S) : Shimon Panfil and Ehud Katznelson It is certified that error appears in the above-identified patent and that said Letters Patent is hereby corrected as shown below:

Title page,
The application filing date is February 9, 1999.

Signed and Sealed this

First Day of January, 2002

Attest:

*Attesting Officer*

JAMES E. ROGAN
*Director of the United States Patent and Trademark Office*